US012639001B2

(12) United States Patent
Tran et al.

(10) Patent No.: US 12,639,001 B2
(45) Date of Patent: May 26, 2026

(54) OUTPUT CIRCUIT FOR ANALOG NEURAL MEMORY IN A DEEP LEARNING ARTIFICIAL NEURAL NETWORK

(71) Applicant: Silicon Storage Technology, Inc., San Jose, CA (US)

(72) Inventors: Hieu Van Tran, San Jose, CA (US); Thuan Vu, San Jose, CA (US); Mark Reiten, Alamo, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 1258 days.

(21) Appl. No.: 17/463,063

(22) Filed: Aug. 31, 2021

(65) Prior Publication Data

US 2022/0374161 A1 Nov. 24, 2022

Related U.S. Application Data

(60) Provisional application No. 63/190,240, filed on May 19, 2021.

(51) Int. Cl.
*G06F 3/06* (2006.01)
*G06N 3/065* (2023.01)
(Continued)

(52) U.S. Cl.
CPC .......... *G06F 3/0655* (2013.01); *G06N 3/065* (2023.01); *G06N 3/08* (2013.01); *G11C 7/1006* (2013.01);
(Continued)

(58) Field of Classification Search
CPC ........... G05B 2219/33262; G05B 2219/35561; G05B 2219/21137; G06N 3/065;
(Continued)

(56) References Cited

U.S. PATENT DOCUMENTS

| | | | |
|---|---|---|---|
| 5,029,130 A | 7/1991 | Yeh | |
| 6,747,310 B2 | 6/2004 | Fan | |

(Continued)

FOREIGN PATENT DOCUMENTS

| | | |
|---|---|---|
| CN | 111193511 A | 5/2020 |
| CN | 112349316 A | 2/2021 |
| CN | 112 580 790 A | 3/2021 |

OTHER PUBLICATIONS

Bekken, K. S. (2019). Differential and single-ended ADC differential and single-ended ADC. https://ww1.microchip.com/downloads/en/DeviceDoc/Differential-and-Single-Ended-ADC-WhitePaper-DS00003197A.pdf (Year: 2019).*
(Continued)

*Primary Examiner* — Emily E Larocque
*Assistant Examiner* — Jerome Anthony Klosterman, II
(74) *Attorney, Agent, or Firm* — Vedder Price P.C.

(57) ABSTRACT

Numerous embodiments are disclosed for an output circuit for an analog neural memory in a deep learning artificial neural network. In some embodiments, an output block receives current from a W+ bit line and current from an associated W− bit line, and the output block generates an output signal that is a differential signal in certain embodiments and is a single ended signal in other embodiments.

6 Claims, 49 Drawing Sheets

Output Block
3500

(51) Int. Cl.

| | | |
|---|---|---|
| *G06N 3/08* | (2023.01) | |
| *G11C 7/10* | (2006.01) | |
| *G11C 7/16* | (2006.01) | |
| *G11C 11/54* | (2006.01) | |
| *G11C 16/26* | (2006.01) | |

(52) U.S. Cl.
CPC ................ *G11C 7/16* (2013.01); *G11C 11/54* (2013.01); *G11C 16/26* (2013.01)

(58) Field of Classification Search
CPC .......... G06N 3/08; G06N 3/044; G06N 3/048; G06N 3/0442; G11C 27/00; G11C 7/16; G11C 11/54; G11C 27/02; G11C 7/1006; G11C 27/026; G11C 27/024; G11C 16/0425; G11C 7/1051; G11C 16/26; G11C 7/06; H03M 1/00; H03M 1/01; H03M 1/662; H03M 1/06; G06F 3/0655
See application file for complete search history.

(56) References Cited

U.S. PATENT DOCUMENTS

| | | | |
|---|---|---|---|
| 10,748,630 | B2 | 8/2020 | Tran |
| 2011/0286271 | A1* | 11/2011 | Chen ................... G11C 11/5642 |
| | | | 365/185.09 |
| 2017/0337466 | A1 | 11/2017 | Bayat |
| 2019/0164046 | A1* | 5/2019 | Song ...................... G11C 11/54 |
| 2020/0065650 | A1* | 2/2020 | Tran ........................ G11C 11/54 |
| 2020/0065660 | A1* | 2/2020 | Tran ........................ G11C 27/02 |
| 2021/0089875 | A1 | 3/2021 | Tran et al. |
| 2021/0141753 | A1* | 5/2021 | Yin ..................... G06F 13/4022 |
| 2022/0335278 | A1* | 10/2022 | Wu ........................ G06N 3/065 |

OTHER PUBLICATIONS

Japanese Office Action mailed on Dec. 17, 2024 corresponding to the related Japanese Patent Application No. 2023-564551. [Google English translations and original Japanese Office Action are attached.].

Raqibul Hasan, et al., "On-chip training of memristor crossbar based multi-layer neural networks," Microelectronics Journal, vol. 66, Jun. 6, 2017, pp. 31-40.

Yao Peng, et al., "Fully hardware-implemented memristor convolutional neural network," Nature, Nature Publishing Group UK, London, vol. 577, No. 7792, Jan. 30, 2020, pp. 1-21.

Olga Krestinskaya, et al., "Neuro-memristive Circuits for Edge Computing: A review," arxiv.org, Cornell University Library, Jul. 1, 2018, pp. 1-17.

PCT Partial Search Report dated Feb. 9, 2022 for the related PCT Patent Application No. US2021/049075.

Taiwanese Office Action mailed on Jan. 9, 2023 corresponding to the related Taiwanese Patent Application No. 111118158.

Machine translation of Office Action from Korea Patent Office, Jul. 11, 2025, filed under Korea Application No. 10-2023-7035599, 8 pages.

* cited by examiner

Memory Cell
210

Memory Cell
410

Memory Cell
510

LSTM Cell
1700

GRU 1800

2300

2400

2900

VMM System
3300

FIGURE 43

Pipelined SAR ADC Circuit
4300

FIGURE 44A

Hybrid SAR + Serial ADC Circuit
4400

Hybrid SAR + Serial ADC Circuit
4440

Tracking VREF Circuit
4600

4601

4603

VREFx

4602

OUTPUT CIRCUIT FOR ANALOG NEURAL MEMORY IN A DEEP LEARNING ARTIFICIAL NEURAL NETWORK

PRIORITY CLAIM

This application claims priority from U.S. Provisional Patent Application No. 63/190,240, filed on May 19, 2021, and titled, "Hybrid Output Architecture for Analog Neural Memory in a Deep Learning Artificial Neural Network," which is incorporated by reference herein.

FIELD OF THE INVENTION

Numerous embodiments are disclosed for a hybrid output architecture for an analog neural memory in a deep learning artificial neural network.

BACKGROUND OF THE INVENTION

Artificial neural networks mimic biological neural networks (the central nervous systems of animals, in particular the brain) and are used to estimate or approximate functions that can depend on a large number of inputs and are generally unknown. Artificial neural networks generally include layers of interconnected "neurons" which exchange messages between each other.

FIG. 1 illustrates an artificial neural network, where the circles represent the inputs or layers of neurons. The connections (called synapses) are represented by arrows and have numeric weights that can be tuned based on experience. This makes neural networks adaptive to inputs and capable of learning. Typically, neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical neural networks rely on a very large number of synapses, enabling high connectivity between neurons, i.e., a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

Applicant previously disclosed an artificial (analog) neural network that utilizes one or more non-volatile memory arrays as the synapses in U.S. patent application Ser. No. 15/594,439, which is incorporated by reference. The non-volatile memory arrays operate as an analog neural memory. The neural network device includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells is configured to store a weight value corresponding to a number of electrons on the floating gate. The plurality of memory cells is configured to multiply the first plurality of inputs by the stored weight values to generate the first plurality of outputs.

Non-Volatile Memory Cells

Non-volatile memories are well known. For example, U.S. Pat. No. 5,029,130 ("the '130 patent"), which is incorporated herein by reference, discloses an array of split gate non-volatile memory cells, which are a type of flash memory cells. Such a memory cell 210 is shown in FIG. 2. Each memory cell 210 includes source region 14 and drain region 16 formed in semiconductor substrate 12, with channel region 18 there between. Floating gate 20 is formed over and insulated from (and controls the conductivity of) a first portion of the channel region 18, and over a portion of the source region 14. Word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim (FN) tunneling.

Memory cell 210 is programmed by source side injection (SSI) with hot electrons (where electrons are placed on the floating gate) by placing a positive voltage on the word line terminal 22, and a positive voltage on the source region 14. Electron current will flow from the drain region 16 towards the source region 14. The electrons will accelerate and become heated when they reach the gap between the word line terminal 22 and the floating gate 20. Some of the heated electrons will be injected through the gate oxide onto the floating gate 20 due to the attractive electrostatic force from the floating gate 20.

Memory cell 210 is read by placing positive read voltages on the drain region 16 and word line terminal 22 (which turns on the portion of the channel region 18 under the word line terminal). If the floating gate 20 is positively charged (i.e. erased of electrons), then the portion of the channel region 18 under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage and current ranges that can be applied to the terminals of memory cell 110 for performing read, erase, and program operations:

TABLE NO. 1

| Operation of Flash Memory Cell 210 of FIG. 3 | | | |
|---|---|---|---|
| | WL | BL | SL |
| Read | 2-3 V | 0.6-2 V | 0 V |
| Erase | ~11-13 V | 0 V | 0 V |
| Program | 1-2 V | 10.5-3 μA | 9-10 V |

Other split gate memory cell configurations, which are other types of flash memory cells, are known. For example, FIG. 3 depicts a four-gate memory cell 310 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,310, which is incorporated herein by reference for all purposes. Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage and current ranges that can be applied to the terminals of memory cell 310 for performing read, erase, and program operations:

TABLE NO. 2

| Operation of Flash Memory Cell 310 of FIG. 3 | | | | | |
|---|---|---|---|---|---|
| | WL/SG | BL | CG | EG | SL |
| Read | 1.0-2 V | 0.6-2 V | 0-2.6 V | 0-2.6 V | 0 V |
| Erase | −0.5 V/0 V | 0 V | 0 V/−8 V | 8-12 V | 0 V |
| Program | 1 V | 0.1-1 μA | 8-11 V | 4.5-9 V | 4.5-5 V |

FIG. 4 depicts a three-gate memory cell 410, which is another type of flash memory cell. Memory cell 410 is identical to the memory cell 310 of FIG. 3 except that memory cell 410 does not have a separate control gate. The erase operation (whereby erasing occurs through use of the erase gate) and read operation are similar to that of the FIG. 3 except there is no control gate bias applied. The programming operation also is done without the control gate bias, and as a result, a higher voltage must be applied on the source line during a program operation to compensate for a lack of control gate bias.

Table No. 3 depicts typical voltage and current ranges that can be applied to the terminals of memory cell 410 for performing read, erase, and program operations:

TABLE NO. 3

| Operation of Flash Memory Cell 410 of FIG. 4 | | | |
|---|---|---|---|
| | WL/SG | BL | EG | SL |
| Read | 0.7-2.2 V | 0.6-2 V | 0-2.6 V | 0 V |
| Erase | −0.5 V/0 V | 0 V | 11.5 V | 0 V |
| Program | 1 V | 0.2-3 μA | 4.5 V | 7-9 V |

FIG. 5 depicts stacked gate memory cell 510, which is another type of flash memory cell. Memory cell 510 is similar to memory cell 210 of FIG. 2, except that floating gate 20 extends over the entire channel region 18, and control gate 22 (which here will be coupled to a word line)

extends over floating gate 20, separated by an insulating layer (not shown). The erase is done by FN tunneling of electrons from FG to substrate, programming is by channel hot electron (CHE) injection at region between the channel 18 and the drain region 16, by the electrons flowing from the source region 14 towards to drain region 16 and read operation which is similar to that for memory cell 210 with a higher control gate voltage.

Table No. 4 depicts typical voltage ranges that can be applied to the terminals of memory cell 510 and substrate 12 for performing read, erase, and program operations:

TABLE NO. 4

| Operation of Flash Memory Cell 510 of FIG. 5 | | | | |
|---|---|---|---|---|
| | CG | BL | SL | Substrate |
| Read | 2-5 V | 0.6-2 V | 0 V | 0 V |
| Erase | −8 to −10 V/0 V | FLT | FLT | 8-10 V/15-20 V |
| Program | 8-12 V | 3-5 V | 0 V | 0 V |

The methods and means described herein may apply to other non-volatile memory technologies such as FINFET split gate flash or stack gate flash memory, NAND flash, SONOS (silicon-oxide-nitride-oxide-silicon, charge trap in nitride), MONOS (metal-oxide-nitride-oxide-silicon, metal charge trap in nitride), ReRAM (resistive ram), PCM (phase change memory), MRAM (magnetic ram), FeRAM (ferroelectric ram), CT (charge trap) memory, CN (carbon-tube) memory, OTP (bi-level or multi-level one time programmable), and CeRAM (correlated electron ram), without limitation.

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e. charge on the floating gate) of each memory cell in the array can be continuously changed from a fully erased state to a fully programmed state, independently and with minimal disturbance of other memory cells. In another embodiment, the memory state (i.e., charge on the floating gate) of each memory cell in the array can be continuously changed from a fully programmed state to a fully erased state, and vice-versa, independently and with minimal disturbance of other memory cells. This means the cell storage is analog or at the very least can store one of many discrete values (such as 16 or 64 different values), which allows for very precise and individual tuning of all the cells in the memory array, and which makes the memory array ideal for storing and making fine tuning adjustments to the synapsis weights of the neural network.

Neural Networks Employing Non-Volatile Memory Cell Arrays

FIG. 6 conceptually illustrates a non-limiting example of a neural network utilizing a non-volatile memory array of the present embodiments. This example uses the non-volatile memory array neural network for a facial recognition application, but any other appropriate application could be implemented using a non-volatile memory array based neural network.

S0 is the input layer, which for this example is a 32×32 pixel RGB image with 5 bit precision (i.e. three 32×32 pixel arrays, one for each color R, G and B, each pixel being 5 bit precision). The synapses CB1 going from input layer S0 to layer C1 apply different sets of weights in some instances and shared weights in other instances, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, where these 9 input values are multiplied by the appropriate weights and, after summing the outputs of that multiplication, a single output value is determined and provided by a first synapse of CB1 for generating a pixel of one of the feature maps of layer C1. The 3×3 filter is then shifted one pixel to the right within input layer S0 (i.e., adding the column of three pixels on the right, and dropping the column of three pixels on the left), whereby the 9 pixel values in this newly positioned filter are provided to the synapses CB1, where they are multiplied by the same weights and a second single output value is determined by the associated synapse. This process is continued until the 3×3 filter scans across the entire 32×32 pixel image of input layer S0, for all three colors and for all bits (precision values). The process is then repeated using different sets of weights to generate a different feature map of layer C1, until all the features maps of layer C1 have been calculated.

In layer C1, in the present example, there are 16 feature maps, with 30×30 pixels each. Each pixel is a new feature pixel extracted from multiplying the inputs and kernel, and therefore each feature map is a two dimensional array, and thus in this example layer C1 constitutes 16 layers of two dimensional arrays (keeping in mind that the layers and arrays referenced herein are logical relationships, not necessarily physical relationships—i.e., the arrays are not necessarily oriented in physical two dimensional arrays). Each of the 16 feature maps in layer C1 is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from layer C1 to layer S1, which pools values from consecutive, non-overlapping 2×2 regions in each feature map. The purpose of the pooling function P1 is to average out the nearby location (or a max function can also be used), to reduce the dependence of the edge location for example and to reduce the data size before going to the next stage. At layer S1, there are 16 15×15 feature maps (i.e., sixteen different arrays of 15×15 pixels each). The synapses CB2 going from layer S1 to layer C2 scan maps in layer S1 with 4×4 filters, with a filter shift of 1 pixel. At layer C2, there are 22 12×12 feature maps. An activation function P2 (pooling) is applied before going from layer C2 to layer S2, which pools values from consecutive non-overlapping 2×2 regions in each feature map. At layer S2, there are 22 6×6 feature maps. An activation function (pooling) is applied at the synapses CB3 going from layer S2 to layer C3, where every neuron in layer C3 connects to every map in layer S2 via a respective synapse of CB3. At layer C3, there are 64 neurons. The synapses CB4 going from layer C3 to the output layer S3 fully connects C3 to S3, i.e. every neuron in layer C3 is connected to every neuron in layer S3. The output at S3 includes 10 neurons, where the highest output neuron determines the class. This output could, for example, be indicative of an identification or classification of the contents of the original image.

Each layer of synapses is implemented using an array, or a portion of an array, of non-volatile memory cells.

FIG. 7 is a block diagram of an array that can be used for that purpose. Vector-by-matrix multiplication (VMM) array 32 includes non-volatile memory cells and is utilized as the synapses (such as CB1, CB2, CB3, and CB4 in FIG. 6) between one layer and the next layer. Specifically, VMM array 32 includes an array of non-volatile memory cells 33, erase gate and word line gate decoder 34, control gate decoder 35, bit line decoder 36 and source line decoder 37, which decode the respective inputs for the non-volatile memory cell array 33. Input to VMM array 32 can be from the erase gate and wordline gate decoder 34 or from the control gate decoder 35. Source line decoder 37 in this example also decodes the output of the non-volatile memory cell array 33. Alternatively, bit line decoder 36 can decode the output of the non-volatile memory cell array 33.

Non-volatile memory cell array 33 serves two purposes. First, it stores the weights that will be used by the VMM array 32. Second, the non-volatile memory cell array 33 effectively multiplies the inputs by the weights stored in the non-volatile memory cell array 33 and adds them up per output line (source line or bit line) to produce the output, which will be the input to the next layer or input to the final layer. By performing the multiplication and addition function, the non-volatile memory cell array 33 negates the need for separate multiplication and addition logic circuits and is also power efficient due to its in-situ memory computation.

The output of non-volatile memory cell array 33 is supplied to a differential summer (such as a summing op-amp or a summing current mirror) 38, which sums up the outputs of the non-volatile memory cell array 33 to create a single value for that convolution. The differential summer 38 is arranged to perform summation of positive weight and negative weight.

The summed-up output values of differential summer 38 are then supplied to an activation function block 39, which rectifies the output. The activation function block 39 may provide sigmoid, tan h, or ReLU functions. The rectified output values of activation function block 39 become an element of a feature map as the next layer (e.g. C1 in FIG. 6), and are then applied to the next synapse to produce the next feature map layer or final layer. Therefore, in this example, non-volatile memory cell array 33 constitutes a plurality of synapses (which receive their inputs from the prior layer of neurons or from an input layer such as an image database), and summing op-amp 38 and activation function block 39 constitute a plurality of neurons.

The input to VMM array 32 in FIG. 7 (WLx, EGx, CGx, and optionally BLx and SLx) can be analog level, binary level, or digital bits (in which case a DAC is provided to convert digital bits to appropriate input analog level) and the output can be analog level, binary level, or digital bits (in which case an output ADC is provided to convert output analog level into digital bits).

FIG. 8 is a block diagram depicting the usage of numerous layers of VMM arrays 32, here labeled as VMM arrays 32a, 32b, 32c, 32d, and 32e. As shown in FIG. 8, the input, denoted Inputx, is converted from digital to analog by a digital-to-analog converter 31 and provided to input VMM array 32a. The converted analog inputs could be voltage or current. The input D/A conversion for the first layer could be done by using a function or a LUT (look up table) that maps the inputs Inputx to appropriate analog levels for the matrix multiplier of input VMM array 32a. The input conversion could also be done by an analog to analog (A/A) converter to convert an external analog input to a mapped analog input to the input VMM array 32a.

The output generated by input VMM array 32a is provided as an input to the next VMM array (hidden level 1) 32b, which in turn generates an output that is provided as an input to the next VMM array (hidden level 2) 32c, and so on. The various layers of VMM array 32 function as different layers of synapses and neurons of a convolutional neural network (CNN). Each VMM array 32a, 32b, 32c, 32d, and 32e can be a stand-alone, physical non-volatile memory array, or multiple VMM arrays could utilize different portions of the same physical non-volatile memory array, or multiple VMM arrays could utilize overlapping portions of the same physical non-volatile memory array. The example shown in FIG. 8 contains five layers (32a,32b,32c,32d,32e): one input layer (32a), two hidden layers (32b,32c), and two fully connected layers (32d,32e). One of ordinary skill in the art will appreciate that this is merely exemplary and that a system instead could comprise more than two hidden layers and more than two fully connected layers.

Vector-by-Matrix Multiplication (VMM) Arrays

FIG. 9 depicts neuron VMM array 900, which is particularly suited for memory cells 310 as shown in FIG. 3 and is utilized as the synapses and parts of neurons between an input layer and the next layer. VMM array 900 comprises memory array 901 of non-volatile memory cells and reference array 902 (at the top of the array) of non-volatile reference memory cells. Alternatively, another reference array can be placed at the bottom.

In VMM array 900, control gate lines, such as control gate line 903, run in a vertical direction (hence reference array 902 in the row direction is orthogonal to control gate line 903), and erase gate lines, such as erase gate line 904, run in a horizontal direction. Here, the inputs to VMM array 900 are provided on the control gate lines (CG0, CG1, CG2, CG3), and the output of VMM array 900 emerges on the source lines (SL0, SL1). In one embodiment, only even rows are used, and in another embodiment, only odd rows are used. The current placed on each source line (SL0, SL1, respectively) performs a summing function of all the currents from the memory cells connected to that particular source line.

As described herein for neural networks, the non-volatile memory cells of VMM array 900, i.e. the memory cells 310 of VMM array 900, are preferably configured to operate in a sub-threshold region.

The non-volatile reference memory cells and the non-volatile memory cells described herein are biased in weak inversion (sub threshold region):

$$Ids=Io*e^{(Vg-Vth)/nVt}=w*Io*e^{(Vg)/nVt},$$

where $w=e^{(-Vth)/nVt}$ where Ids is the drain to source current; Vg is gate voltage on the memory cell; Vth is threshold voltage of the memory cell; Vt is thermal voltage=k*T/q with k being the Boltzmann constant, T the temperature in Kelvin, and q the electronic charge; n is a slope factor=1+(Cdep/Cox) with Cdep=capacitance of the depletion layer, and Cox capacitance of the gate oxide layer; Io is the memory cell current at gate voltage equal to threshold voltage, Io is proportional to $(Wt/L)*u*Cox*(n-1)*Vt^2$ where u is carrier mobility and Wt and L are width and length, respectively, of the memory cell.

For an I-to-V log converter using a memory cell (such as a reference memory cell or a peripheral memory cell) or a transistor to convert input current into an input voltage:

$$Vg=n*Vt*\log [Ids/wp*Io]$$

where, wp is w of a reference or peripheral memory cell.

For a memory array used as a vector matrix multiplier VMM array with the current input, the output current is:

$$Iout=wa*Io*e^{(Vg)/nVt}, \text{ namely}$$

$$Iout=(wa/wp)*Iin=W*Iin$$

$$W=e^{(Vthp-Vtha)/nVt}$$

Here, wa=w of each memory cell in the memory array. Vthp is effective threshold voltage of the peripheral memory cell and Vtha is effective threshold voltage of the main (data) memory cell. Note that the threshold voltage of a transistor is a function of substrate body bias voltage and the substrate body bias voltage, denoted Vsb, can be modulated to compensate for various conditions, on such temperature. The threshold voltage Vth can be expressed as:

$$Vth=Vth0+gamma(SQRT|Vsb-2*\varphi F|-SQRT|2*\varphi F|)$$

Where Vth0 is threshold voltage with zero substrate bias, $\varphi F$ is a surface potential, and gamma is a body effect parameter.

A wordline or control gate can be used as the input for the memory cell for the input voltage.

Alternatively, the flash memory cells of VMM arrays described herein can be configured to operate in the linear region:

$$Ids=beta*(Vgs-Vth)*Vds; beta=u*Cox*Wt/L$$

$$W=\alpha(Vgs-Vth)$$

meaning weight W in the linear region is proportional to (Vgs–Vth)

A wordline or control gate or bitline or sourceline can be used as the input for the memory cell operated in the linear region. The bitline or sourceline can be used as the output for the memory cell.

For an I-to-V linear converter, a memory cell (such as a reference memory cell or a peripheral memory cell) or a transistor operating in the linear region can be used to linearly convert an input/output current into an input/output voltage.

Alternatively, the memory cells of VMM arrays described herein can be configured to operate in the saturation region:

$$Ids=½*beta*(Vgs-Vth)^2; beta=u*Cox*Wt/L$$

$$W\alpha(Vgs-Vth)^2, \text{ meaning weight } W \text{ is proportional to } (Vgs-Vth)^2$$

A wordline, control gate, or erase gate can be used as the input for the memory cell operated in the saturation region. The bitline or sourceline can be used as the output for the output neuron.

Alternatively, the memory cells of VMM arrays described herein can be used in all regions or a combination thereof (sub threshold, linear, or saturation) for each layer or multi layers of a neural network.

Other embodiments for VMM array 32 of FIG. 7 are described in U.S. Pat. No. 10,748,630, which is incorporated by reference herein. As described in that application. a sourceline or a bitline can be used as the neuron output (current summation output).

FIG. 10 depicts neuron VMM array 1000, which is particularly suited for memory cells 210 as shown in FIG. 2 and is utilized as the synapses between an input layer and the next layer. VMM array 1000 comprises a memory array 1003 of non-volatile memory cells, reference array 1001 of first non-volatile reference memory cells, and reference array 1002 of second non-volatile reference memory cells. Reference arrays 1001 and 1002, arranged in the column direction of the array, serve to convert current inputs flowing into terminals BLR0, BLR1, BLR2, and BLR3 into voltage inputs WL0, WL1, WL2, and WL3. In effect, the first and second non-volatile reference memory cells are diode-connected through multiplexors 1014 (only partially depicted) with current inputs flowing into them. The reference cells are tuned (e.g., programmed) to target reference levels. The target reference levels are provided by a reference mini-array matrix (not shown).

Memory array 1003 serves two purposes. First, it stores the weights that will be used by the VMM array 1000 on respective memory cells thereof. Second, memory array 1003 effectively multiplies the inputs (i.e. current inputs provided in terminals BLR0, BLR1, BLR2, and BLR3, which reference arrays 1001 and 1002 convert into the input voltages to supply to wordlines WL0, WL1, WL2, and WL3) by the weights stored in the memory array 1003 and then adds all the results (memory cell currents) to produce the output on the respective bit lines (BL0-BLN), which will be the input to the next layer or input to the final layer. By performing the multiplication and addition function, memory array 1003 negates the need for separate multiplication and addition logic circuits and is also power efficient. Here, the voltage inputs are provided on the word lines WL0, WL1, WL2, and WL3, and the output emerges on the respective bit lines BL0-BLN during a read (inference) operation. The current placed on each of the bit lines BL0-BLN performs a summing function of the currents from all non-volatile memory cells connected to that particular bitline.

Table No. 5 depicts operating voltages and currents for VMM array 1000. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE NO. 5

| Operation of VMM Array 1000 of FIG. 10: | | | | | |
|---|---|---|---|---|---|
| WL | WL -unsel | BL | BL -unsel | SL | SL -unsel |
| Read | 1-3.5 V | −0.5 V/0 V | 0.6-2 V (Ineuron) | 0.6 V-2 V/0 V | 0 V | 0 V |
| Erase | ~5-13 V | 0 V | 0 V | 0 V | 0 V | 0 V |
| Program | 1-2 V | −0.5 V/0 V | 0.1-3 uA | Vinh ~2.5 V | 4-10 V | 0-1 V/FLT |

FIG. 11 depicts neuron VMM array 1100, which is particularly suited for memory cells 210 as shown in FIG. 2 and is utilized as the synapses and parts of neurons between an input layer and the next layer. VMM array 1100 comprises a memory array 1103 of non-volatile memory cells, reference array 1101 of first non-volatile reference memory cells, and reference array 1102 of second non-volatile reference memory cells. Reference arrays 1101 and 1102 run in row direction of the VMM array 1100. VMM array is similar to VMM 1000 except that in VMM array 1100, the word lines run in the vertical direction. Here, the inputs are provided on the word lines (WLA0, WLB0, WLA1, WLB2, WLA2, WLB2, WLA3, WLB3), and the output emerges on the source line (SL0, SL1) during a read operation. The current placed on each source line performs a summing function of all the currents from the memory cells connected to that particular source line.

Table No. 6 depicts operating voltages and currents for VMM array 1100. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE NO. 6

| Operation of VMM Array 1100 of FIG. 11 | | | | | |
|---|---|---|---|---|---|
| WL | WL -unsel | BL | BL -unsel | SL | SL -unsel |
| Read | 1-3.5 V | −0.5 V/0 V | 0.6-2 V | 0.6 V-2 V/0 V | ~0.3-1 V (Ineuron) | 0 V |

TABLE NO. 6-continued

| | WL | WL -unsel | BL | BL -unsel | SL | SL -unsel |
|---|---|---|---|---|---|---|
| | | | Operation of VMM Array 1100 of FIG. 11 | | | |
| Erase | ~5-13 V | 0 V | 0 V | 0 V | 0 V | SL-inhibit (~4-8 V) |
| Program | 1-2 V V | −0.5 V/0 V | 0.1-3 uA | Vinh ~2.5 V | 4-10 V | 0-1 V/FLT |

FIG. 12 depicts neuron VMM array 1200, which is particularly suited for memory cells 310 as shown in FIG. 3 and is utilized as the synapses and parts of neurons between an input layer and the next layer. VMM array 1200 comprises a memory array 1203 of non-volatile memory cells, reference array 1201 of first non-volatile reference memory cells, and reference array 1202 of second non-volatile reference memory cells. Reference arrays 1201 and 1202 serve to convert current inputs flowing into terminals BLR0, BLR1, BLR2, and BLR3 into voltage inputs CG0, CG1, CG2, and CG3. In effect, the first and second non-volatile reference memory cells are diode-connected through multiplexors 1212 (only partially shown) with current inputs flowing into them through BLR0, BLR1, BLR2, and BLR3. Multiplexors 1212 each include a respective multiplexor 1205 and a cascoding transistor 1204 to ensure a constant voltage on the bitline (such as BLR0) of each of the first and second non-volatile reference memory cells during a read operation. The reference cells are tuned to target reference levels.

programmed until the desired charge on the floating gate is reached. If too much charge is placed on the floating gate (such that the wrong value is stored in the cell), the cell is erased and the sequence of partial programming operations starts over. As shown, two rows sharing the same erase gate (such as EG0 or EG1) are erased together (which is known as a page erase), and thereafter, each cell is partially programmed until the desired charge on the floating gate is reached.

Table No. 7 depicts operating voltages and currents for VMM array 1200. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE NO. 7

| | | | | | | CG -unsel same sector | CG -unsel | | EG -unsel | | SL -unsel |
|---|---|---|---|---|---|---|---|---|---|---|---|
| | WL | WL -unsel | BL | BL -unsel | CG | | | EG | | SL | |
| | | | | | | | | | | | |
| Read | 1.0-2 V | −0.5 V/0 V | 0.6-2 V (Ineuron) | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 0-2.6 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

Memory array 1203 serves two purposes. First, it stores the weights that will be used by the VMM array 1200. Second, memory array 1203 effectively multiplies the inputs (current inputs provided to terminals BLR0, BLR1, BLR2, and BLR3, for which reference arrays 1201 and 1202 convert these current inputs into the input voltages to supply to the control gates (CG0, CG1, CG2, and CG3) by the weights stored in the memory array and then add all the results (cell currents) to produce the output, which appears on BL0-BLN, and will be the input to the next layer or input to the final layer. By performing the multiplication and addition function, the memory array negates the need for separate multiplication and addition logic circuits and is also power efficient. Here, the inputs are provided on the control gate lines (CG0, CG1, CG2, and CG3), and the output emerges on the bitlines (BL0-BLN) during a read operation. The current placed on each bitline performs a summing function of all the currents from the memory cells connected to that particular bitline.

VMM array 1200 implements uni-directional tuning for non-volatile memory cells in memory array 1203. That is, each non-volatile memory cell is erased and then partially FIG. 13 depicts neuron VMM array 1300, which is particularly suited for memory cells 310 as shown in FIG. 3, and is utilized as the synapses and parts of neurons between an input layer and the next layer. VMM array 1300 comprises a memory array 1303 of non-volatile memory cells, reference array 1301 or first non-volatile reference memory cells, and reference array 1302 of second non-volatile reference memory cells. EG lines EGR0, EG0, EG1 and EGR1 are run vertically while CG lines CG0, CG1, CG2 and CG3 and SL lines WL0, WL1, WL2 and WL3 are run horizontally. VMM array 1300 is similar to VMM array 1400, except that VMM array 1300 implements bi-directional tuning, where each individual cell can be completely erased, partially programmed, and partially erased as needed to reach the desired amount of charge on the floating gate due to the use of separate EG lines. As shown, reference arrays 1301 and 1302 convert input current in the terminal BLR0, BLR1, BLR2, and BLR3 into control gate voltages CG0, CG1, CG2, and CG3 (through the action of diode-connected reference cells through multiplexors 1314) to be applied to the memory cells in the row direction. The current output (neuron) is in the bitlines BL0-BLN, where each bit line sums all currents from the non-volatile memory cells con-
nected to that particular bitline.

Table No. 8 depicts operating voltages and currents for
VMM array 1300. The columns in the table indicate the
voltages placed on word lines for selected cells, word lines
for unselected cells, bit lines for selected cells, bit lines for
unselected cells, control gates for selected cells, control
gates for unselected cells in the same sector as the selected
cells, control gates for unselected cells in a different sector
than the selected cells, erase gates for selected cells, erase
gates for unselected cells, source lines for selected cells, and
source lines for unselected cells. The rows indicate the
operations of read, erase, and program.

FIG. 27 depicts neuron VMM array 2700, which is
particularly suited for memory cells 410 as shown in FIG. 4,
and is utilized as the synapses and parts of neurons between
an input layer and the next layer. In this example, the inputs
INPUT$_0$, . . . , INPUT$_N$ are received on the gates of bit line
control gates 2701-1, 2701-2, . . . , 2701-(N−1), and 2701-N,
respectively, which are coupled to bit lines BL$_0$, . . . , BL$_N$,
respectively. Exemplary outputs OUTPUT$_1$ and OUTPUT$_2$
are generated on source lines SL$_0$ and SL$_1$.

FIG. 28 depicts neuron VMM array 2800, which is
particularly suited for memory cells 310 as shown in FIG. 3,
memory cells 510 as shown in FIG. 5, and memory cells 710
as shown in FIG. 7, and is utilized as the synapses and parts

TABLE NO. 8

| | | | | | | | CG - unsel same sector | | | | | |
|---|---|---|---|---|---|---|---|---|---|---|---|---|
| | | WL - unsel | BL | BL - unsel | CG | | | CG - unsel | EG | EG - unsel | SL | SL - unsel |
| | WL | | | | | | | | | | | |
| Read | 1.0-2 V | −0.5 V/0 V | 0.6-2 V (Ineuron) | 0 V | 0-2.6 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 4-9 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

FIG. 22 depicts neuron VMM array 2200, which is
particularly suited for memory cells 210 as shown in FIG. 2
and is utilized as the synapses and parts of neurons between
an input layer and the next layer. In VMM array 2200, the
inputs INPUT$_0$ . . . . , INPUT$_N$ are received on bit lines
BL$_0$, . . . BL$_N$, respectively, and the outputs OUTPUT$_1$,
OUTPUT$_2$, OUTPUT$_3$, and OUTPUT$_4$ are generated on
source lines SL$_0$, SL$_1$, SL$_2$, and SL$_3$, respectively.

FIG. 23 depicts neuron VMM array 2300, which is
particularly suited for memory cells 210 as shown in FIG. 2
and is utilized as the synapses and parts of neurons between
an input layer and the next layer. In this example, the inputs
INPUT$_0$, INPUT$_1$, INPUT$_2$, and INPUT$_3$ are received on
source lines SL$_0$, SL$_1$, SL$_2$, and SL$_3$, respectively, and the
outputs OUTPUT$_0$, . . . OUTPUT$_N$ are generated on bit lines
BL$_0$, . . . , BL$_N$.

FIG. 24 depicts neuron VMM array 2400, which is
particularly suited for memory cells 210 as shown in FIG. 2,
and is utilized as the synapses and parts of neurons between
an input layer and the next layer. In this example, the inputs
INPUT$_0$, . . . , INPUT$_M$ are received on word lines
WL$_0$, . . . , WL$_M$, respectively, and the outputs
OUTPUT$_0$, . . . , OUTPUT$_N$ are generated on bit lines
BL$_0$, . . . , BL$_N$.

FIG. 25 depicts neuron VMM array 2500, which is
particularly suited for memory cells 310 as shown in FIG. 3,
and is utilized as the synapses and parts of neurons between
an input layer and the next layer. In this example, the inputs
INPUT$_0$, . . . , INPUT$_M$ are received on word lines
WL$_0$, . . . , WL$_M$, respectively, and the outputs
OUTPUT$_0$, . . . OUTPUT$_N$ are generated on bit lines
BL$_0$, . . . , BL$_N$.

FIG. 26 depicts neuron VMM array 2600, which is
particularly suited for memory cells 410 as shown in FIG. 4,
and is utilized as the synapses and parts of neurons between
an input layer and the next layer. In this example, the inputs
INPUT$_0$, . . . , INPUT$_n$ are received on vertical control gate
lines CG$_0$, . . . , CG$_N$, respectively, and the outputs OUT-
PUT$_1$ and OUTPUT$_2$ are generated on source lines SL$_0$ and
SL$_1$.

of neurons between an input layer and the next layer. In this
example, the inputs INPUT$_0$, . . . , INPUT$_M$ are received on
word lines WL$_0$, . . . , WL$_M$, and the outputs
OUTPUT$_0$, . . . , OUTPUT$_N$ are generated on bit lines
BL$_0$, . . . , BL$_N$, respectively.

FIG. 29 depicts neuron VMM array 2900, which is
particularly suited for memory cells 310 as shown in FIG. 3,
memory cells 510 as shown in FIG. 5, and memory cells 710
as shown in FIG. 7, and is utilized as the synapses and parts
of neurons between an input layer and the next layer. In this
example, the inputs INPUT$_0$, . . . , INPUT$_M$ are received on
control gate lines CG$_0$, . . . CG$_M$. Outputs OUTPUT$_0$, . . . ,
OUTPUT$_N$ are generated on vertical source lines SL$_0$, . . . ,
SL$_N$, respectively, where each source line SL$_i$ is coupled to
the source lines of all memory cells in column i.

FIG. 30 depicts neuron VMM array 3000, which is
particularly suited for memory cells 310 as shown in FIG. 3,
memory cells 510 as shown in FIG. 5, and memory cells 710
as shown in FIG. 7, and is utilized as the synapses and parts
of neurons between an input layer and the next layer. In this
example, the inputs INPUT$_0$, . . . , INPUT$_M$ are received on
control gate lines CG$_0$, . . . , CG$_M$. Outputs
OUTPUT$_0$, . . . , OUTPUT$_N$ are generated on vertical bit
lines BL$_0$, . . . , BL$_N$, respectively, where each bit line BL$_i$
is coupled to the bit lines of all memory cells in column i.

Long Short-Term Memory

The prior art includes a concept known as long short-term
memory (LSTM). LSTM units often are used in neural
networks. LSTM allows a neural network to remember
information over predetermined arbitrary time intervals and
to use that information in subsequent operations. A conven-
tional LSTM unit comprises a cell, an input gate, an output
gate, and a forget gate. The three gates regulate the flow of
information into and out of the cell and the time interval that
the information is remembered in the LSTM. VMMs are
particularly useful in LSTM units.

FIG. 14 depicts an exemplary LSTM 1400. LSTM 1400
in this example comprises cells 1401, 1402, 1403, and 1404.
Cell 1401 receives input vector x$_0$ and generates output vector $h_0$ and cell state vector $c_0$. Cell 1402 receives input vector $x_1$, the output vector (hidden state) $h_0$ from cell 1401, and cell state $c_0$ from cell 1401 and generates output vector $h_1$ and cell state vector $c_1$. Cell 1403 receives input vector $x_2$, the output vector (hidden state) $h_1$ from cell 1402, and cell state $c_1$ from cell 1402 and generates output vector $h_2$ and cell state vector $c_2$. Cell 1404 receives input vector $x_3$, the output vector (hidden state) $h_2$ from cell 1403, and cell state $c_2$ from cell 1403 and generates output vector $h_3$. Additional cells can be used, and an LSTM with four cells is merely an example.

FIG. 15 depicts an exemplary implementation of an LSTM cell 1500, which can be used for cells 1401, 1402, 1403, and 1404 in FIG. 14. LSTM cell 1500 receives input vector $x(t)$, cell state vector $c(t-1)$ from a preceding cell, and output vector $h(t-1)$ from a preceding cell, and generates cell state vector $c(t)$ and output vector $h(t)$.

LSTM cell 1500 comprises sigmoid function devices 1501, 1502, and 1503, each of which applies a number between 0 and 1 to control how much of each component in the input vector is allowed through to the output vector. LSTM cell 1500 also comprises tan h devices 1504 and 1505 to apply a hyperbolic tangent function to an input vector, multiplier devices 1506, 1507, and 1508 to multiply two vectors together, and addition device 1509 to add two vectors together. Output vector $h(t)$ can be provided to the next LSTM cell in the system, or it can be accessed for other purposes.

FIG. 16 depicts an LSTM cell 1600, which is an example of an implementation of LSTM cell 1500. For the reader's convenience, the same numbering from LSTM cell 1500 is used in LSTM cell 1600. Sigmoid function devices 1501, 1502, and 1503 and tan h device 1504 each comprise multiple VMM arrays 1601 and activation function blocks 1602. Thus, it can be seen that VMM arrays are particular useful in LSTM cells used in certain neural network systems. The multiplier devices 1506, 1507, and 1508 and the addition device 1509 are implemented in a digital manner or in an analog manner. The activation function blocks 1602 can be implemented in a digital manner or in an analog manner.

An alternative to LSTM cell 1600 (and another example of an implementation of LSTM cell 1500) is shown in FIG. 17. In FIG. 17, sigmoid function devices 1501, 1502, and 1503 and tan h device 1504 share the same physical hardware (VMM arrays 1701 and activation function block 1702) in a time-multiplexed fashion. LSTM cell 1700 also comprises multiplier device 1703 to multiply two vectors together, addition device 1708 to add two vectors together, tan h device 1505 (which comprises activation function block 1702), register 1707 to store the value $i(t)$ when $i(t)$ is output from sigmoid function block 1702, register 1704 to store the value $f(t)*c(t-1)$ when that value is output from multiplier device 1703 through multiplexor 1710, register 1705 to store the value $i(t)*u(t)$ when that value is output from multiplier device 1703 through multiplexor 1710, and register 1706 to store the value $o(t)*c\sim(t)$ when that value is output from multiplier device 1703 through multiplexor 1710, and multiplexor 1709.

Whereas LSTM cell 1600 contains multiple sets of VMM arrays 1601 and respective activation function blocks 1602, LSTM cell 1700 contains only one set of VMM arrays 1701 and activation function block 1702, which are used to represent multiple layers in the embodiment of LSTM cell 1700. LSTM cell 1700 will require less space than LSTM cell 1600, as LSTM cell 1700 will require ¼ as much space for VMMs and activation function blocks compared to LSTM cell 1600.

It can be further appreciated that LSTM units will typically comprise multiple VMM arrays, each of which requires functionality provided by certain circuit blocks outside of the VMM arrays, such as a summer and activation function block and high voltage generation blocks. Providing separate circuit blocks for each VMM array would require a significant amount of space within the semiconductor device and would be somewhat inefficient. The embodiments described below therefore reduce the circuitry required outside of the VMM arrays themselves.

Gated Recurrent Units

An analog VMM implementation can be utilized for a GRU (gated recurrent unit) system. GRUs are a gating mechanism in recurrent neural networks. GRUs are similar to LSTMs, except that GRU cells generally contain fewer components than an LSTM cell.

FIG. 18 depicts an exemplary GRU 1800. GRU 1800 in this example comprises cells 1801, 1802, 1803, and 1804. Cell 1801 receives input vector $x_0$ and generates output vector $h_0$. Cell 1802 receives input vector $x_1$, the output vector $h_0$ from cell 1801 and generates output vector $h_1$. Cell 1803 receives input vector $x_2$ and the output vector (hidden state) $h_1$ from cell 1802 and generates output vector $h_2$. Cell 1804 receives input vector $x_3$ and the output vector (hidden state) $h_2$ from cell 1803 and generates output vector $h_3$. Additional cells can be used, and an GRU with four cells is merely an example.

FIG. 19 depicts an exemplary implementation of a GRU cell 1900, which can be used for cells 1801, 1802, 1803, and 1804 of FIG. 18. GRU cell 1900 receives input vector $x(t)$ and output vector $h(t-1)$ from a preceding GRU cell and generates output vector $h(t)$. GRU cell 1900 comprises sigmoid function devices 1901 and 1902, each of which applies a number between 0 and 1 to components from output vector $h(t-1)$ and input vector $x(t)$. GRU cell 1900 also comprises a tan h device 1903 to apply a hyperbolic tangent function to an input vector, a plurality of multiplier devices 1904, 1905, and 1906 to multiply two vectors together, an addition device 1907 to add two vectors together, and a complementary device 1908 to subtract an input from 1 to generate an output.

FIG. 20 depicts a GRU cell 2000, which is an example of an implementation of GRU cell 1900. For the reader's convenience, the same numbering from GRU cell 1900 is used in GRU cell 2000. As can be seen in FIG. 20, sigmoid function devices 1901 and 1902, and tan h device 1903 each comprise multiple VMM arrays 2001 and activation function blocks 2002. Thus, it can be seen that VMM arrays are of particular use in GRU cells used in certain neural network systems. The multiplier devices 1904, 1905, 1906, the addition device 1907, and the complementary device 1908 are implemented in a digital manner or in an analog manner. The activation function blocks 2002 can be implemented in a digital manner or in an analog manner.

An alternative to GRU cell 2000 (and another example of an implementation of GRU cell 1900) is shown in FIG. 21. In FIG. 21, GRU cell 2100 utilizes VMM arrays 2101 and activation function block 2102, which when configured as a sigmoid function applies a number between 0 and 1 to control how much of each component in the input vector is allowed through to the output vector. In FIG. 21, sigmoid function devices 1901 and 1902 and tan h device 1903 share the same physical hardware (VMM arrays 2101 and activation function block 2102) in a time-multiplexed fashion.

GRU cell 2100 also comprises multiplier device 2103 to multiply two vectors together, addition device 2105 to add two vectors together, complementary device 2109 to subtract an input from 1 to generate an output, multiplexor 2104, register 2106 to hold the value h(t−1)*r(t) when that value is output from multiplier device 2103 through multiplexor 2104, register 2107 to hold the value h(t−1)*z(t) when that value is output from multiplier device 2103 through multiplexor 2104, and register 2108 to hold the value hˆ(t)*(1−z(t)) when that value is output from multiplier device 2103 through multiplexor 2104.

Whereas GRU cell 2000 contains multiple sets of VMM arrays 2001 and activation function blocks 2002, GRU cell 2100 contains only one set of VMM arrays 2101 and activation function block 2102, which are used to represent multiple layers in the embodiment of GRU cell 2100. GRU cell 2100 will require less space than GRU cell 2000, as GRU cell 2100 will require ⅓ as much space for VMMs and activation function blocks compared to GRU cell 2000.

It can be further appreciated that GRU systems will typically comprise multiple VMM arrays, each of which requires functionality provided by certain circuit blocks outside of the VMM arrays, such as a summer and activation function block and high voltage generation blocks. Providing separate circuit blocks for each VMM array would require a significant amount of space within the semiconductor device and would be somewhat inefficient. The embodiments described below therefore reduce the circuitry required outside of the VMM arrays themselves.

The input to the VMM arrays can be an analog level, a binary level, a pulse, a time modulated pulse, or digital bits (in this case a DAC is needed to convert digital bits to appropriate input analog level) and the output can be an analog level, a binary level, a timing pulse, pulses, or digital bits (in this case an output ADC is needed to convert output analog level into digital bits).

In general, for each memory cell in a VMM array, each weight W can be implemented by a single memory cell or by a differential cell or by two blend memory cells (average of 2 cells).

In the differential cell case, two memory cells are needed to implement a weight W as a differential weight (W=W+−W−). In the two blend memory cells, two memory cells are needed to implement a weight W as an average of two cells.

FIG. 31 depicts VMM system 3100. In some embodiments, the weights, W, stored in a VMM array are stored as differential pairs, W+ (positive weight) and W− (negative weight), where W=(W+)−(W−). In VMM system 3100, half of the bit lines are designated as W+ lines, that is, bit lines connecting to memory cells that will store positive weights W+, and the other half of the bit lines are designated as W− lines, that is, bit lines connecting to memory cells implementing negative weights W−. The W− lines are interspersed among the W+ lines in an alternating fashion. The subtraction operation is performed by a summation circuit that receives current from a W+ line and a W− line, such as summation circuits 3101 and 3102. The output of a W+ line and the output of a W− line are combined together to give effectively W=W+−W− for each pair of (W+, W−) cells for all pairs of (W+, W−) lines. While the above has been described in relation to W− lines interspersed among the W+ lines in an alternating fashion, in other embodiments W+ lines and W− lines can be arbitrarily located anywhere in the array.

FIG. 32 depicts another embodiment. In VMM system 3210, positive weights W+ are implemented in first array 3211 and negative weights W− are implemented in a second array 3212, second array 3212 separate from the first array, and the resulting weights are appropriately combined together by summation circuits 3213.

FIG. 33 depicts VMM system 3300. the weights, W, stored in a VMM array are stored as differential pairs, W+(positive weight) and W− (negative weight), where W=(W+)−(W−). VMM system 3300 comprises array 3301 and array 3302. Half of the bit lines in each of array 3301 and 3302 are designated as W+ lines, that is, bit lines connecting to memory cells that will store positive weights W+, and the other half of the bit lines in each of array 3301 and 3302 are designated as W− lines, that is, bit lines connecting to memory cells implementing negative weights W−. The W− lines are interspersed among the W+ lines in an alternating fashion. The subtraction operation is performed by a summation circuit that receives current from a W+ line and a W− line, such as summation circuits 3303, 3304, 3305, and 3306. The output of a W+ line and the output of a W− line from each array 3301, 3302 are respectively combined together to give effectively W=W+−W− for each pair of (W+, W−) cells for all pairs of (W+, W−) lines. In addition, the W values from each array 3301 and 3302 can be further combined through summation circuits 3307 and 3308, such that each W value is the result of a W value from array 3301 minus a W value from array 3302, meaning that the end result from summation circuits 3307 and 3308 is a differential value of two differential values.

Each non-volatile memory cells used in the analog neural memory system is to be erased and programmed to hold a very specific and precise amount of charge, i.e., the number of electrons, in the floating gate. For example, each floating gate must hold one of N different values, where N is the number of different weights that can be indicated by each cell. Examples of N include 16, 32, 64, 128, and 256.

Similarly, a read operation must be able to accurately discern between N different levels.

There is a need in VMM systems for improved output blocks that can quickly and accurately receive outputs from an array and discern the values represented by those outputs.

SUMMARY OF THE INVENTION

Numerous embodiments are disclosed for an output circuit for an analog neural memory in a deep learning artificial neural network.

BRIEF DESCRIPTION OF THE DRAWINGS

FIG. 43 depicts a pipelined successive approximation register analog-to-digital converter circuit.

FIGS. 44A and 44B depicts hybrid successive approximation register and serial analog-to-digital converter circuits.

DETAILED DESCRIPTION OF THE INVENTION

The artificial neural networks of the present invention utilize a combination of CMOS technology and non-volatile memory arrays.

VMM System Overview

Figure 1:
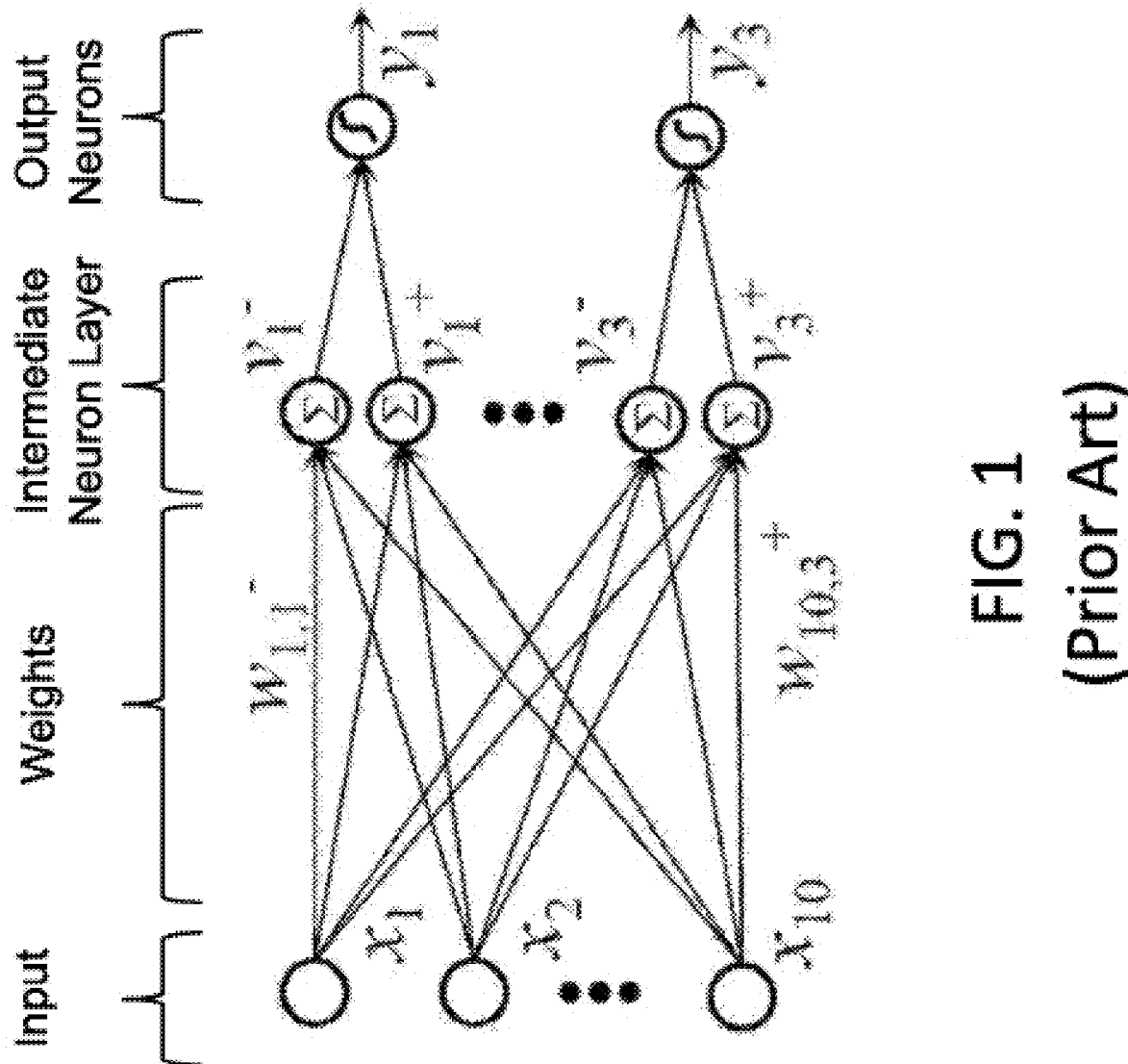
FIG. 1 is a diagram that illustrates an artificial neural network.
Figure 2:
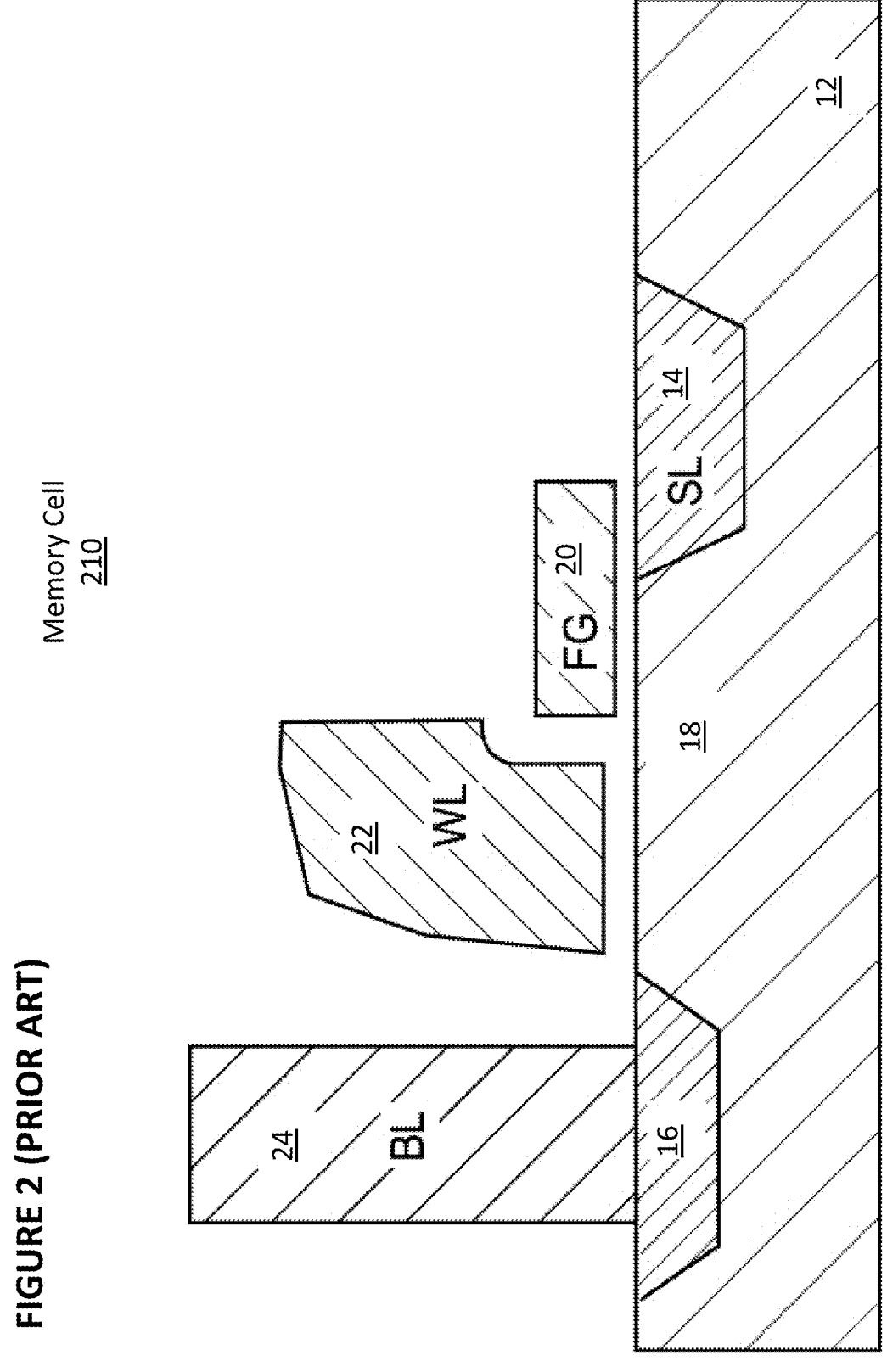
FIG. 2 depicts a prior art split gate flash memory cell.
Figure 3:
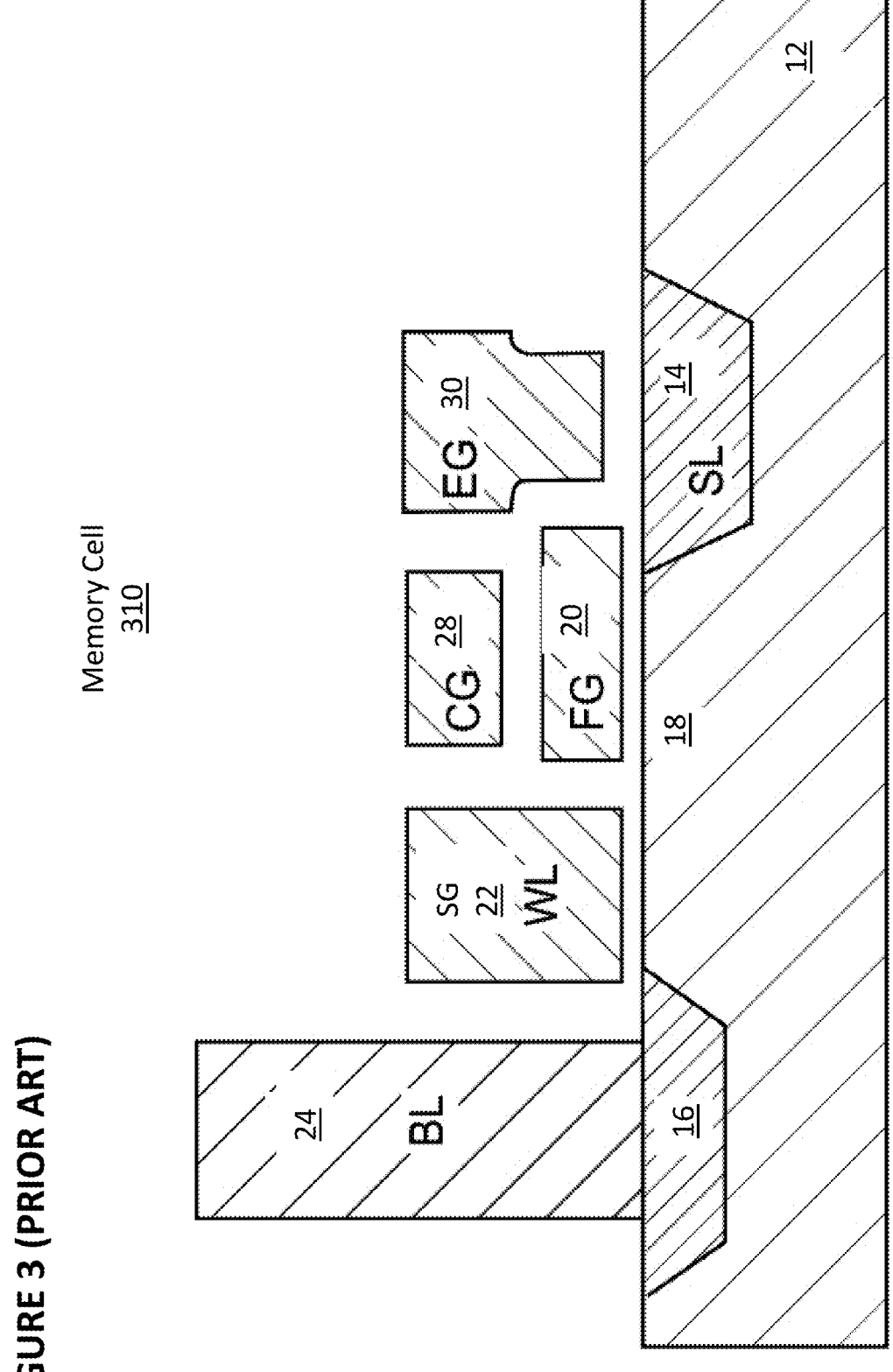
FIG. 3 depicts another prior art split gate flash memory cell.
Figure 4:
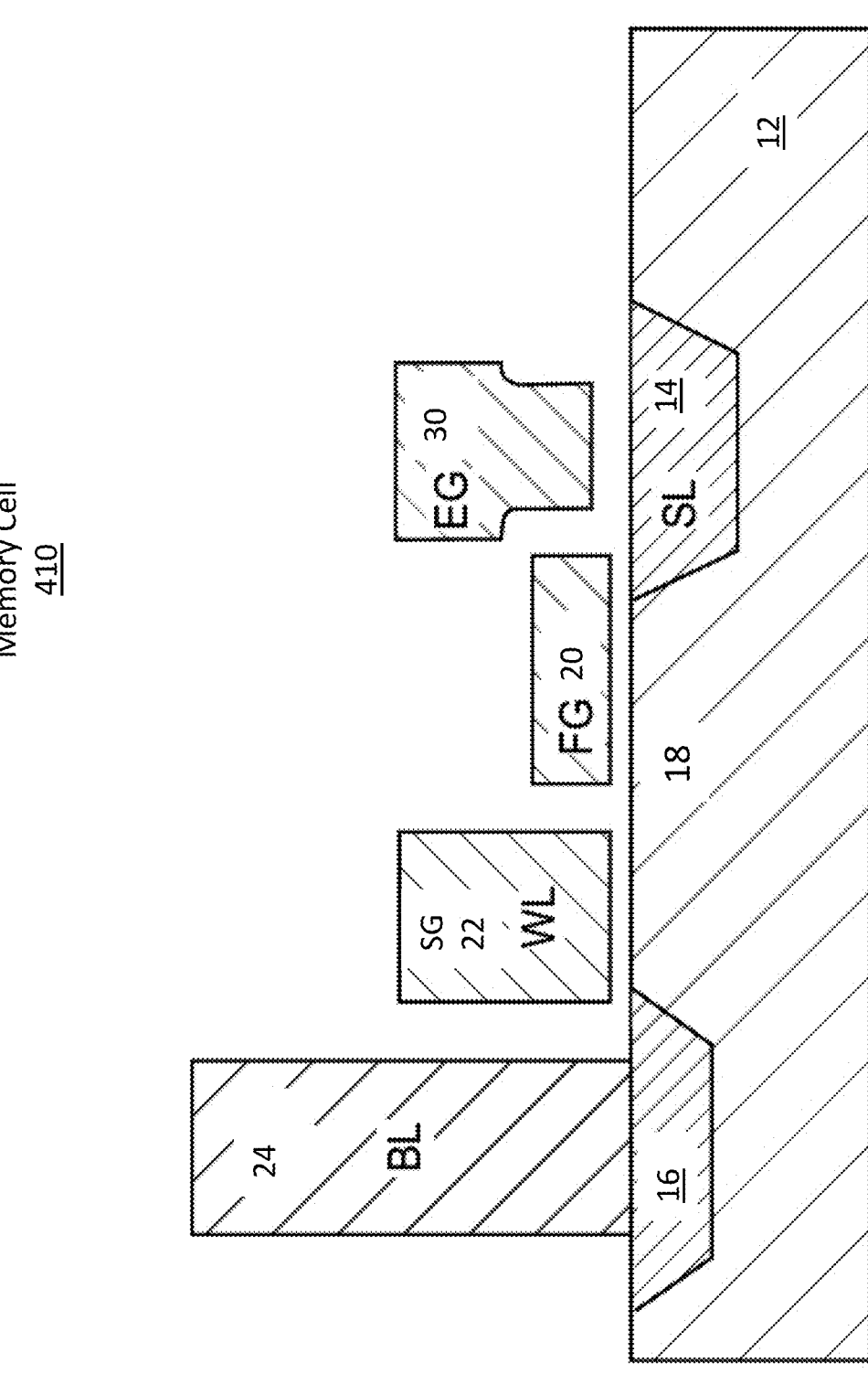
FIG. 4 depicts another prior art split gate flash memory cell.
Figure 5:
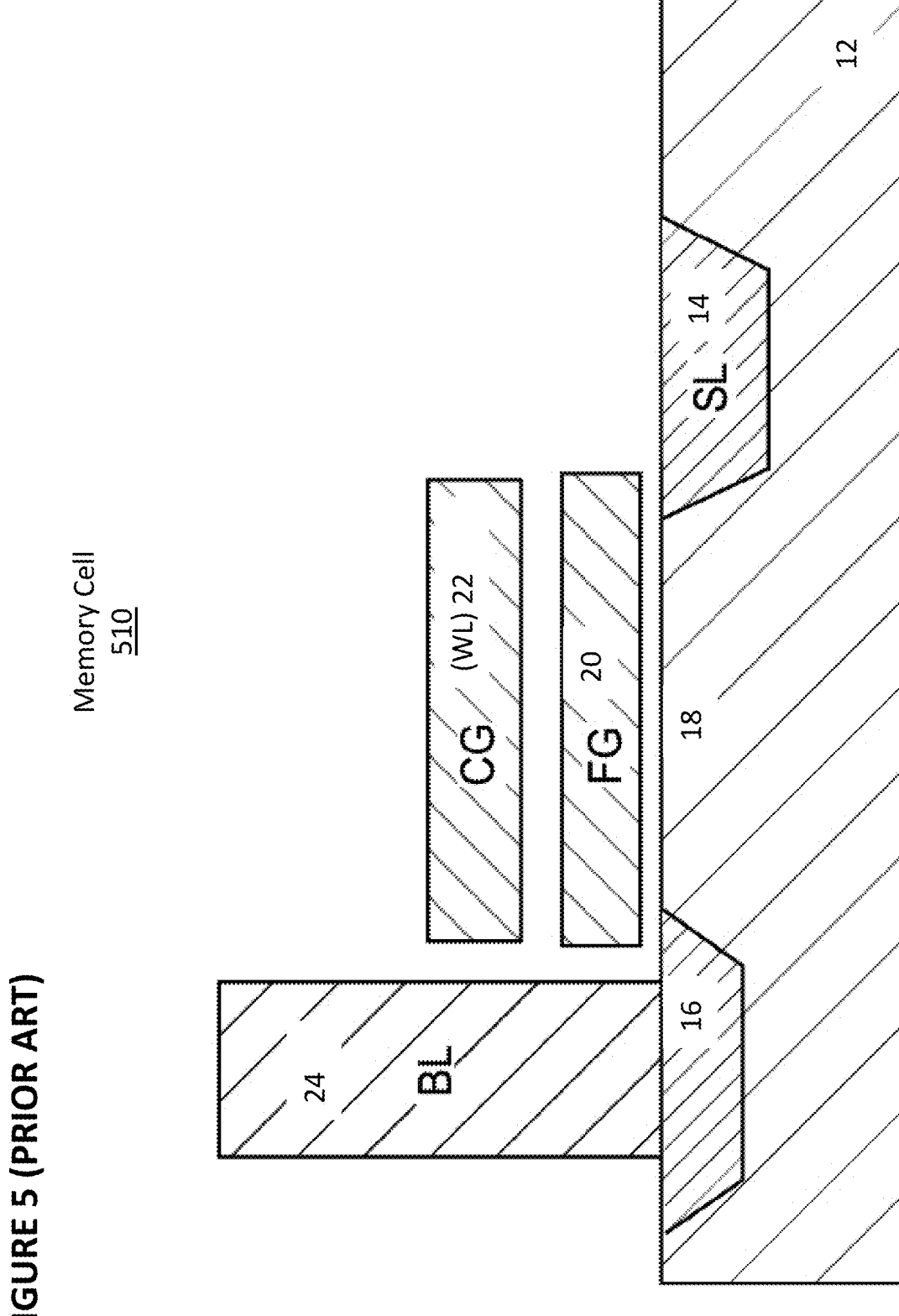
FIG. 5 depicts another prior art split gate flash memory cell.
Figure 6:
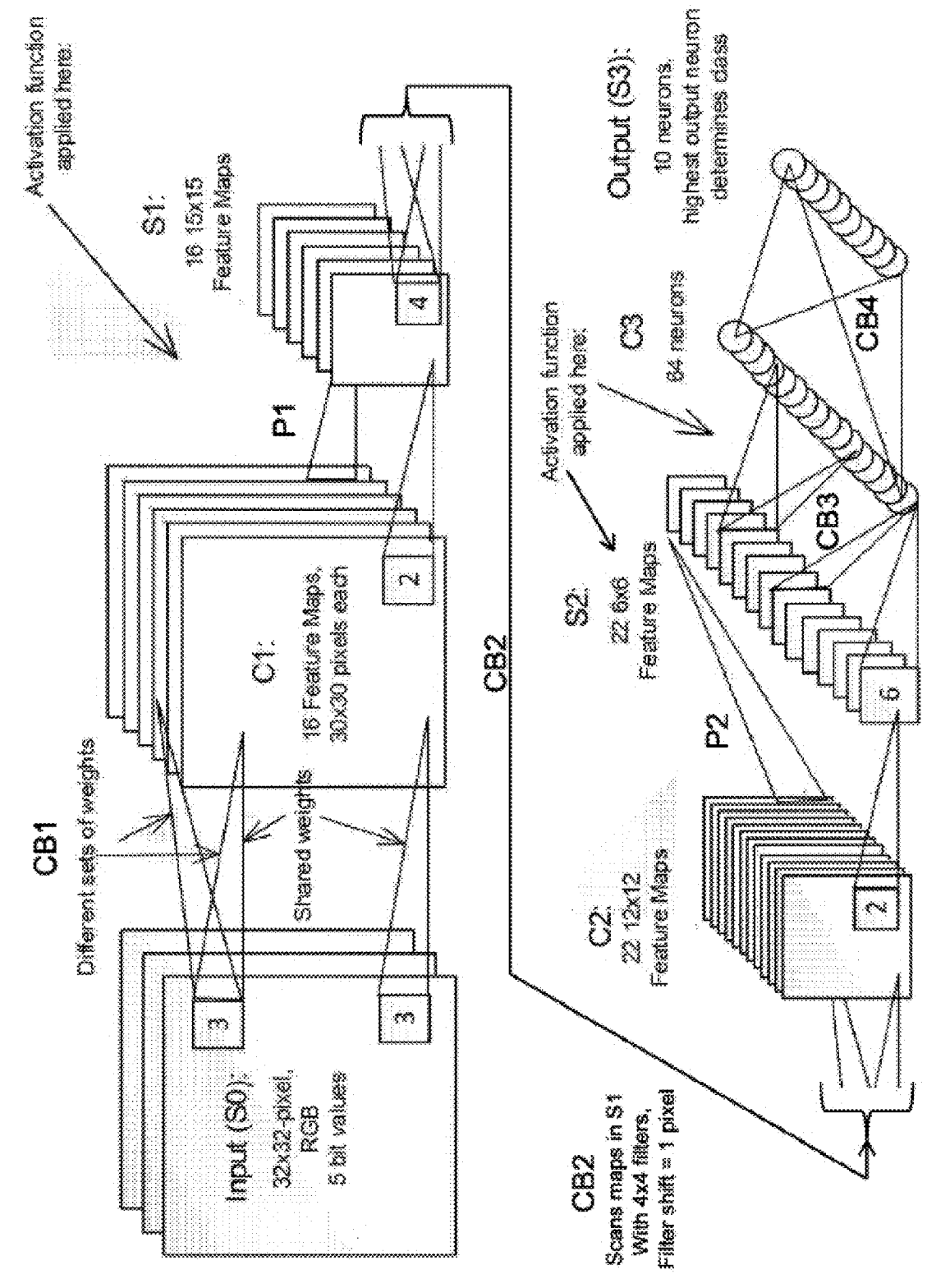
FIG. 6 is a diagram illustrating the different levels of an exemplary artificial neural network utilizing one or more non-volatile memory arrays.
Figure 7:
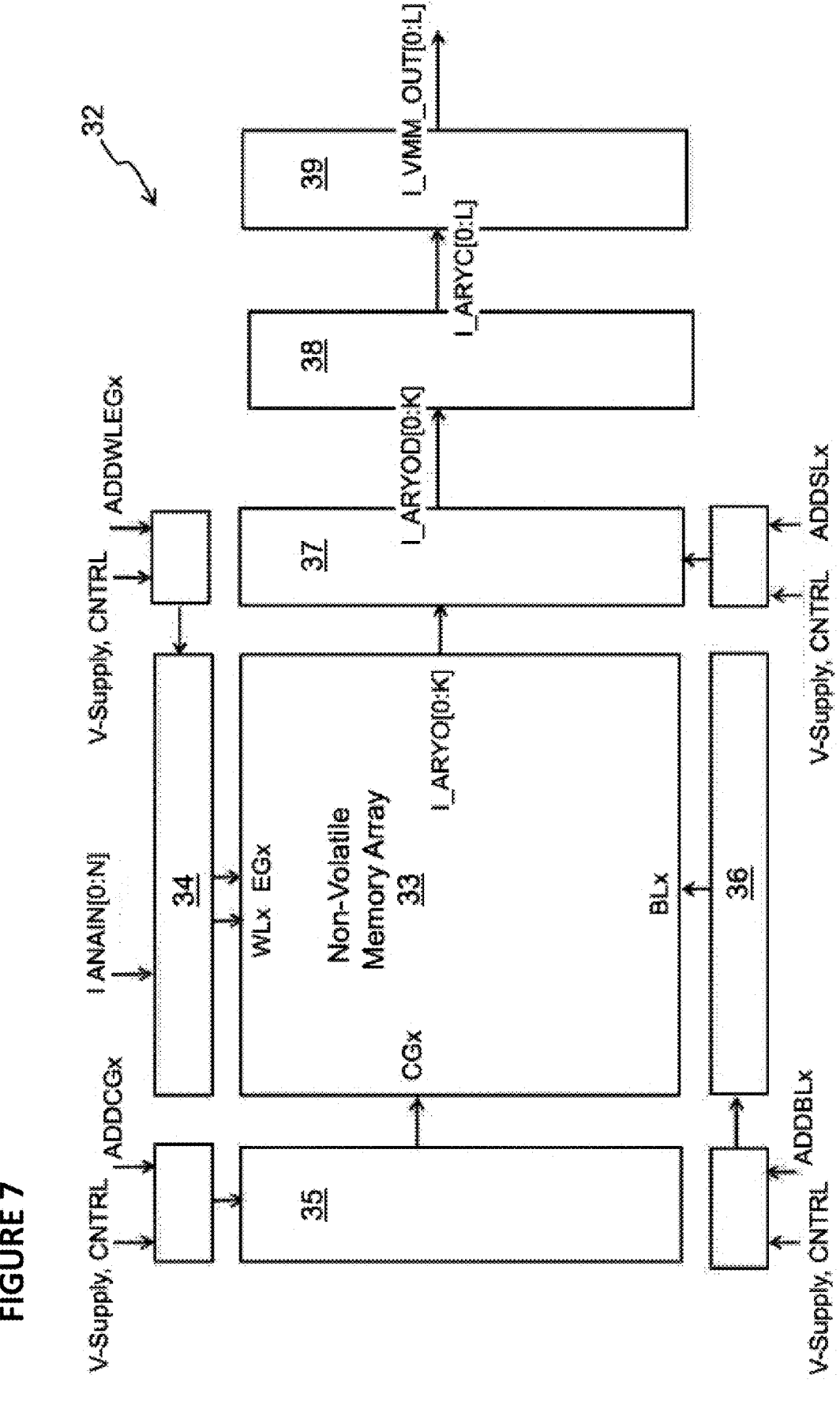
FIG. 7 is a block diagram illustrating a vector-by-matrix multiplication system.
Figure 8:
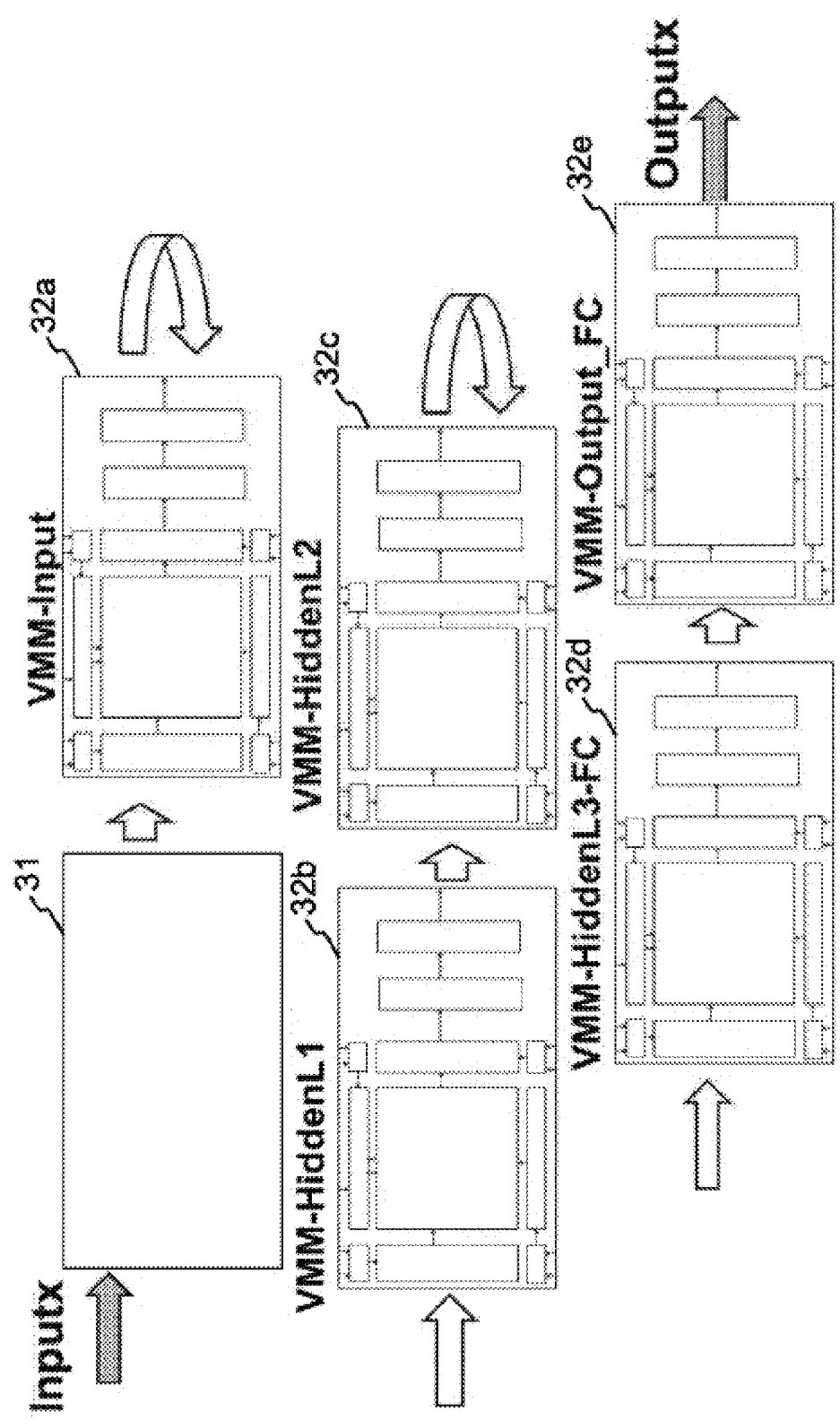
FIG. 8 is a block diagram illustrates an exemplary artificial neural network utilizing one or more vector-by-matrix multiplication systems.
Figure 9:
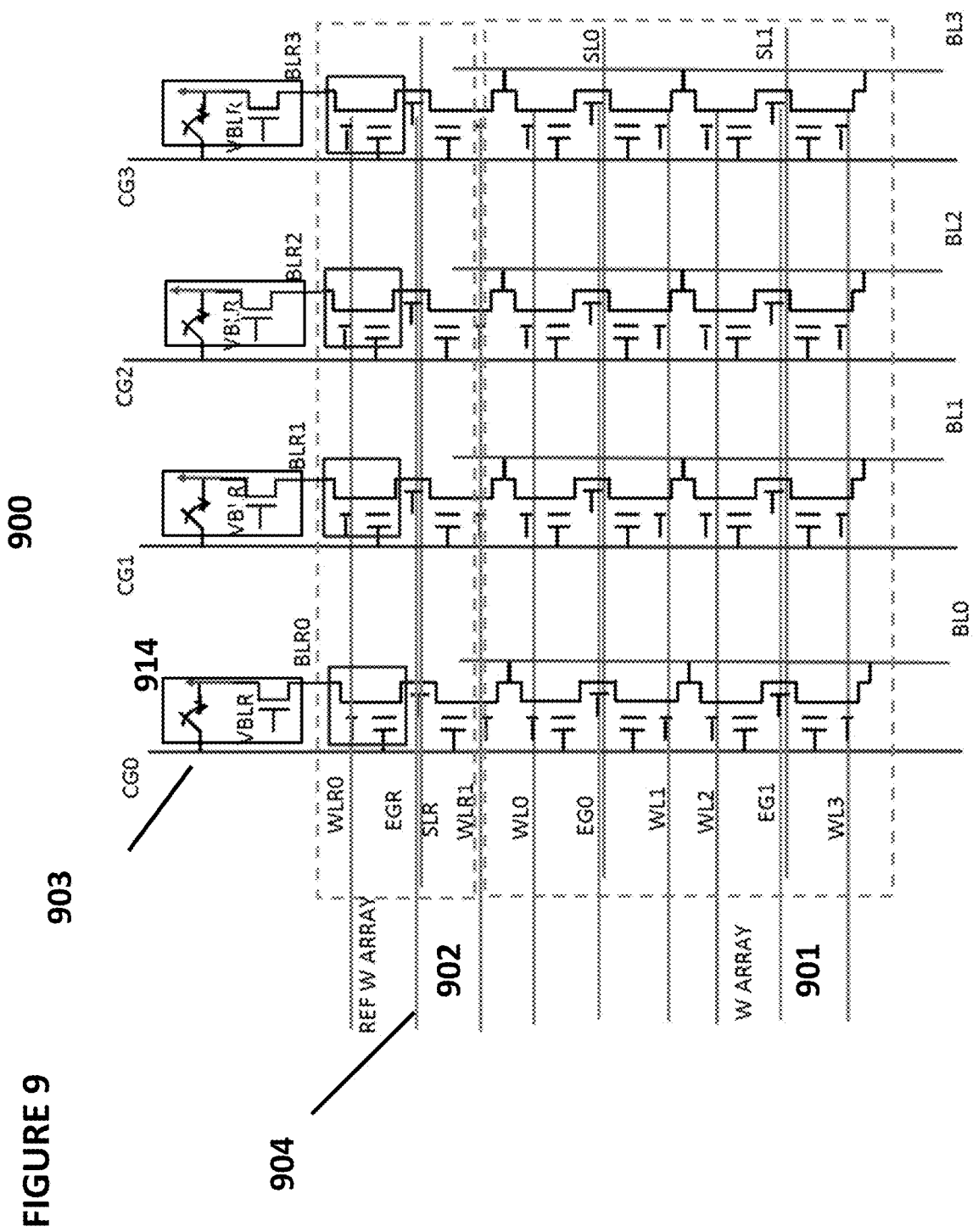
FIG. 9 depicts another embodiment of a vector-by-matrix multiplication system.
Figure 10:
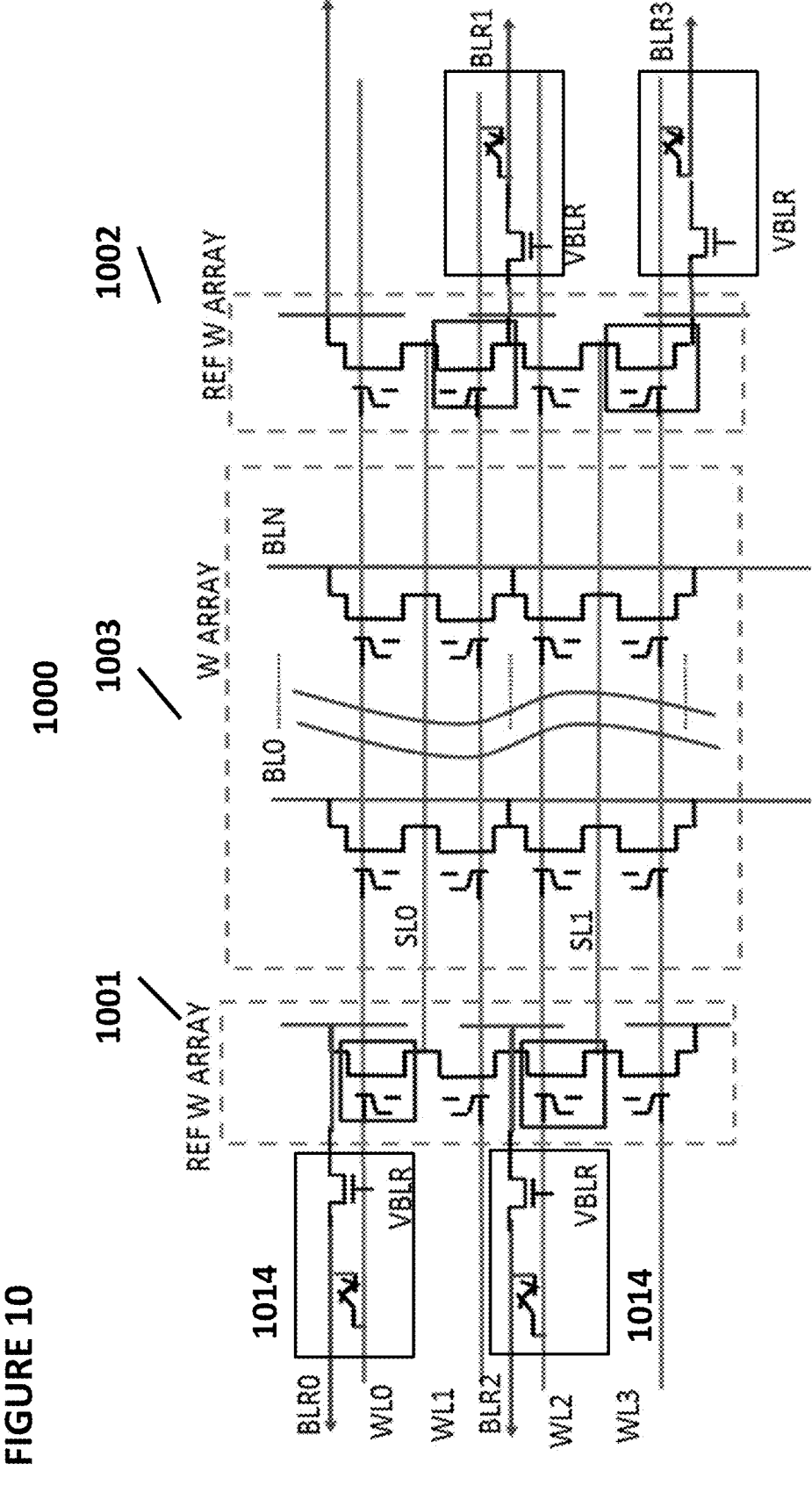
FIG. 10 depicts another embodiment of a vector-by-matrix multiplication system.
Figure 11:
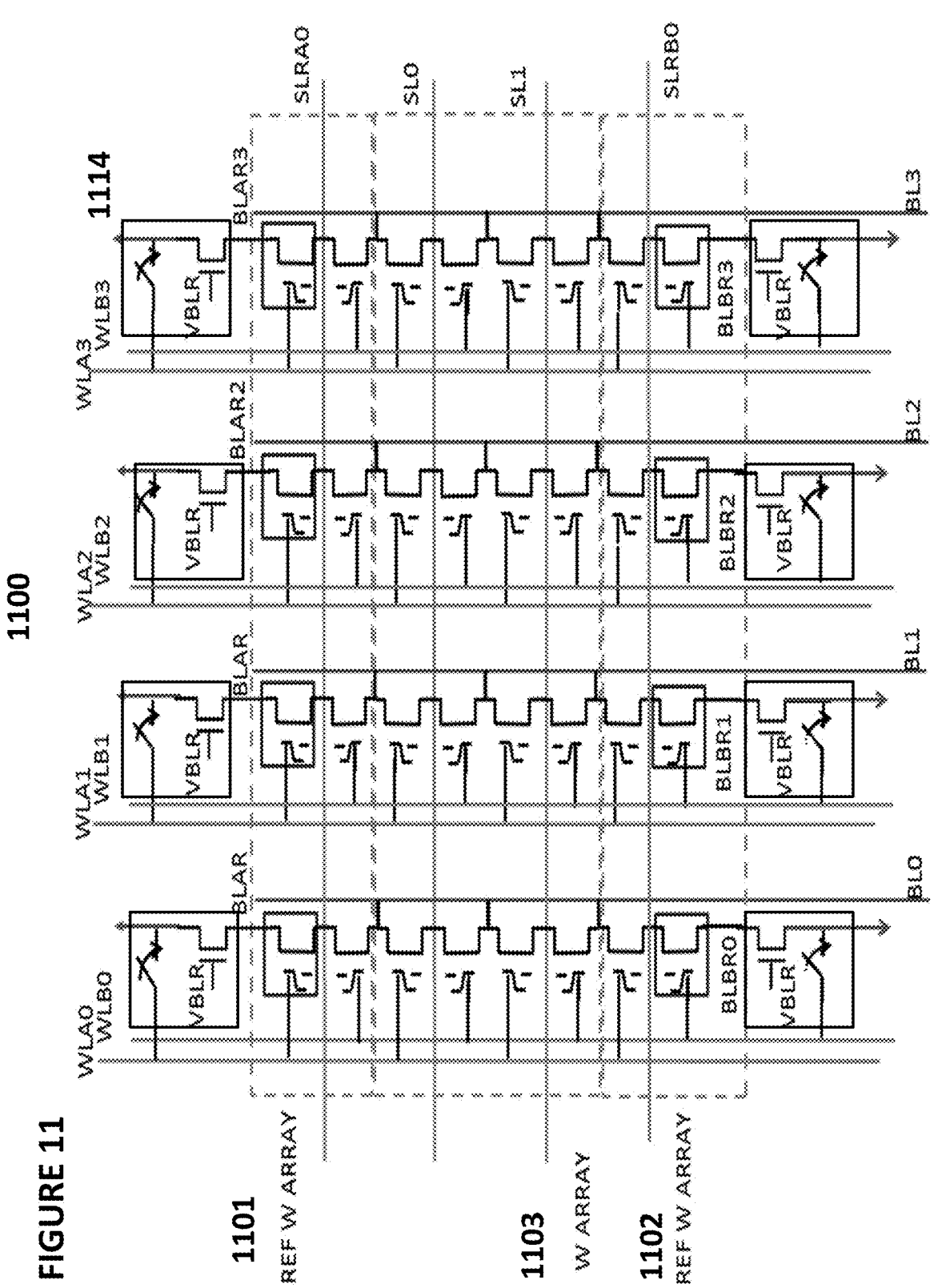
FIG. 11 depicts another embodiment of a vector-by-matrix multiplication system.
Figure 12:
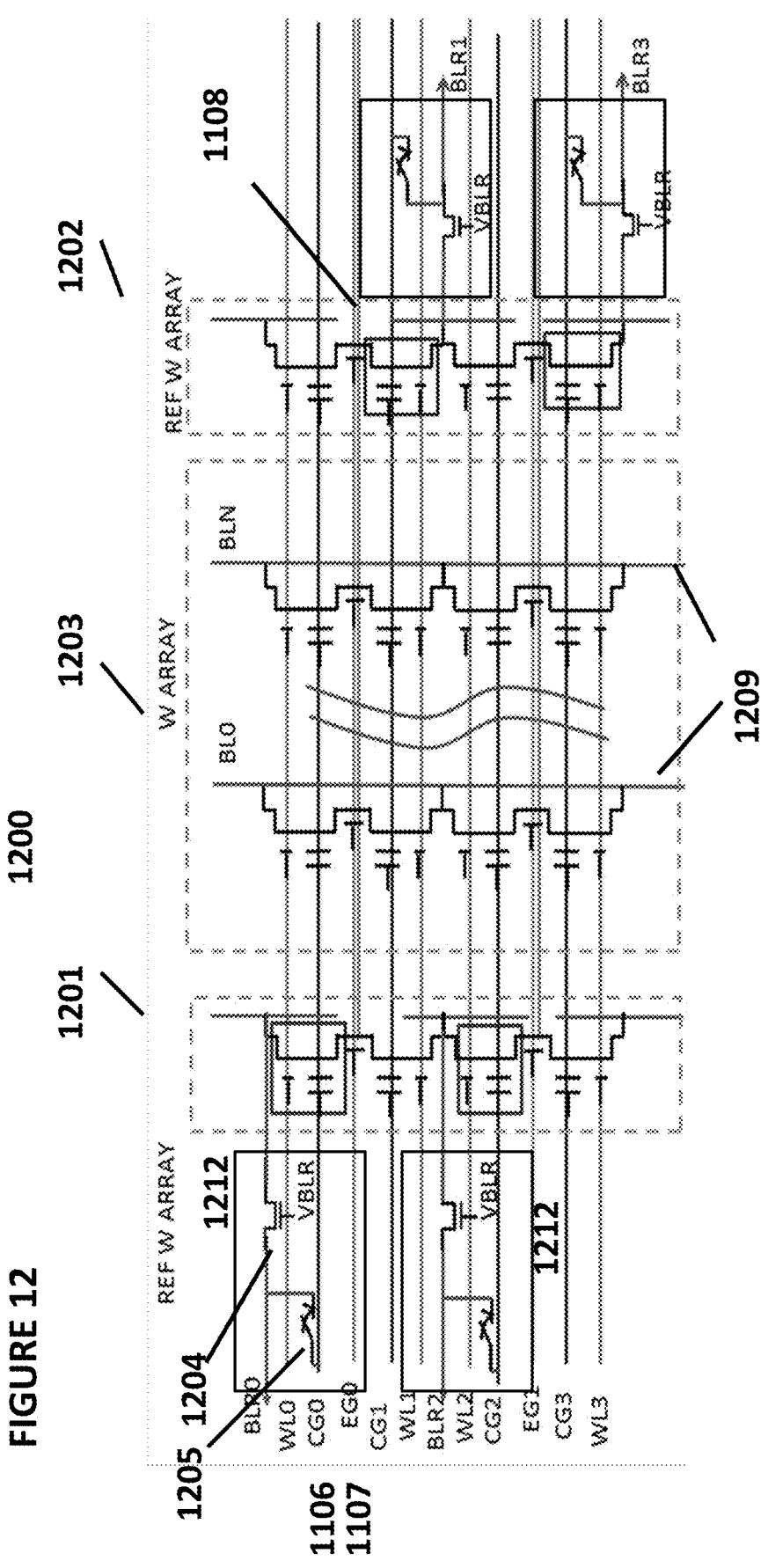
FIG. 12 depicts another embodiment of a vector-by-matrix multiplication system.
Figure 13:
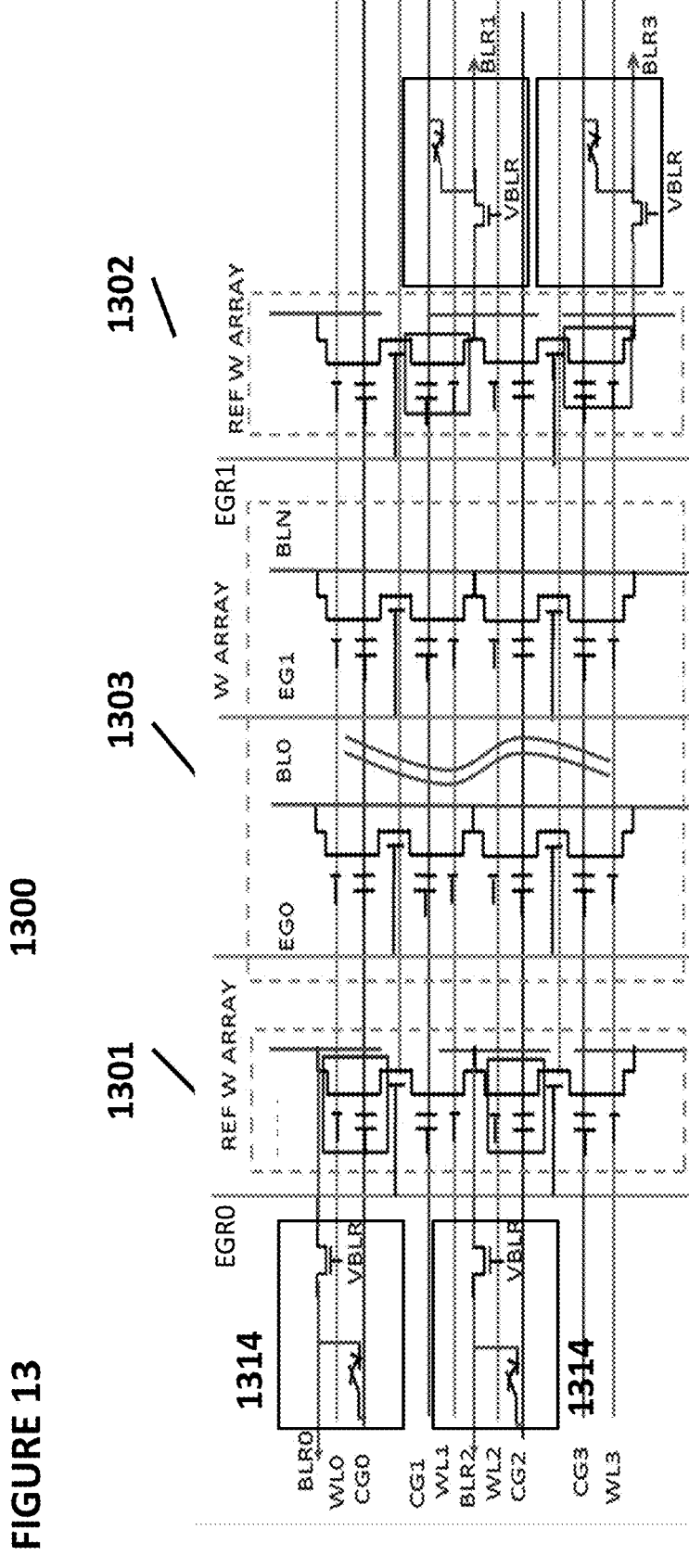
FIG. 13 depicts another embodiment of a vector-by-matrix multiplication system.
Figure 14:
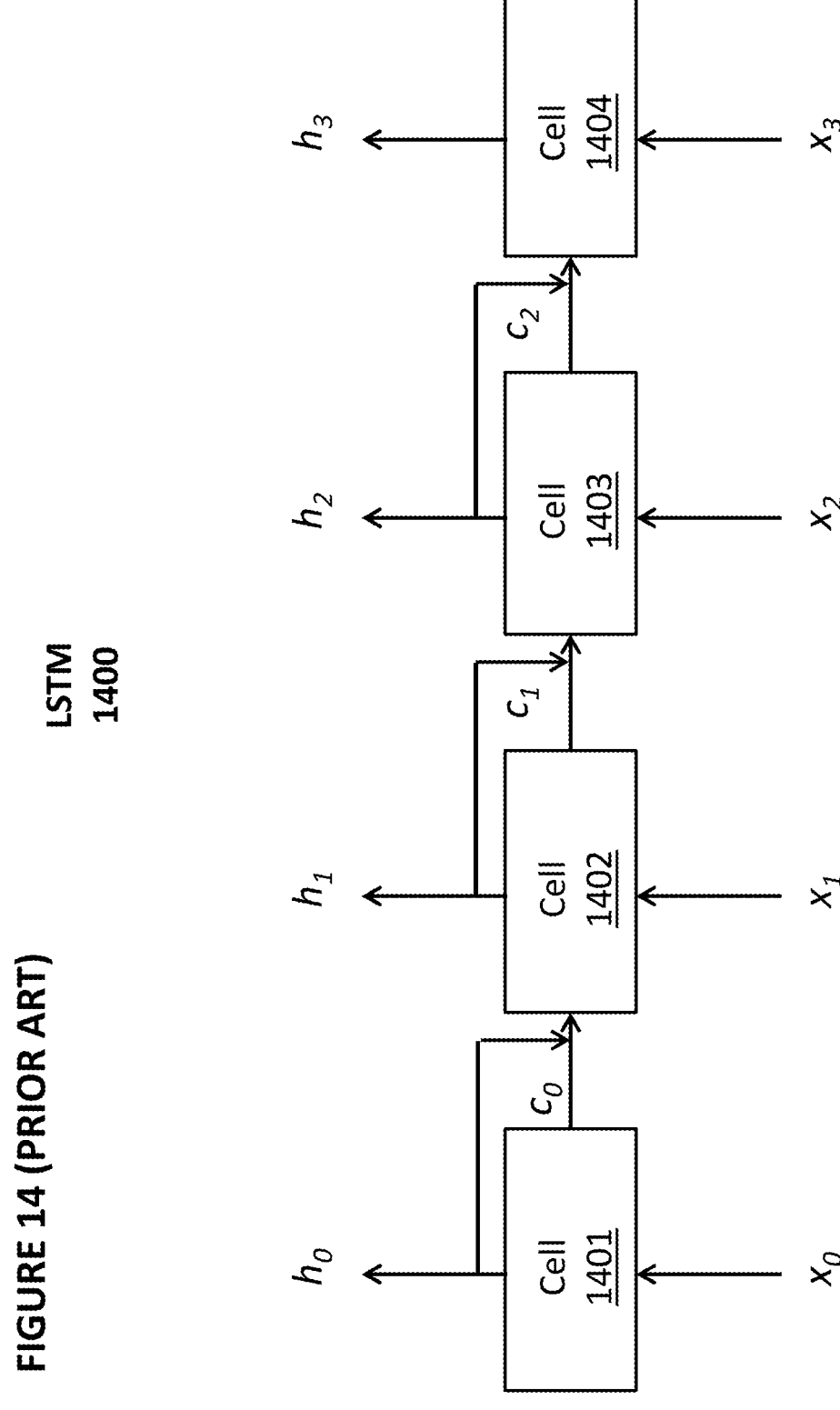
FIG. 14 depicts a prior art long short-term memory system.
Figure 15:
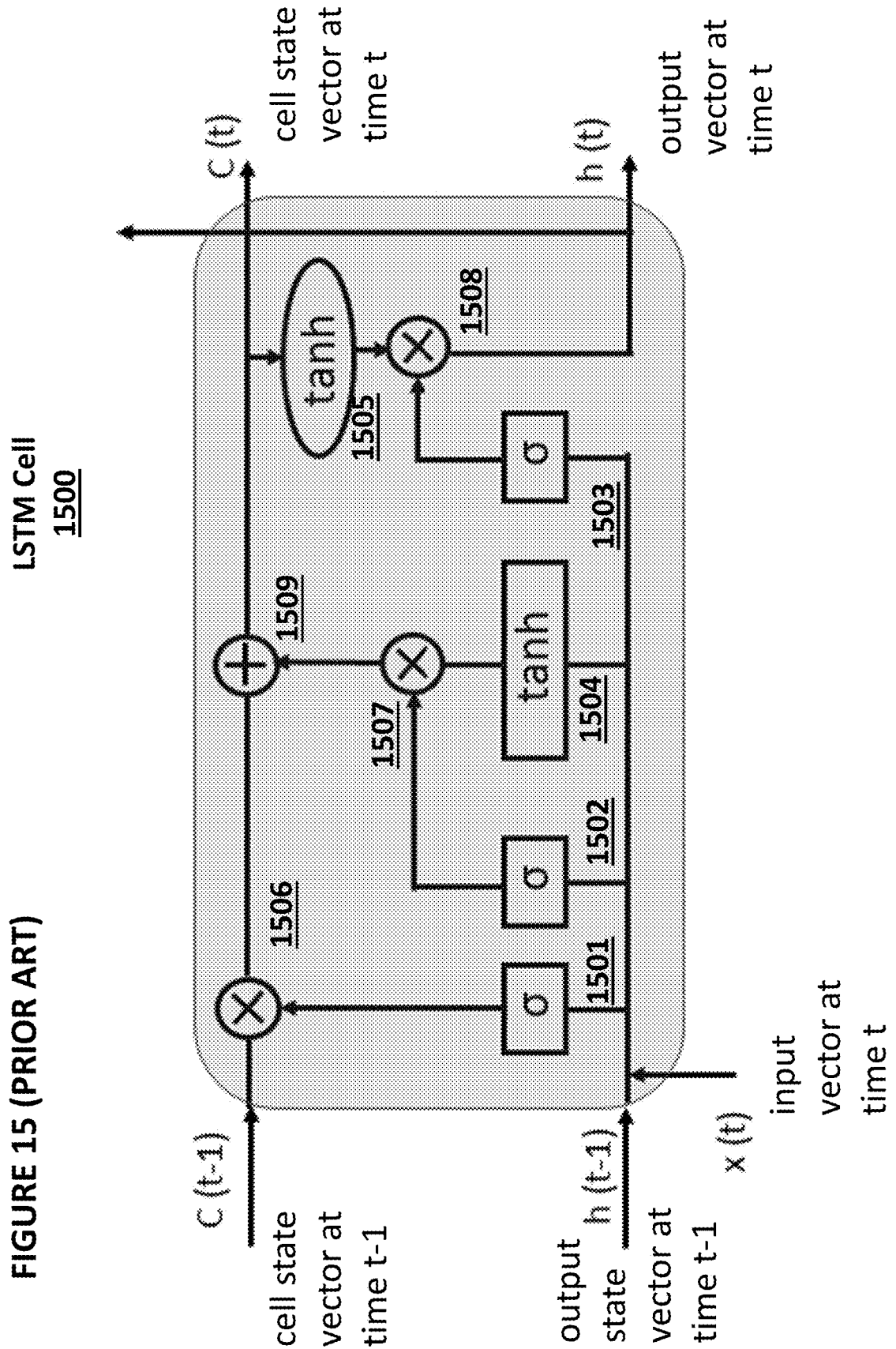
FIG. 15 depicts an exemplary cell for use in a long short-term memory system.
Figure 16:
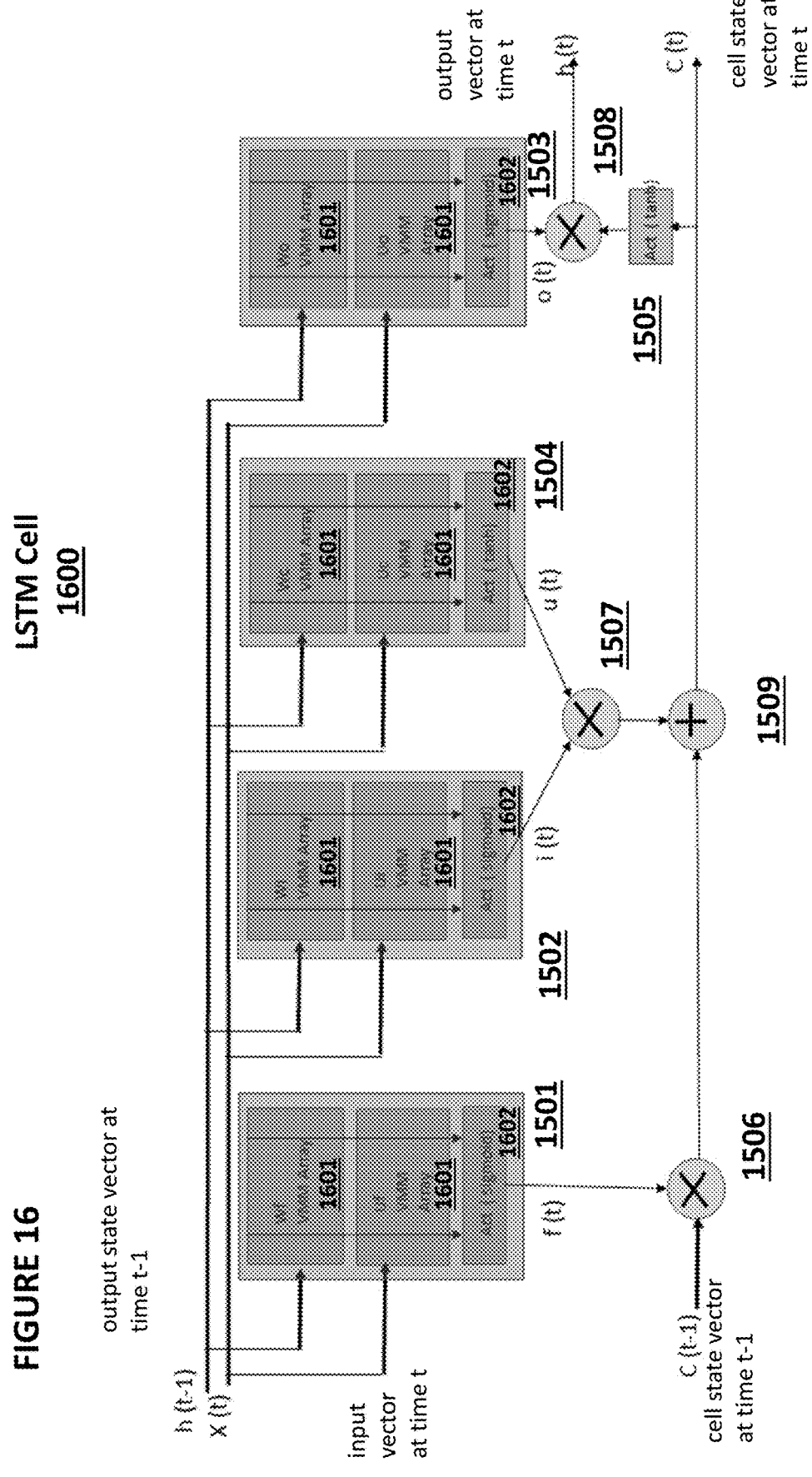
FIG. 16 depicts an embodiment of the exemplary cell of FIG. 15.
Figure 17:
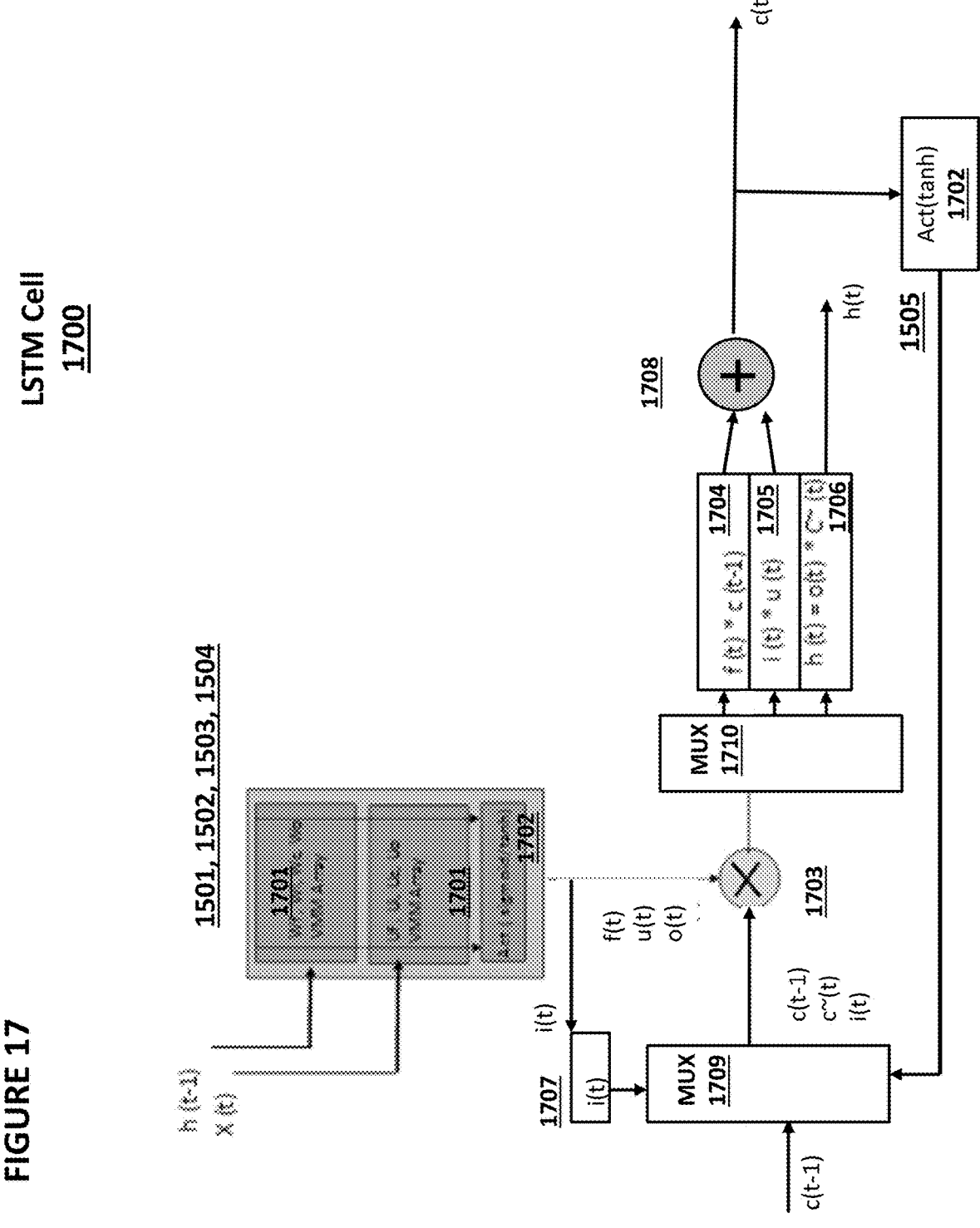
FIG. 17 depicts another embodiment of the exemplary cell of FIG. 15.
Figure 18:
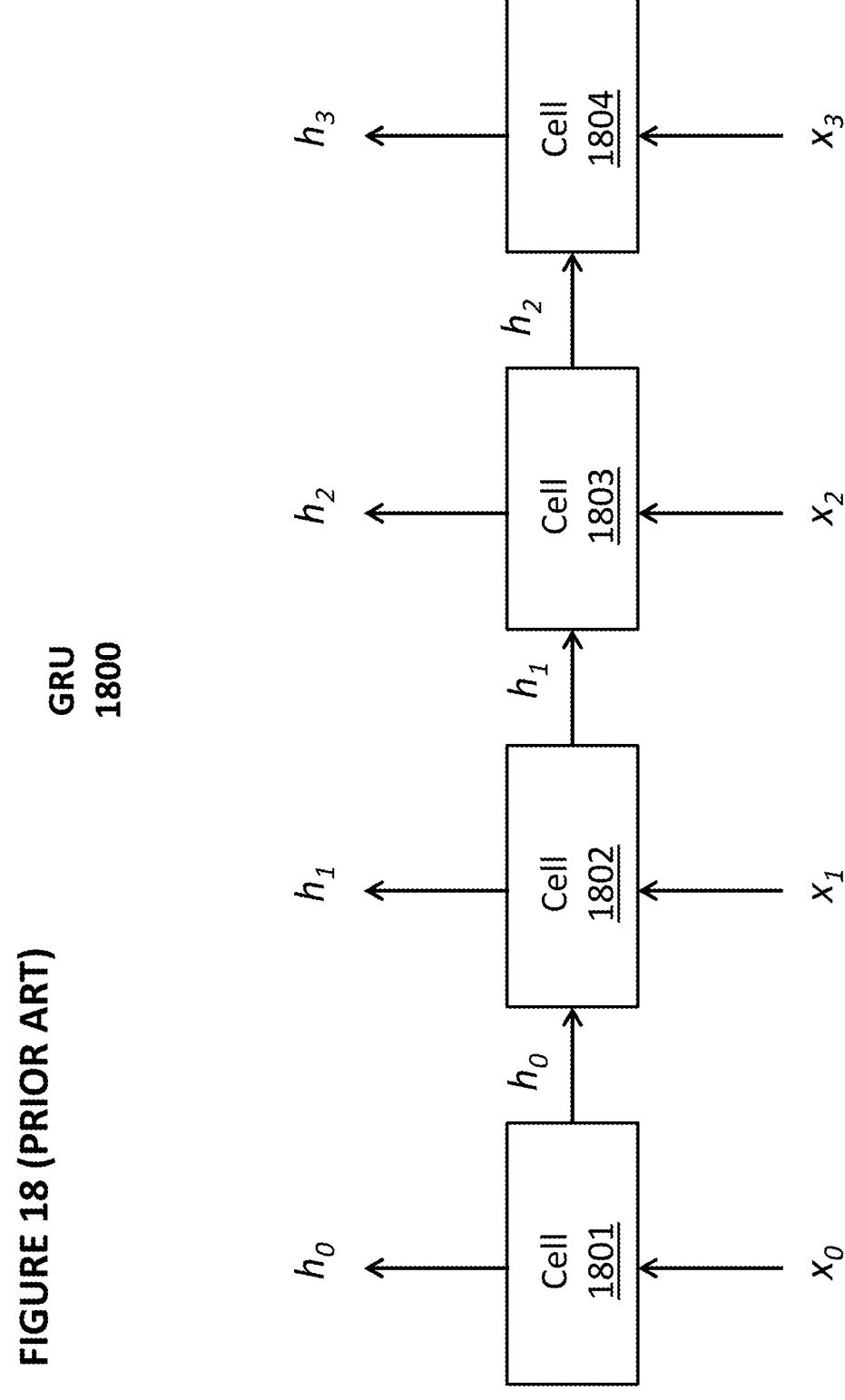
FIG. 18 depicts a prior art gated recurrent unit system.
Figure 19:
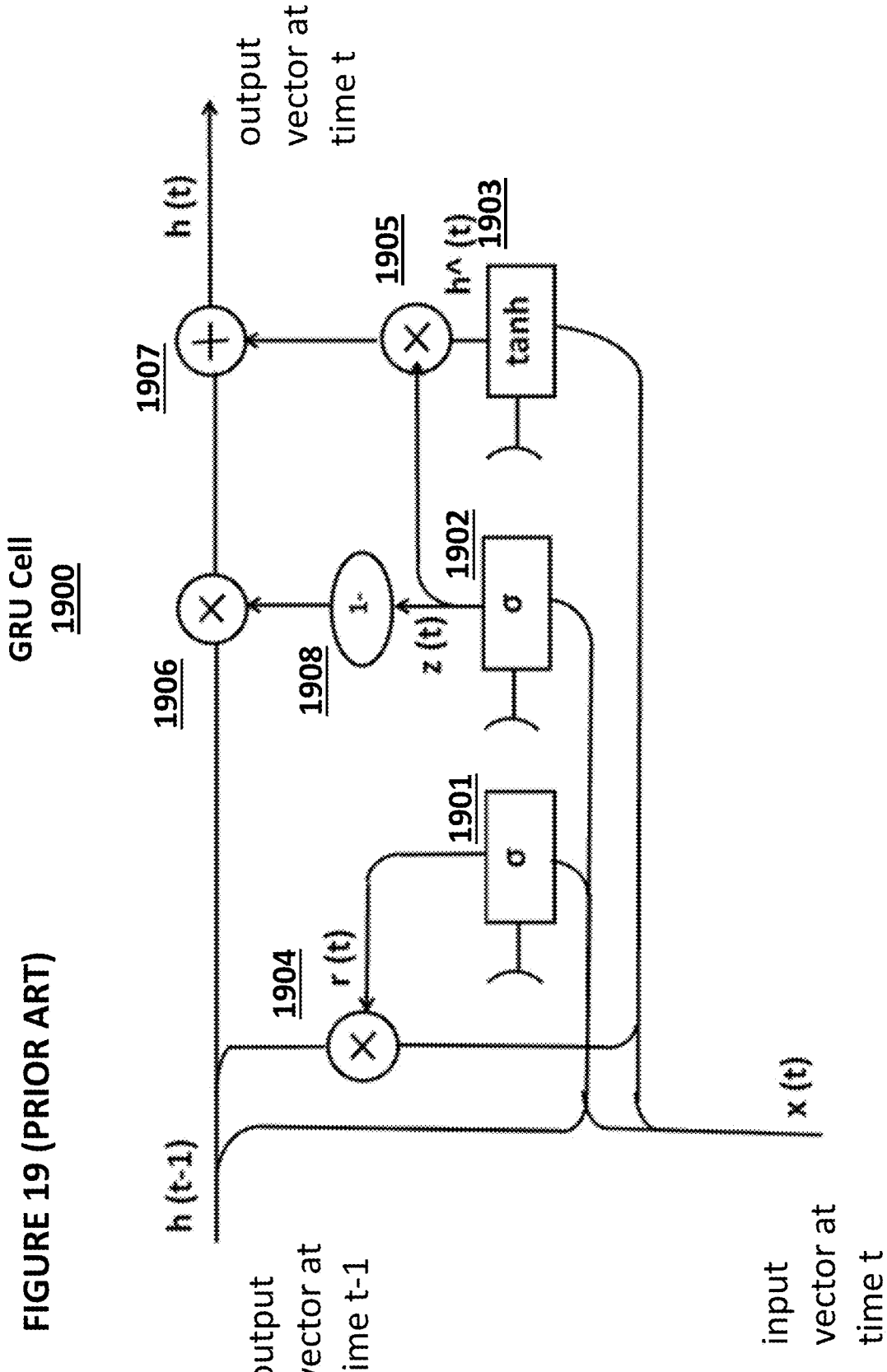
FIG. 19 depicts an exemplary cell for use in a gated recurrent unit system.
Figure 20:
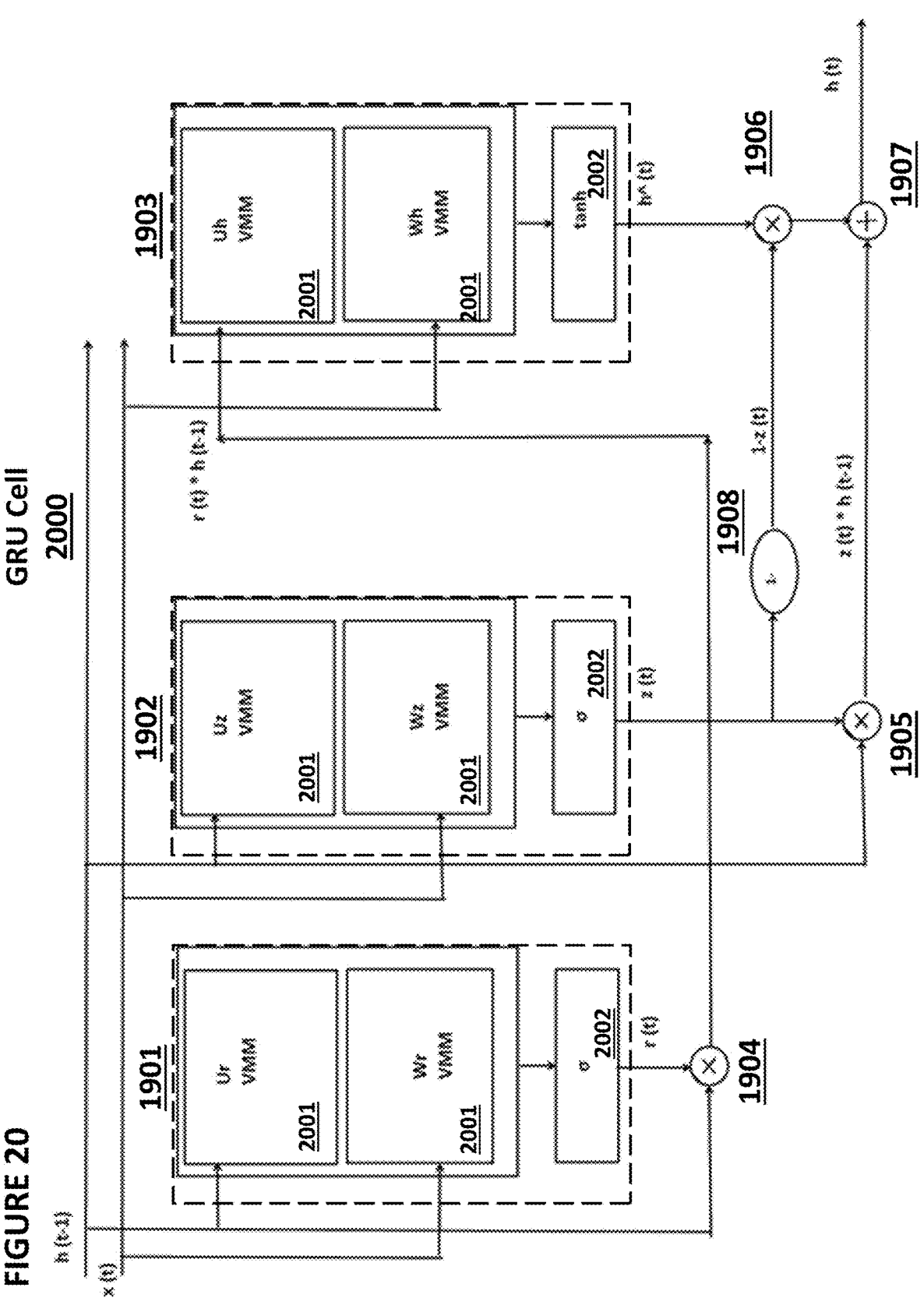
FIG. 20 depicts an embodiment of the exemplary cell of FIG. 19.
Figure 21:
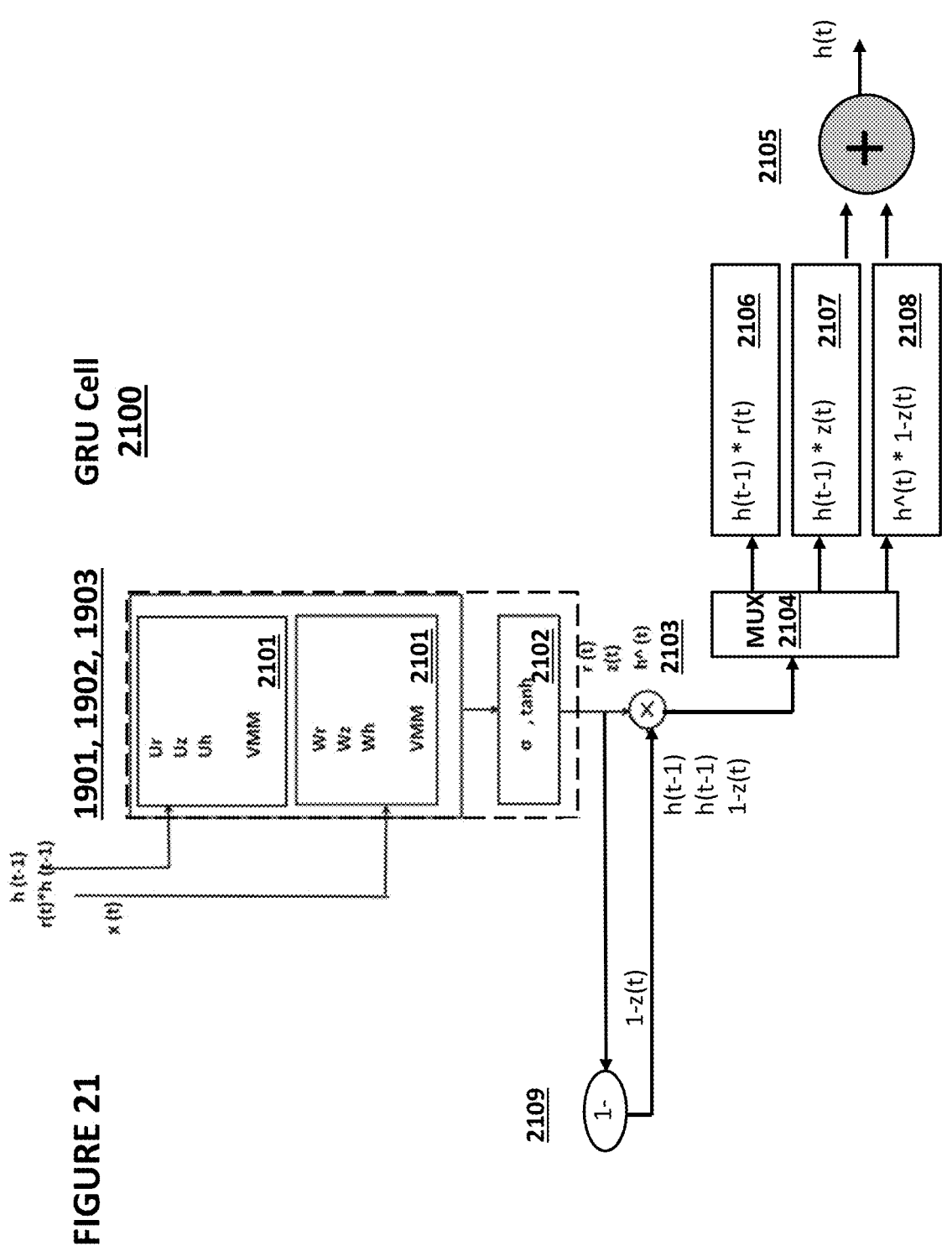
FIG. 21 depicts another embodiment of the exemplary cell of FIG. 19.
Figure 22:
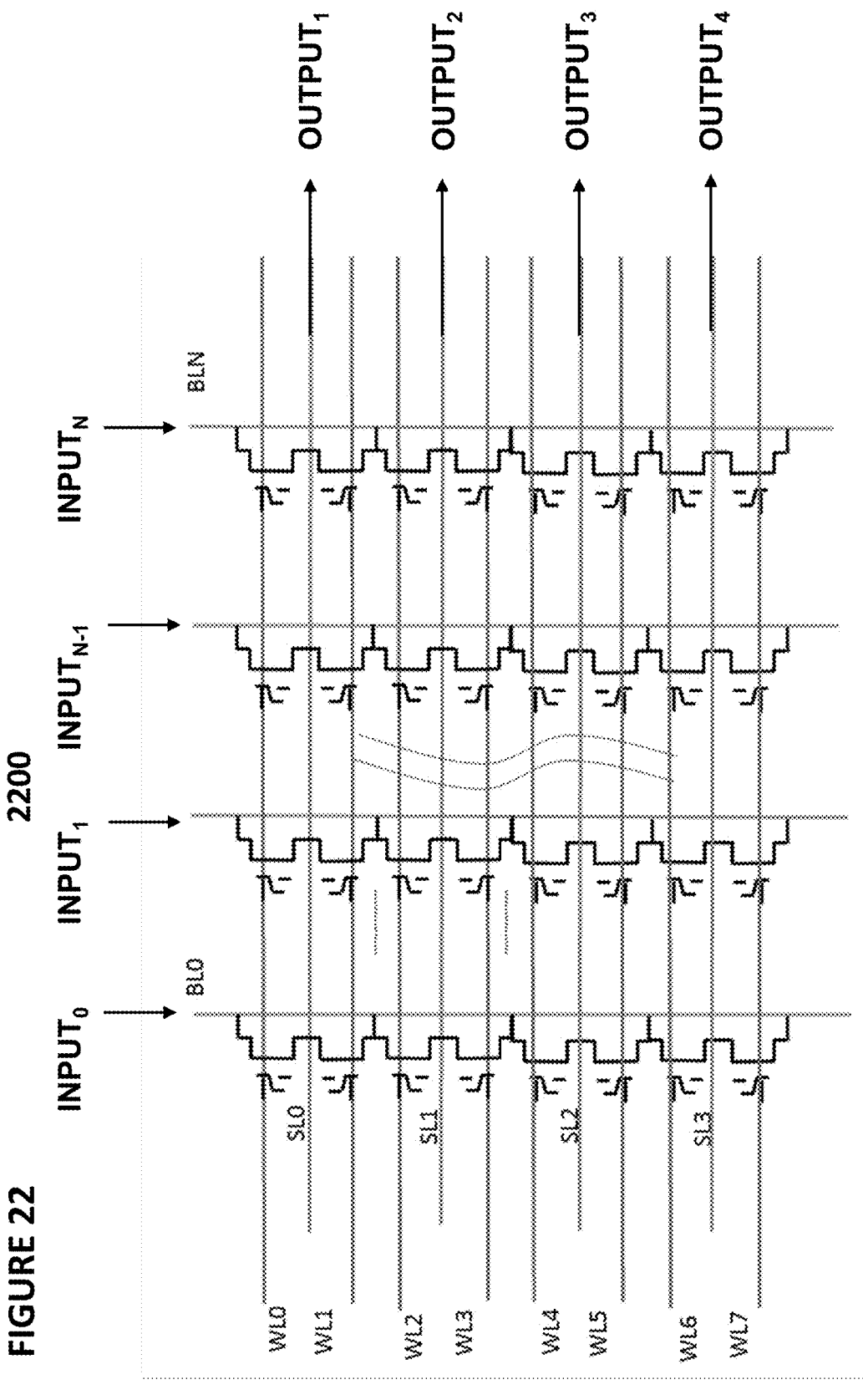
FIG. 22 depicts another embodiment of a vector-by-matrix multiplication system.
Figure 23:
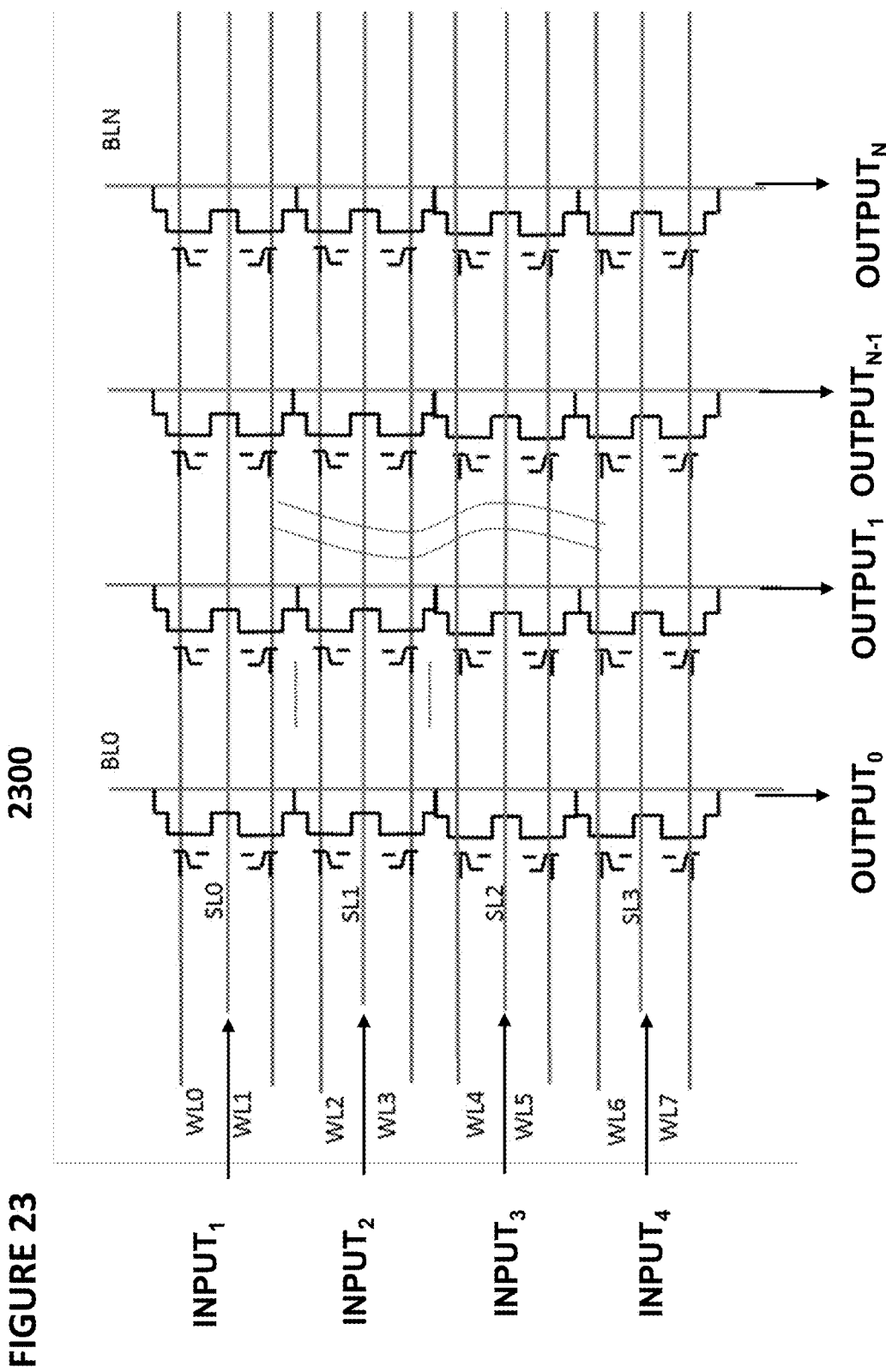
FIG. 23 depicts another embodiment of a vector-by-matrix multiplication system.
Figure 24:
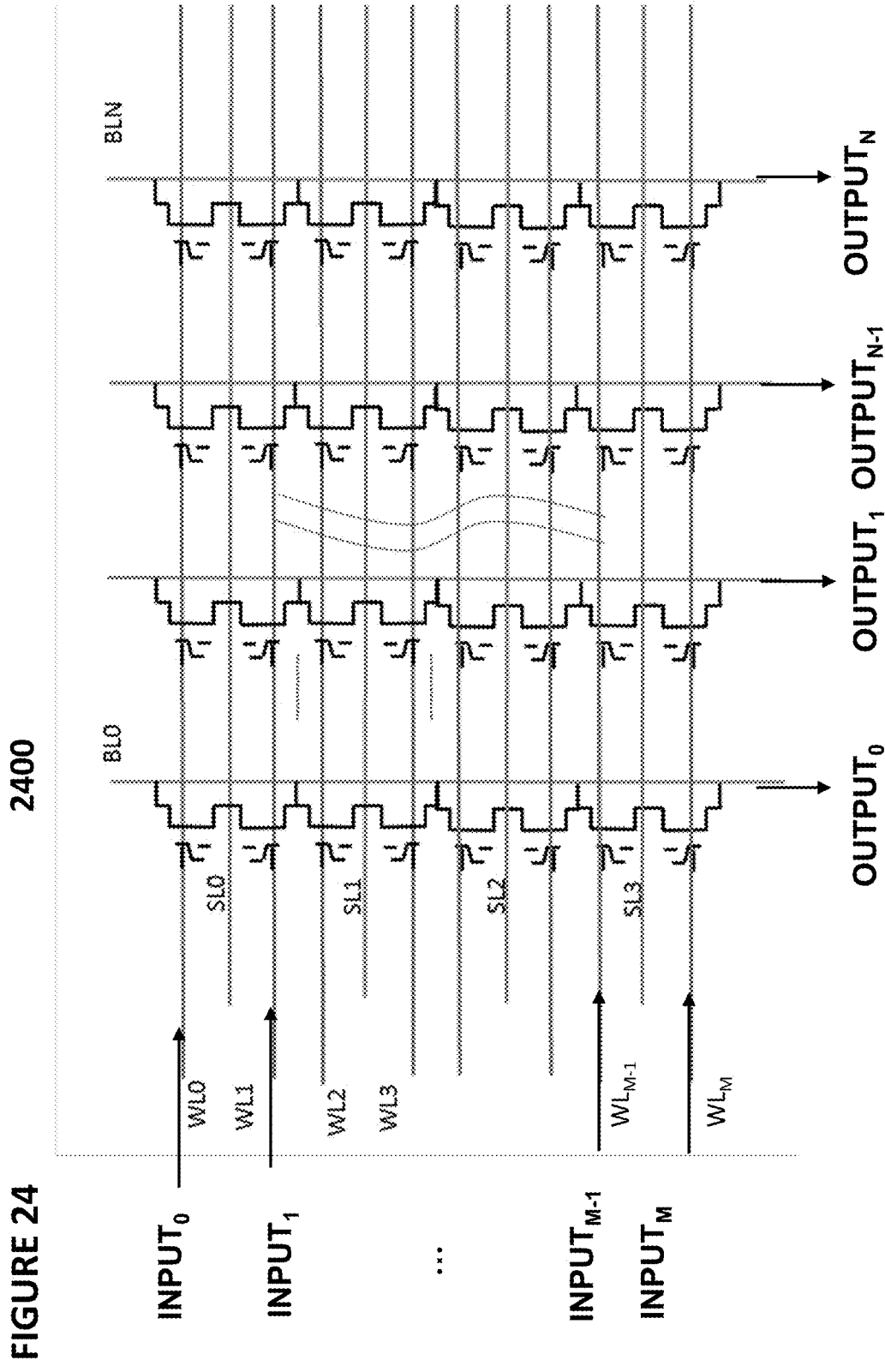
FIG. 24 depicts another embodiment of a vector-by-matrix multiplication system.
Figure 25:
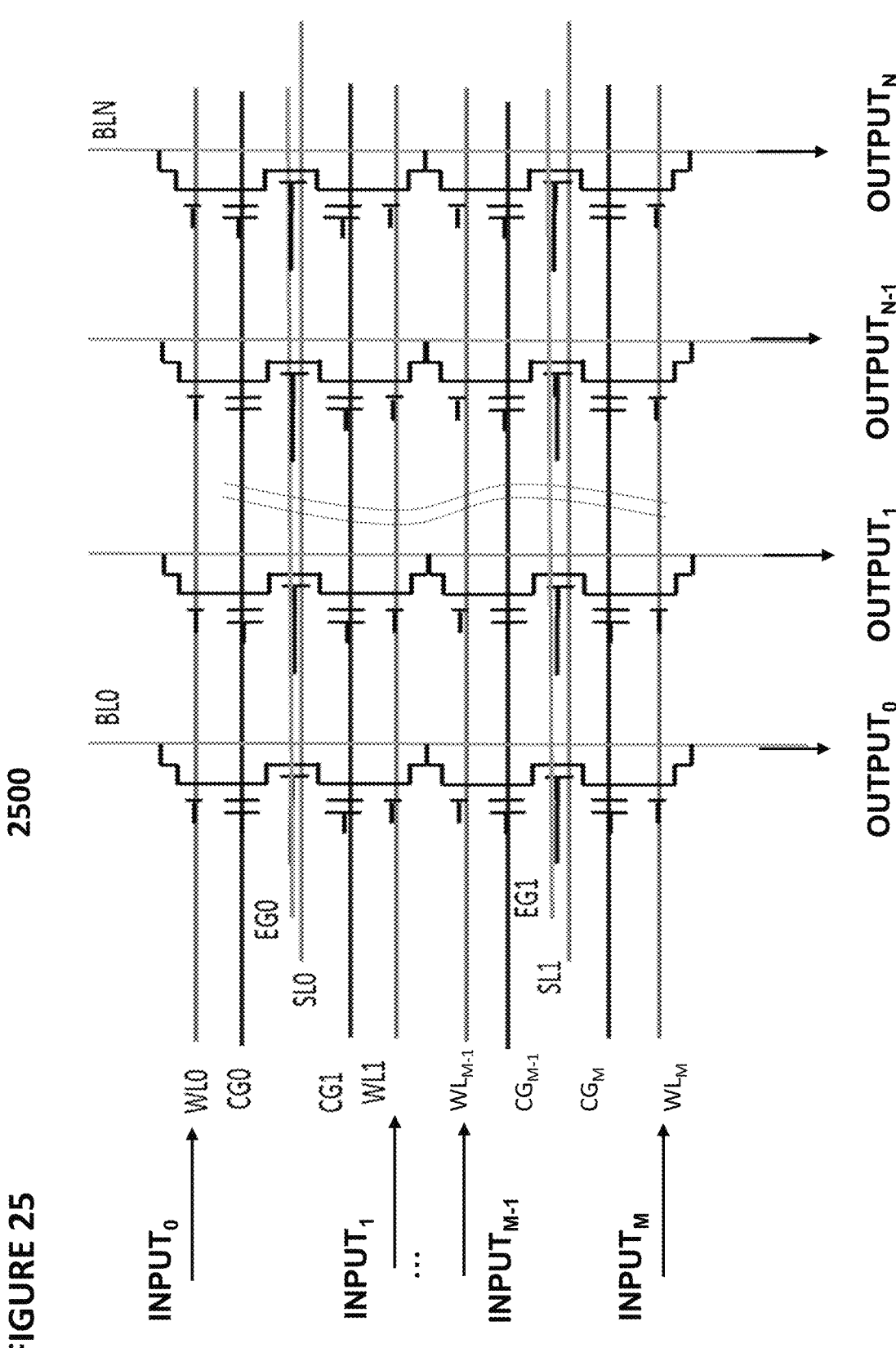
FIG. 25 depicts another embodiment of a vector-by-matrix multiplication system.
Figure 26:
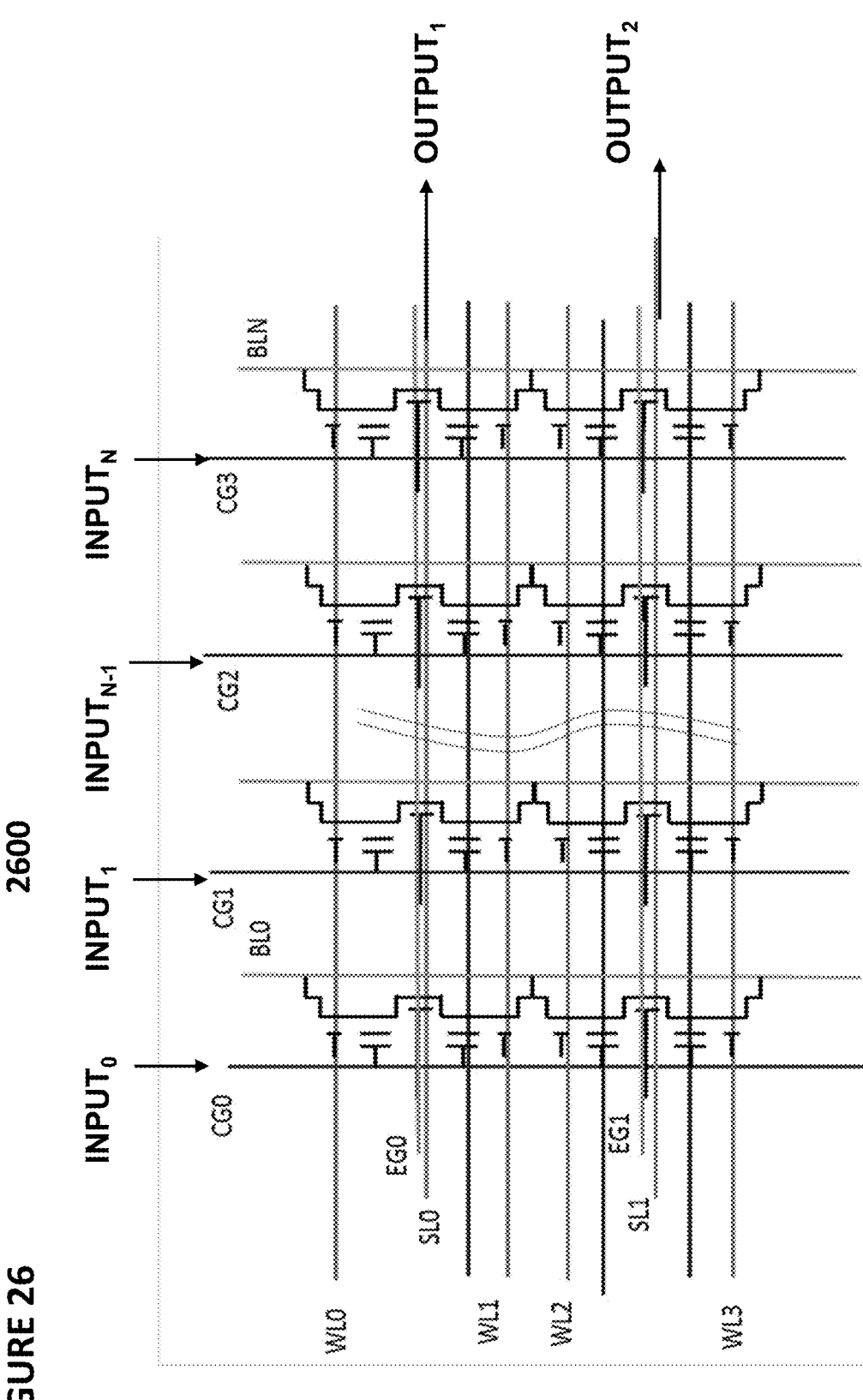
FIG. 26 depicts another embodiment of a vector-by-matrix multiplication system.
Figure 27:
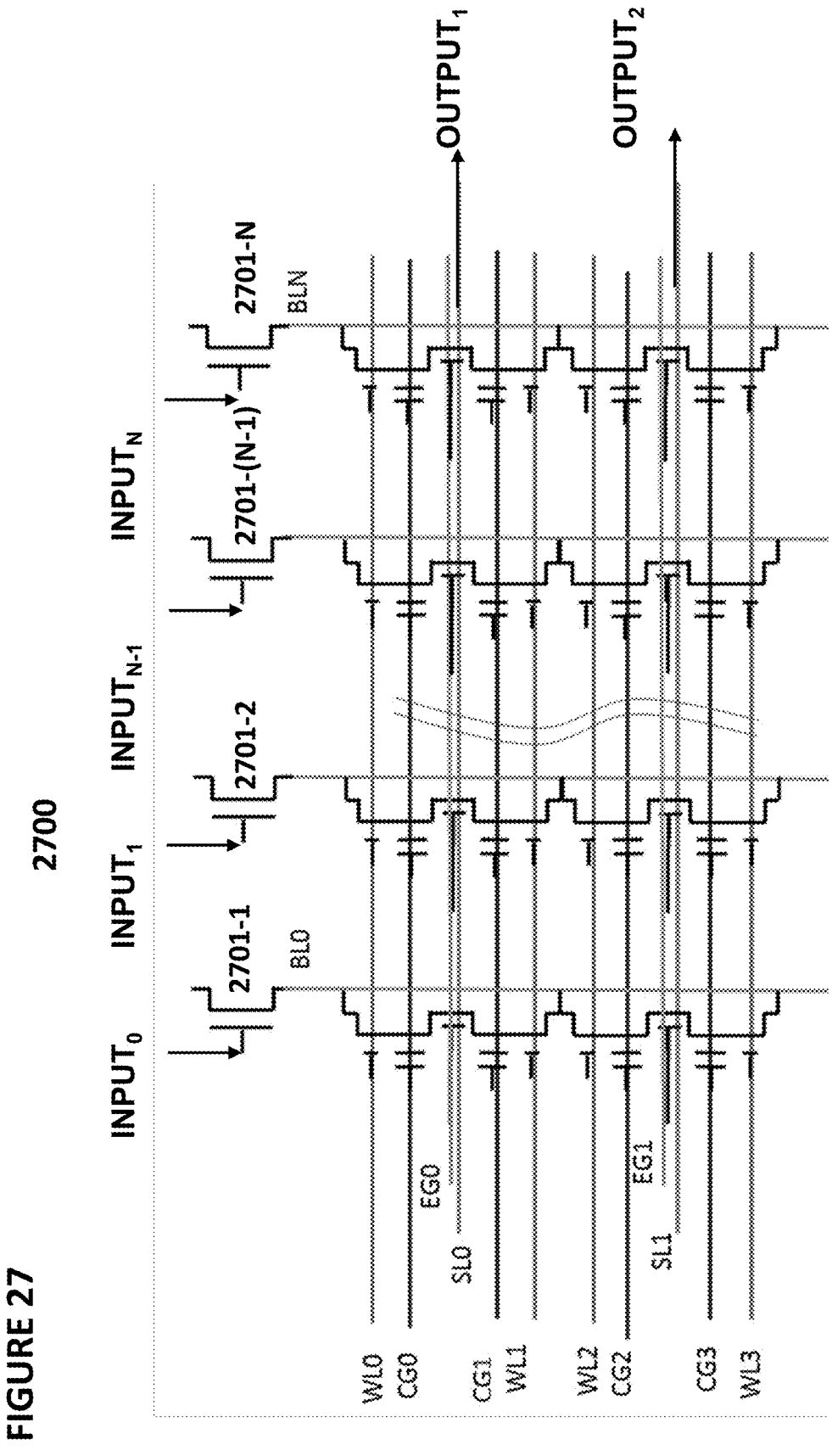
FIG. 27 depicts another embodiment of a vector-by-matrix multiplication system.
Figure 28:
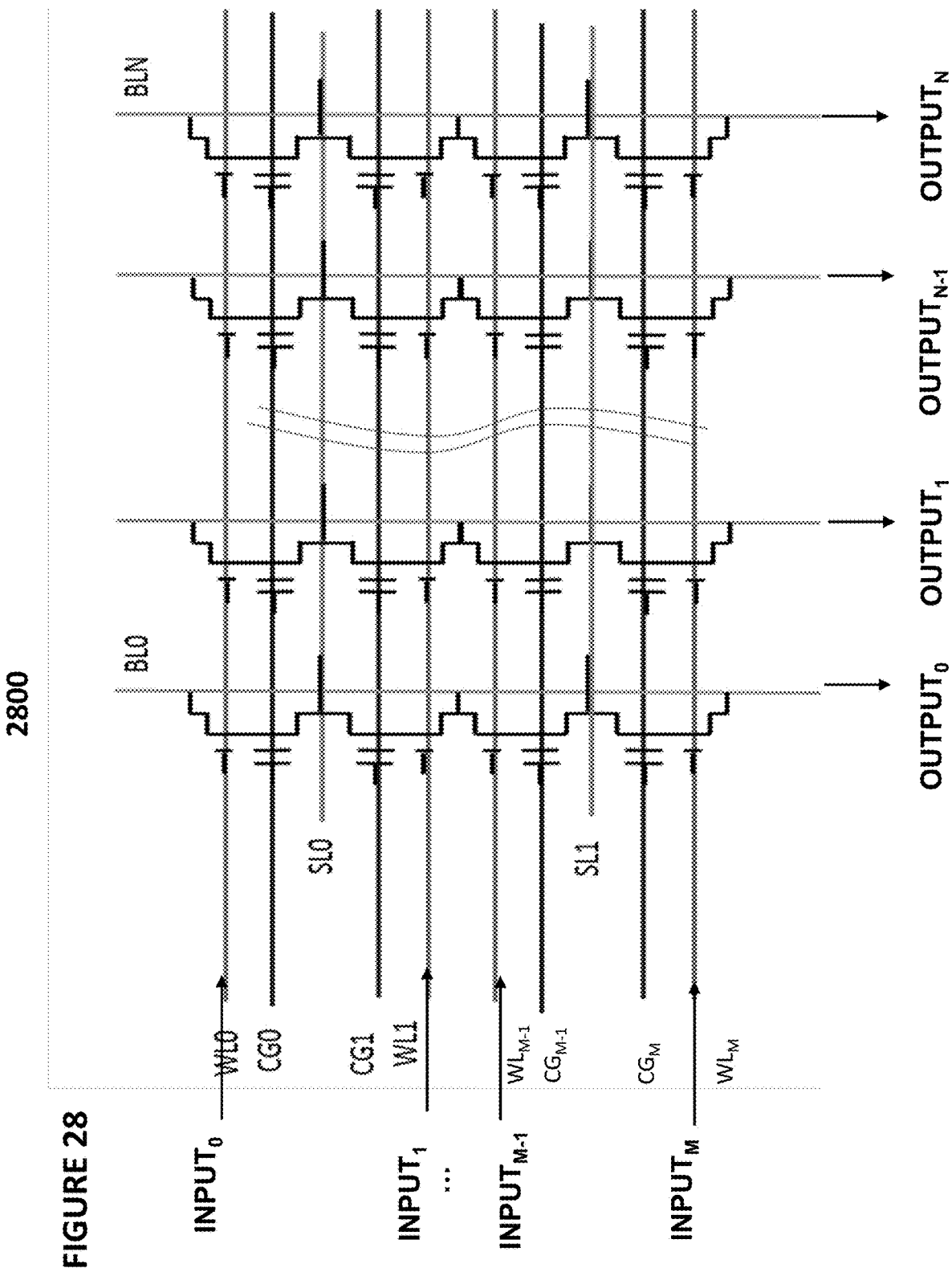
FIG. 28 depicts another embodiment of a vector-by-matrix multiplication system.
Figure 29:
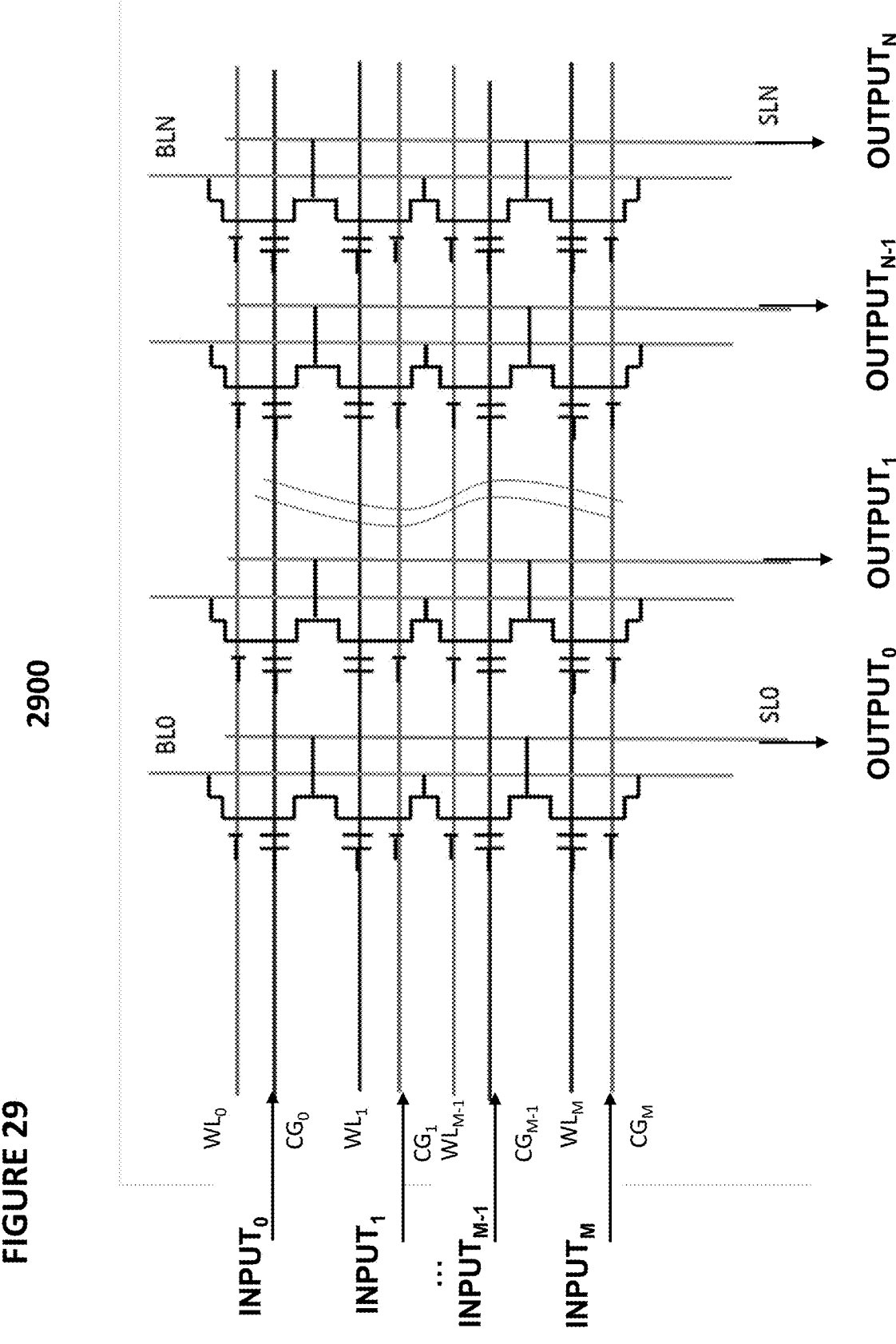
FIG. 29 depicts another embodiment of a vector-by-matrix multiplication system.
Figure 30:
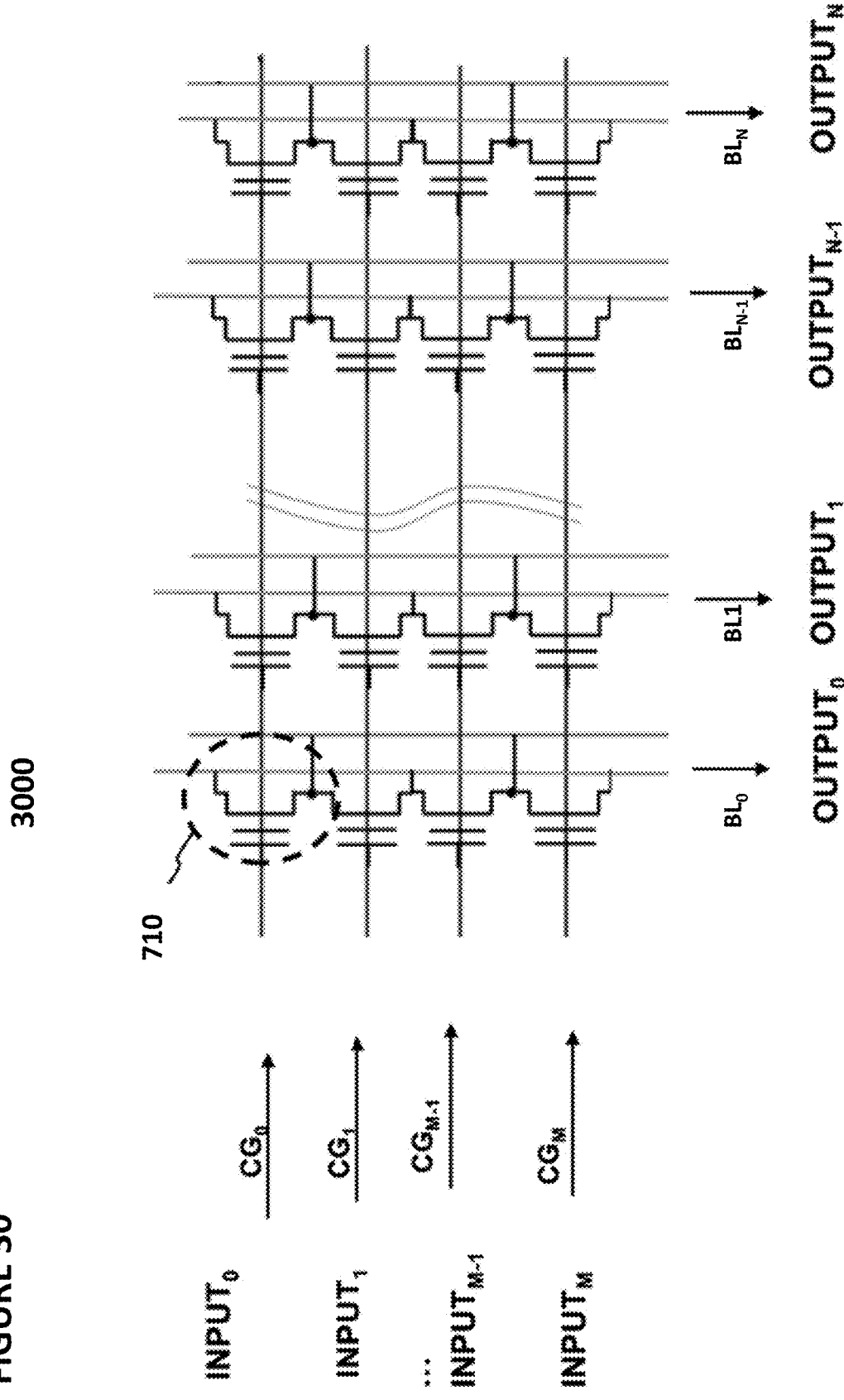
FIG. 30 depicts another embodiment of a vector-by-matrix multiplication system.
Figure 31:
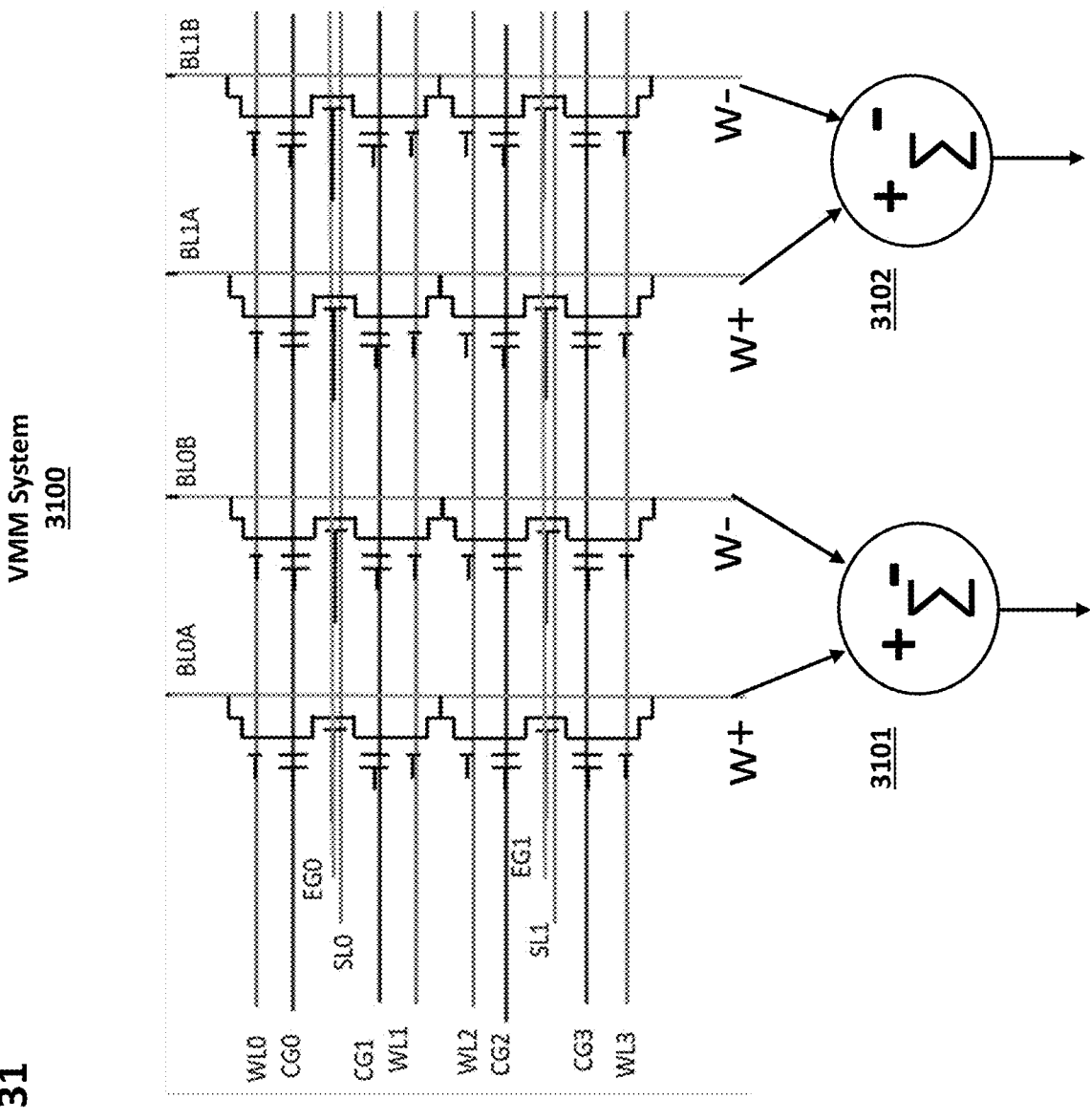
FIG. 31 depicts another embodiment of a vector-by-matrix multiplication system.
Figure 32:
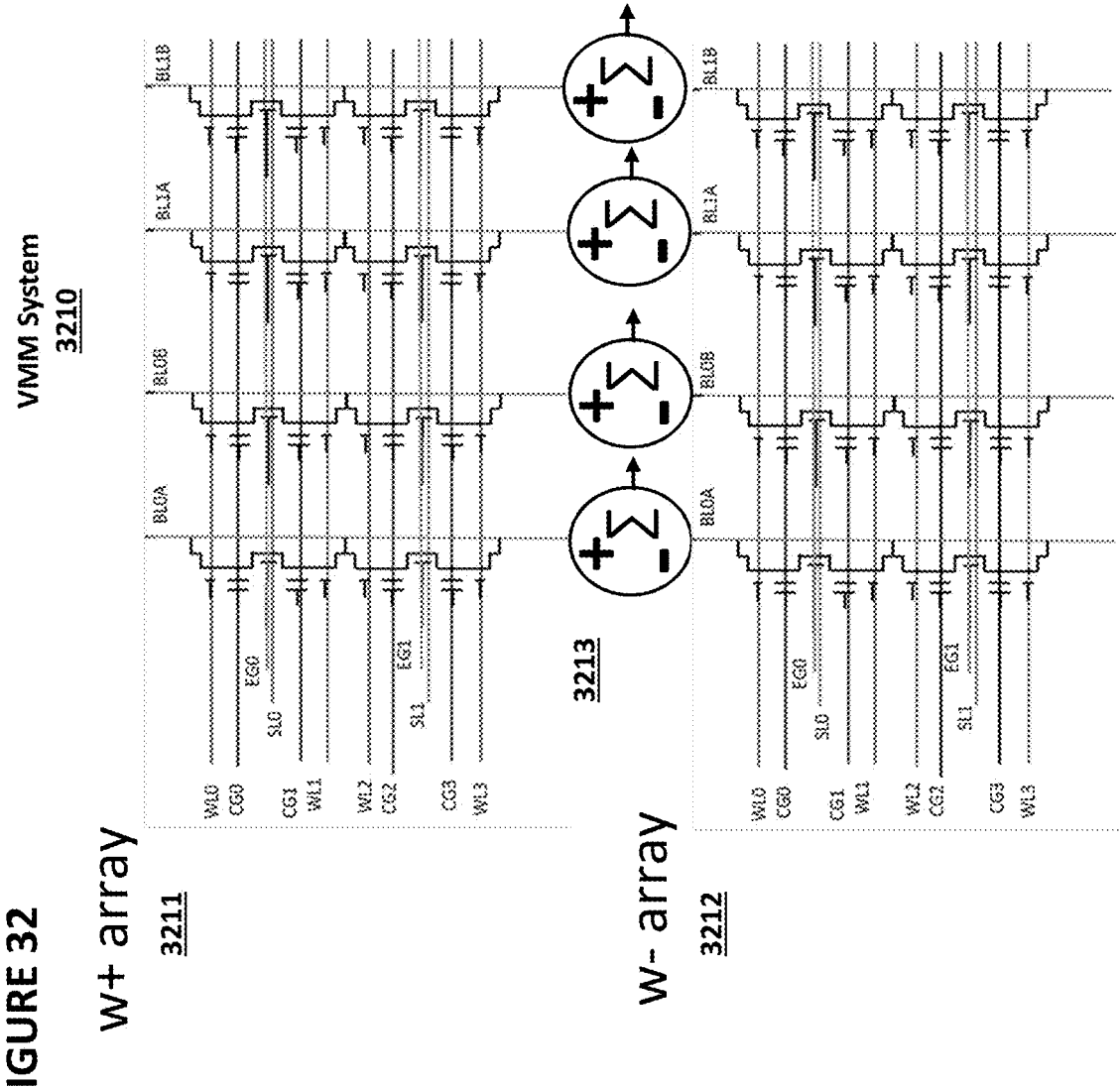
FIG. 32 depicts another embodiment of a vector-by-matrix multiplication system.
Figure 33:
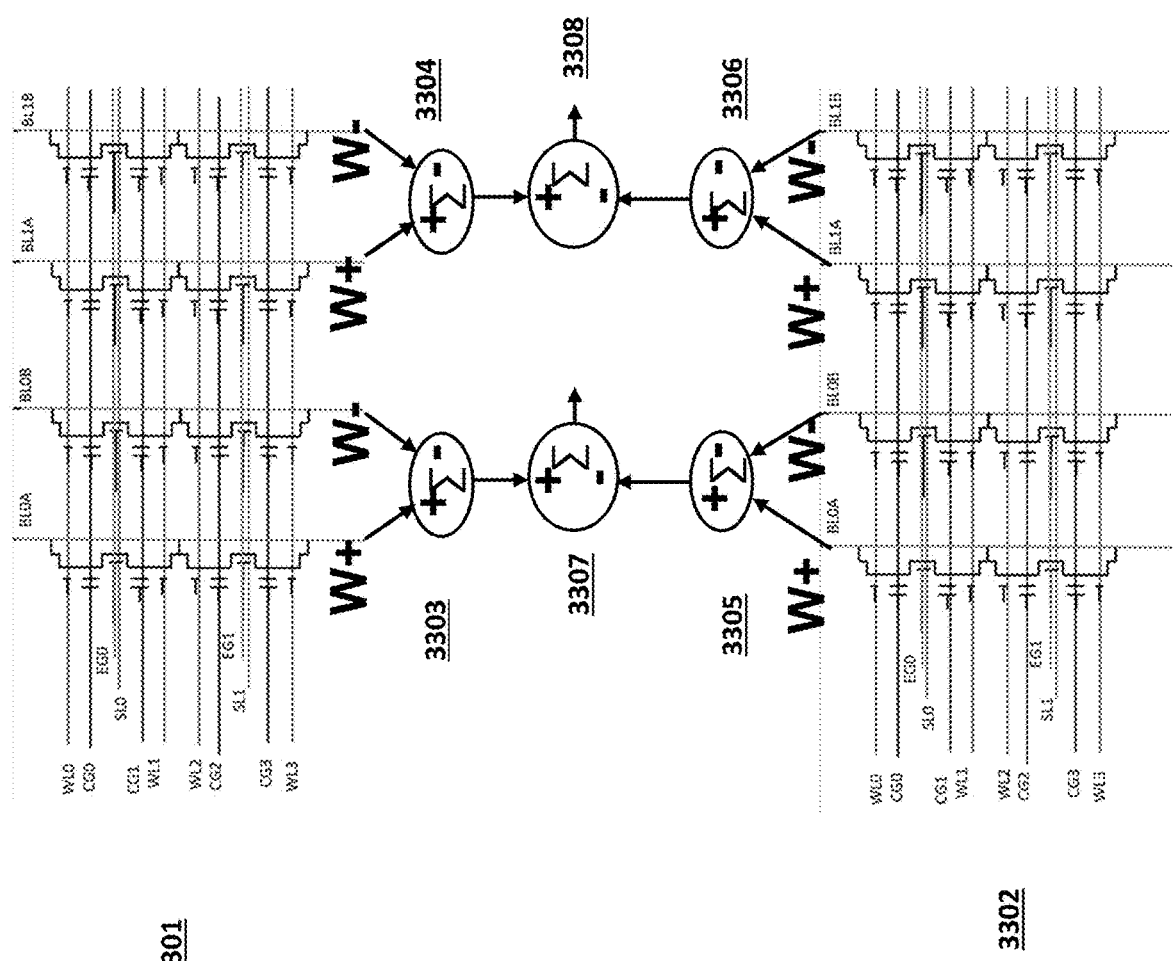
FIG. 33 depicts another embodiment of a vector-by-matrix multiplication system.
Figure 34:
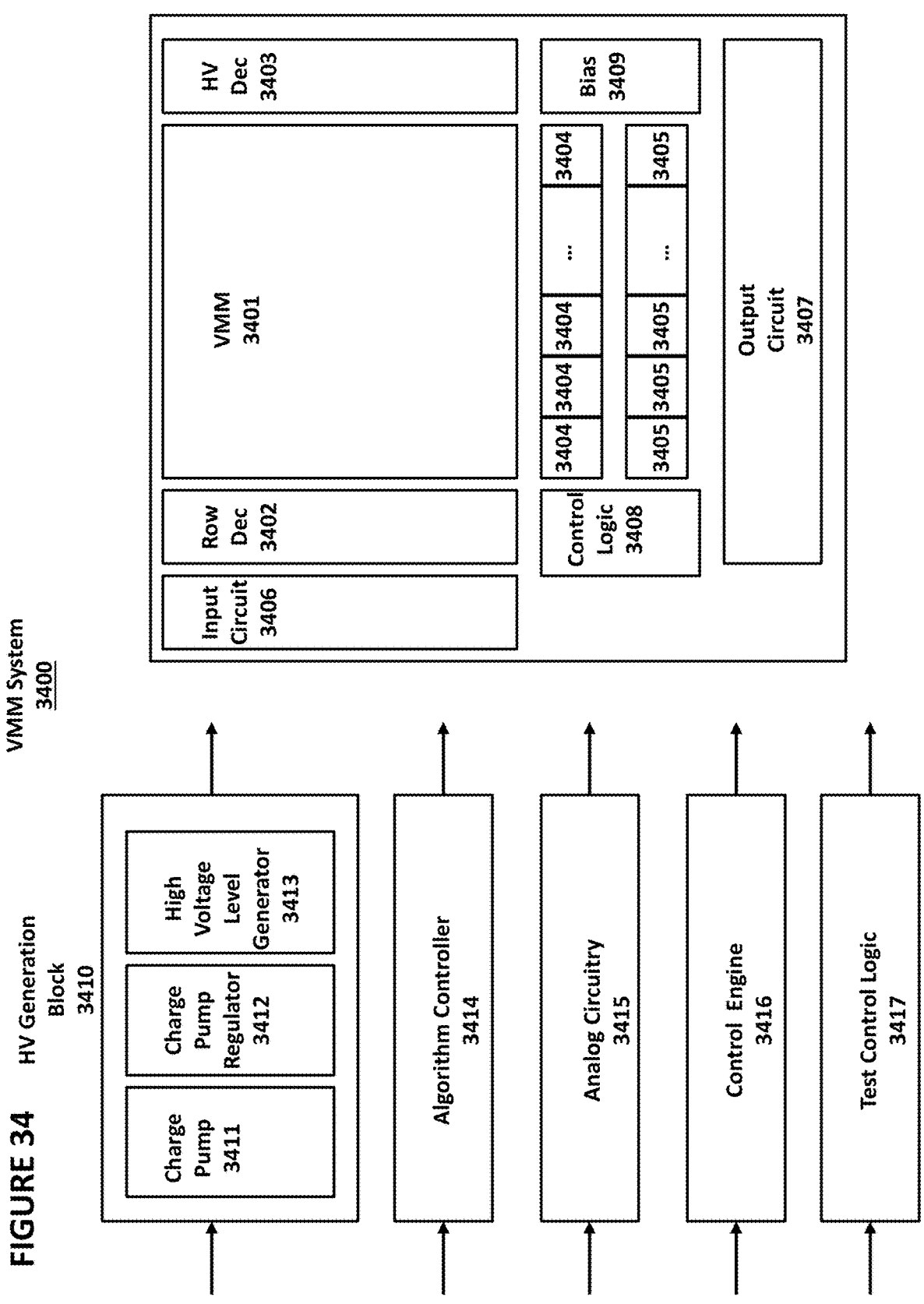
FIG. 34 depicts another embodiment of a vector-by-matrix multiplication system.

FIG. 34 depicts a block diagram of VMM system 3400. VMM system 3400 comprises VMM array 3401, row decoder 3402, high voltage decoder 3403, column decoder 3404, bit line drivers 3405, input circuit 3406, output circuit 3407, control logic 3408, and bias generator 3409. VMM system 3400 further comprises high voltage generation block 3410, which comprises charge pump 3411, charge pump regulator 3412, and high voltage analog precision level generator 3413. VMM system 3400 further comprises (program/erase, or weight tuning) algorithm controller 3414, analog circuitry 3415, control engine 3416 (that may include special functions such as arithmetic functions, activation functions, embedded microcontroller logic, without limitation), and test control logic 3417. The systems and methods described below can be implemented in VMM system 3400.

Input circuit 3406 may include circuits such as a DAC (digital to analog converter), DPC (digital to pulses converter, digital to time modulated pulse converter), AAC (analog to analog converter, such as a current to voltage converter, logarithmic converter), PAC (pulse to analog level converter), or any other type of converters. The input circuit 3406 may implement normalization, linear or non-linear up/down scaling functions, or arithmetic functions. The input circuit 3406 may implement a temperature compensation function for input levels. The input circuit 3406 may implement an activation function such as ReLU or sigmoid. The output circuit 3407 may include circuits such as a ADC (analog to digital converter, to convert neuron analog output to digital bits), AAC (analog to analog converter, such as a current to voltage converter, logarithmic converter), APC (analog to pulse(s) converter, analog to time modulated pulse converter), or any other type of converters.

Output circuit 3407 may implement an activation function such as rectified linear activation function (ReLU) or sigmoid. The output circuit 3407 may implement statistic normalization, regularization, up/down scaling/gain functions, statistical rounding, or arithmetic functions (e.g., add, subtract, divide, multiply, shift, log) for neuron outputs. Output circuit 3407 may implement a temperature compensation function for neuron outputs or array outputs (such as bitline output) so as to keep power consumption of the array approximately constant or to improve precision of the array (neuron) outputs such as by keeping the IV slope approximately the same.

Figure 35A:
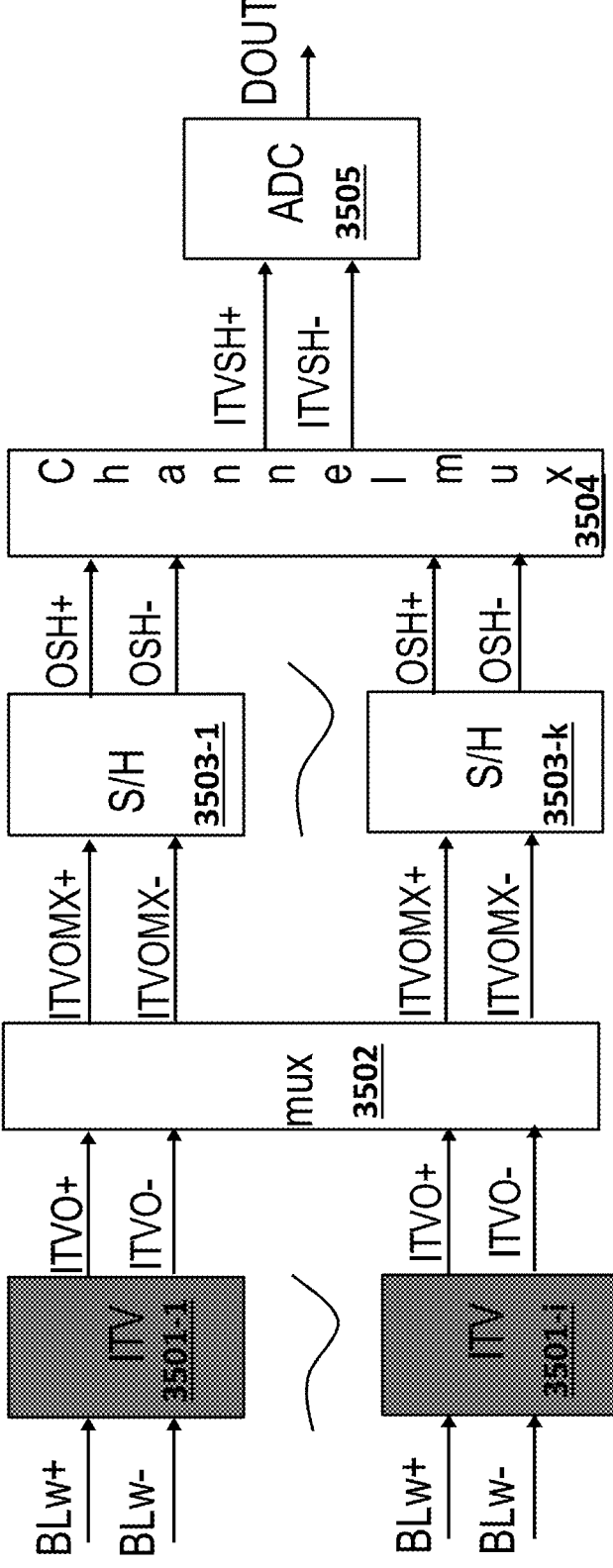
FIGS. 35A and 35B depicts embodiments of an output block.

FIG. 35A depicts output block 3500. Output block comprises current-to-voltage converters (ITV) 3501-1 through **3501-*i*, where i is the number of bit line W+ and W− pairs received by output block 3500; multiplexor 3502; sample and hold circuits 3503-1 through 3503-*i*, channel multiplexor 3504, and analog-to-digital converter (ADC) 3505**.

Output block 3500 receives differential weight outputs W+ and W− from bit line pairs in the array, and ultimately generates a digital output, DOUTx, representing the output of one of the bit line pairs (e.g., W+ and W− lines) from the ADC 3505.

Current-to-voltage converters 3501-1 through 3501-*i* each receive analog bit line current signals BLw+ and BLw− (which are bit line outputs generated in response to inputs and stored W+ and W− weights, respectively) and convert them into differential voltages ITVO+ and ITVO−.

ITVO+ and ITVO− are then received by multiplexor 3502, which time-multiplexes the outputs from current-to-voltage converters 3501-1 through 3501-I to the S/H circuits 3503-1 to 3503*k*, where k can be the same as or different than i.

S/H circuits 3503-1 to 3503-*k* each samples its received differential voltages and holds them as a differential output.

Channel multiplexor 3504 then receives a control signal to select one of the bit line W+ and W− channels, i.e., one of the bit line pairs, and outputs the differential voltages held by the respective sample and hold circuit 3503 to ADC 3505, which converts the analog differential voltages that are output by the respective sample and hold circuit 3503 into a set of digital bits, DOUTx. As shown, the S/H 3503 can be shared across the multiple ITV circuits 3501, and the ADC 3505 can operate on multiple ITV circuits in a time-multiplexed manner. Each S/H 3503 can be just a capacitor or a capacitor followed by a buffer (e.g., operational amplifier).

ADC 3505 can be of a hybrid ADC architecture, meaning it has more than one ADC architecture to perform conversion. For example, if DOUTx is an 8-bit output, ADC 3505 can comprise an ADC sub-architecture to generate bits B7-B4 and another ADC sub-architecture to generate bits B3-B0 from the differential inputs ITVSH+ and ITVSH−. That is, ADC circuit 3505 can include multiple ADC sub0architectures.

Optionally, an ADC sub-architecture can be shared among all channels while another ADC sub-architecture is not shared among all channels.

In another embodiment, channel mux 3504 and ADC 3505 can be removed, and the output instead can be analog differential voltages from a S/H 3503, which can be buffered by an operational amplifier. For example, the use of an analog voltage can be implemented in an all-analog neural network (i.e. one where a digital output or digital input is not needed for the neural memory array).

Figure 35B:
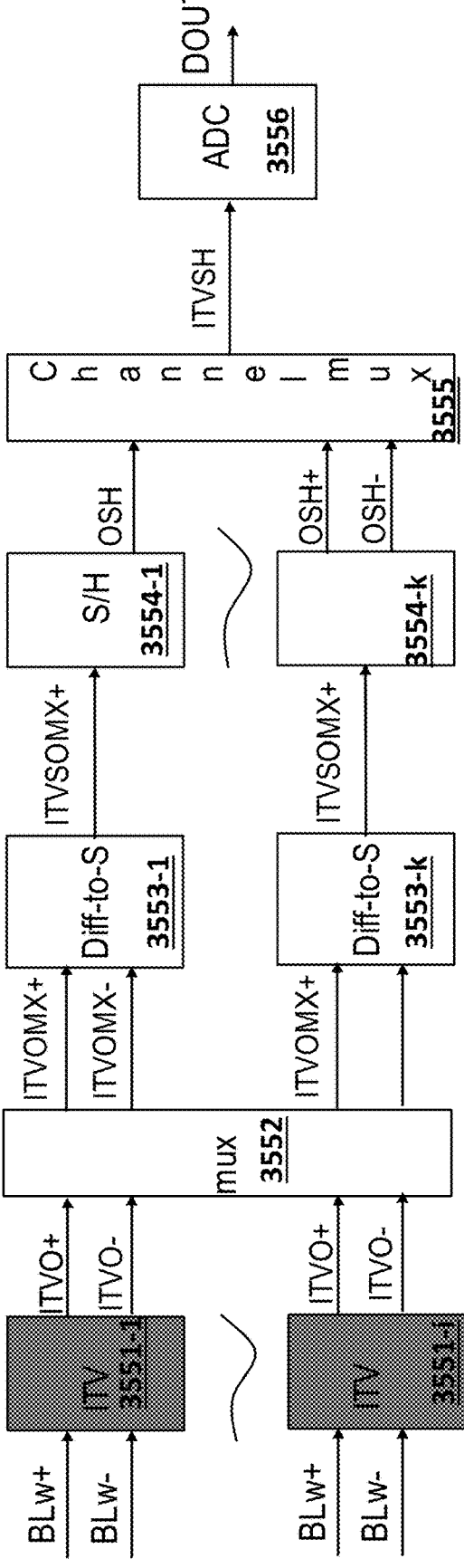

FIG. 35B depicts output block 3550. Output block comprises current-to-voltage converters (ITV) 3551-1 through 3551-*i*, where i is the number of bit line W+ and W− pairs received by output block 3550; multiplexor 3552; differential to single ended converter Diff-to-S Converter 3553, sample and hold circuits 3554-1 through 3554-*k* (where k is the same as or different than i), channel multiplexor 3554, and analog-to-digital converter (ADC) 3555. Diff-to-S converter 3553 is used to convert the differential outputs from the ITV 3551 signal provided by mux 3552 into a singled-ended output. The singled-ended output is then input to the S/H 3554. mux 3555, and ADC 3556.

Figure 36:
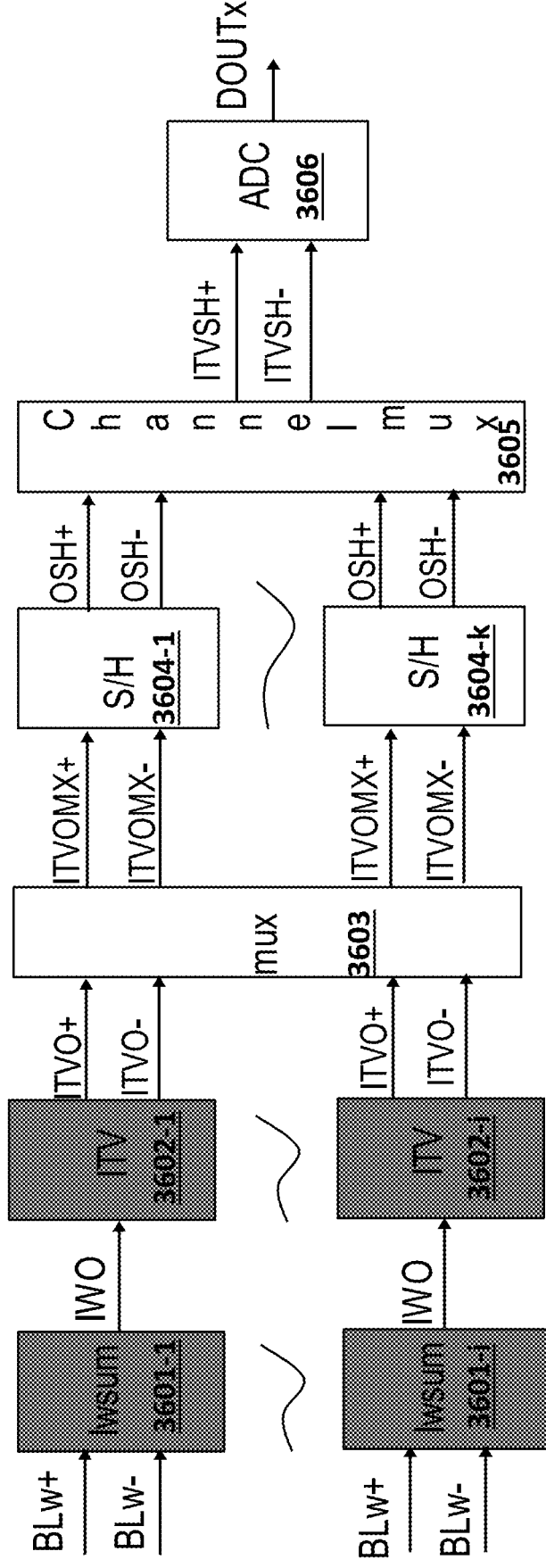
FIG. 36 depicts another embodiment of an output block.

FIG. 36 depicts output block 3600. Output block comprises summation circuits 3601-1 through 3601-*i* (such as a current mirror circuit), where i is the number of bit line BLw+ and BLw− pairs received by output block 3600; current-to-voltage converter circuits (ITV) 3602-1 through 3602-*i*, multiplexor 3603; sample and hold circuits 3604-1 through 3604-*k* (where k is the same as or different than i), channel multiplexor 3605, and ADC 3606. Output block 3600 receives differential weight outputs BLw+ and BLw− from bit line pairs in the array, and ultimately generates a digital output from ADC 3606, DOUTx, representing the output of one of the bit line pairs at a time.

Current summation circuits 3601-1 through 3601-*i* each receive current from a pair of bit lines and subtract the BLw− value from the BLw− value and output the result as a summation current.

Current-to-voltage converters 3602-1 through 3602-*i* receive the output summation current and convert the respective summation current into differential voltages ITVO+ and ITVO−, which are then received by multiplexor 3603 and selectively provided to sample-and-hold circuits 3604-1 through 3604-*k*.

Each sample and hold circuit 3604 receives differential voltages ITVOMX+ and ITVOMX−, samples the received differential voltages, and hold them as a differential voltage output, OSH+ and PSH−.

Channel multiplexor 3605 receives a control signal to select one of the bit line pairs, i.e., channels, BLw+ and BLw− and outputs the voltage held by the respective sample and hold circuit 3604 to ADC 3606, which converts the voltage into a set of digital bits as DOUTx.

Figures 37A, 37B:
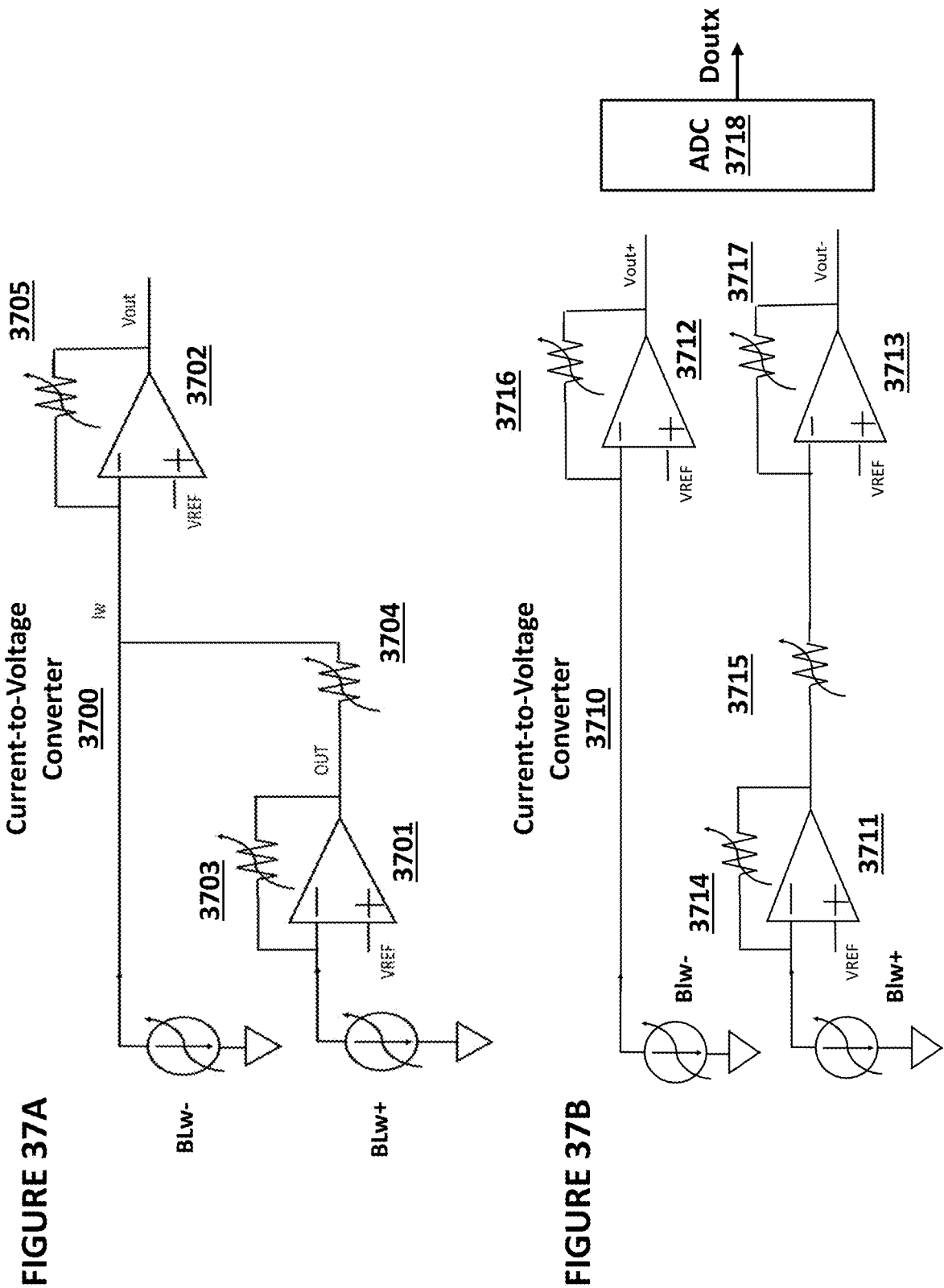
FIG. 37A depicts another embodiment of an output block.
FIG. 37B depicts another embodiment of an output block.

FIG. 37A depicts current-to-voltage converter 3700. Current-to-voltage converter 3700 comprises operational amplifiers 3701 and 3702 and variable resistors 3703, 3704, and 3705, configured as shown. Current-to-voltage converter 3700 receives differential output currents BLw+ from a W+ bit line and BLw− from a W− bit line, shown as variable current sources, and generates a single-ended output, Vout. The output voltage Vout is =(BLw+−BLw−)*R, with resistors 3703, 3704 and 3705 each having value equal to R. The variable resistors in FIG. 37A can be used for scaling the output.

FIG. 37B depicts current-to-voltage converter 3710. Current-to-voltage converter 3710 comprises operational amplifiers 3711, 3712, and 3713 and variable resistors 3714, 3715, 3716, and 3717, configured as shown. Current-to-voltage converter 3710 receives an output current BLw+ from a W+ bit line, shown as a variable current source, and generates output Vout+ for that line and receives an output current Blw− from a W− bit line, shown as a variable current source. and generates output Vout− for that line. Thus, unlike in output block 3700, output block 3710 generates differential voltages, rather than a single-ended output, respectively representing differential values BLw+ and BLw−. The output voltage Vout+=Iw+*R and Vout−=−Rw−*R, with resistors 3714, 3715, 3716 and 3717 each having value equal to R. The variable resistors in FIG. 37B can be used for scaling the outputs.

Optionally, differential output voltages Vout+ and Vout− can be input to ADC 3718, which converts them into a set of digital output bits, Doutx.

Figures 38A, 38B:
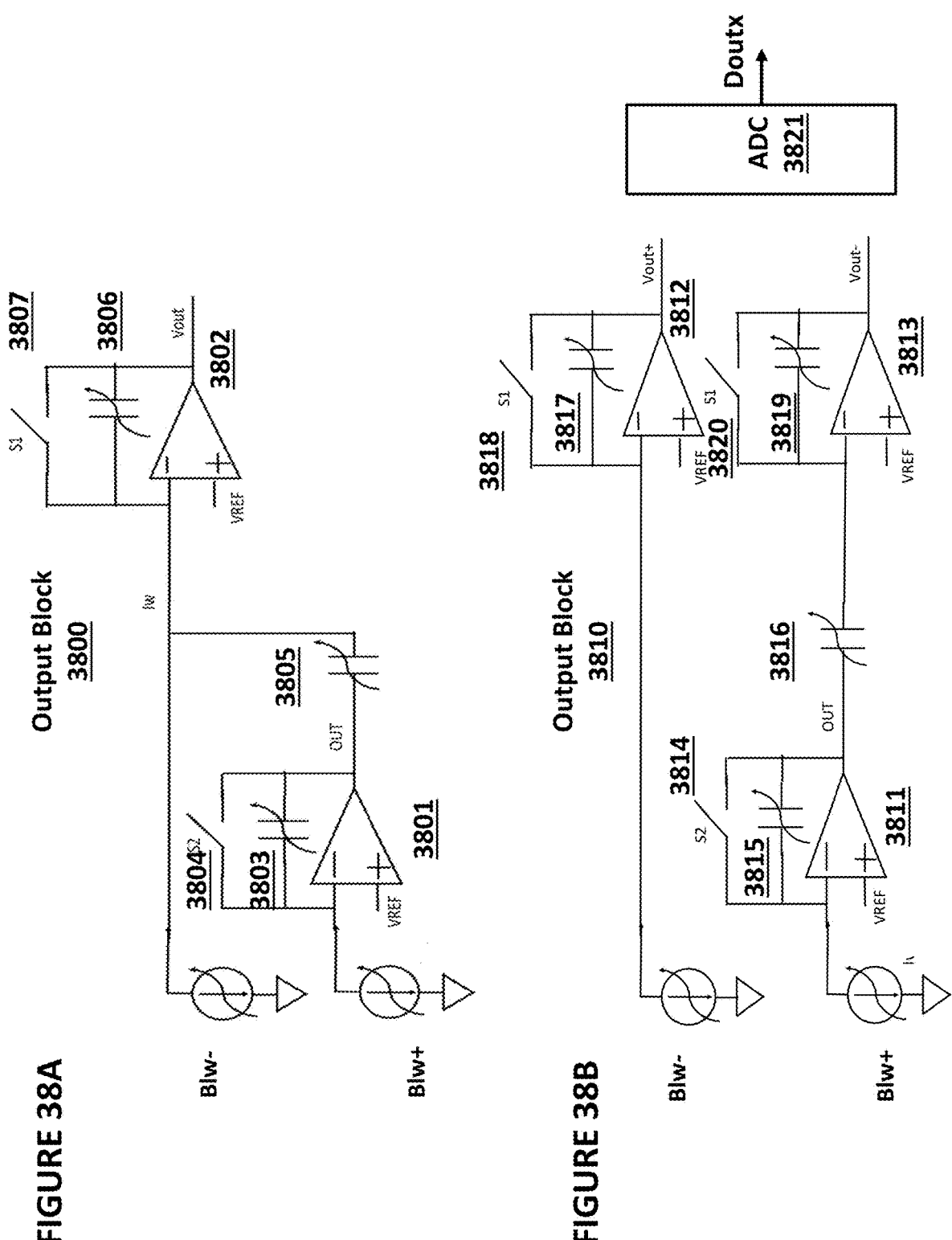
FIG. 38A depicts another embodiment of an output block.
FIG. 38B depicts another embodiment of an output block.

FIG. 38A depicts current-to-voltage converter 3800. Current-to-voltage converter 3800 comprises operational amplifiers 3801 and 3802; variable capacitors 3803, 3805, and 3806; and controlled switches 3804 and 3807, configured as shown. Current-to-voltage converter 3800 receives differential output currents BLw+ from a W+ bit line, shown as a variable current source, and BLw− from a W− bit line, shown as a variable current source, and generates single-ended output Vout. The output voltage Vout is =(Iw+−Iw−)*t_integration/C, with capacitors 3803, 3805 and 3806 each having a capacitance value equal to C. A control circuit (not shown) controls the opening and closing of switches 3804, 3807 to provide the integration time t_integration.

FIG. 38B depicts current-to-voltage converter 3810. Current-to-voltage converter 3810 comprises operational amplifiers 3811, 3812, and 3813; variable capacitors 3815, 3816, 3817, and 3819; and switches 3814, 3818, and 3820. Current-to-voltage converter 3810 receives an output current BLw+ from a W+ bit line, shown as a variable current source, and generates output Vout+ for that line and receives an output current BLw− from a W− bit line, shown as a variable current source, and generates output Vout− for that line. Thus, unlike in output block 3800, output block 3810 generates two voltages representing respective differential values BLw+ and BLw−. The output voltage Vout+=BLw+ *t_integration/C and Vout−=BLw−*t_integration/C, with capacitors 3815, 3816, 3817 and 3819 each having a capacitance value equal to C. A control circuit (not shown) controls the opening and closing of switches 3814, 3818 and 3820 to provide the integration time t_integration.

Optionally, differential output voltages Vout+ and Vout− can be input to ADC 3821, which converts them into a set of digital output bits, Doutx.

Figure 39A:
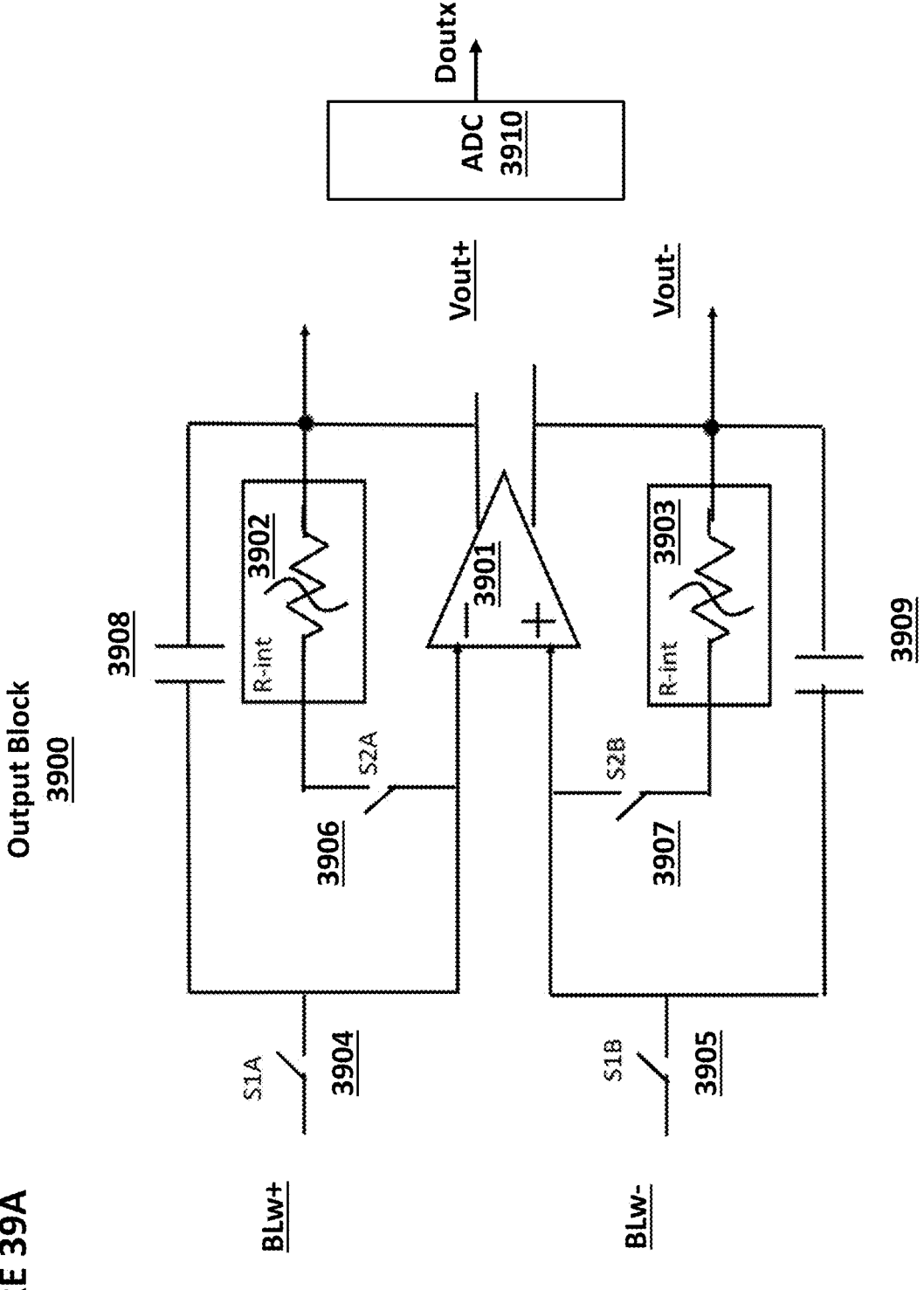
FIG. 39A depicts another embodiment of an output block.

FIG. 39A depicts current-to-voltage converter 3900. Current-to-voltage converter 3900 comprises operational amplifier 3901; variable integrating resistors 3902 and 3903; controlled switches 3904, 3905, 3906, and 3907; and sample and hold capacitors 3908 and 3909, configured as shown. Current-to-voltage converter 3900 receives differential current BLw+ from a W+ bit line and BLw− from a W− bit line and outputs voltages Vout+ and Vout-, respectively. The output voltage Vout+=(BLw+)*R and Vout−=(BLw−)*R, with resistors 3902 and 3903 each having value equal to R. Capacitors 3908 and 3909 each serves as holding S/H capacitor to hold the output voltage once the resistors 3902 and 3903 and the input current are shut off. A control circuit (not shown) controls the opening and closing of switches 3904, 3905, 3906 and 3907 to provide an integration time.

Optionally, differential output voltages Vout+ and Vout− can be input to ADC 3910, which converts them into a set of digital output bits, Doutx.

Figure 39B:
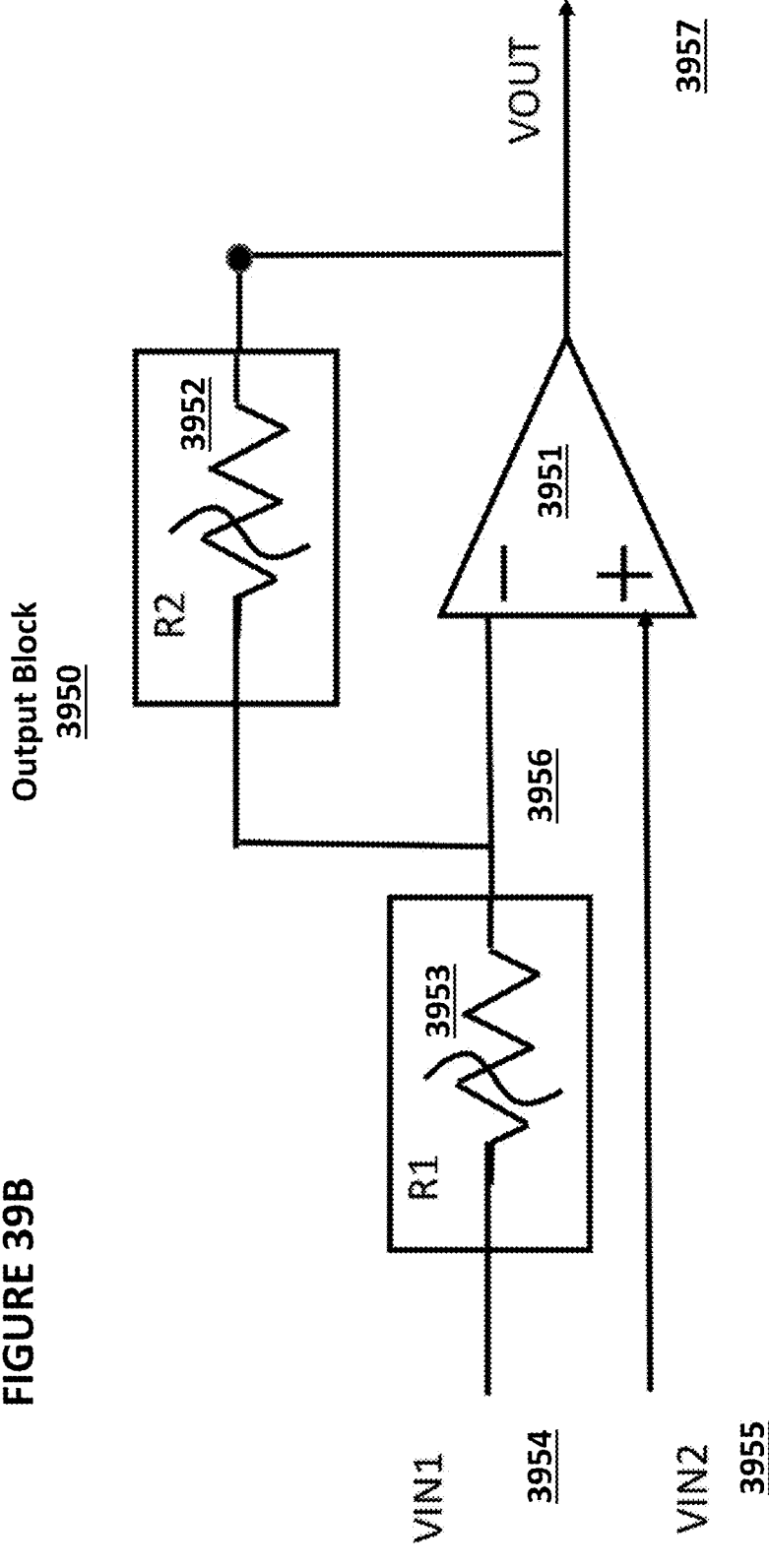
FIG. 39B depicts another embodiment of an output block.

FIG. 39B depicts a differential voltages to singed ended voltage converter (Diff-to-S) 3950. The Diff-to-S converter 3950 comprises operational amplifier 3951; and variable integrating resistors 3952 and 3953. The output voltage Vout−(Vin1−Vin2)*(R_3852/R_3953). This is, for example, used as block 3553 in FIG. 35B.

Figures 40A, 40B, 40C:
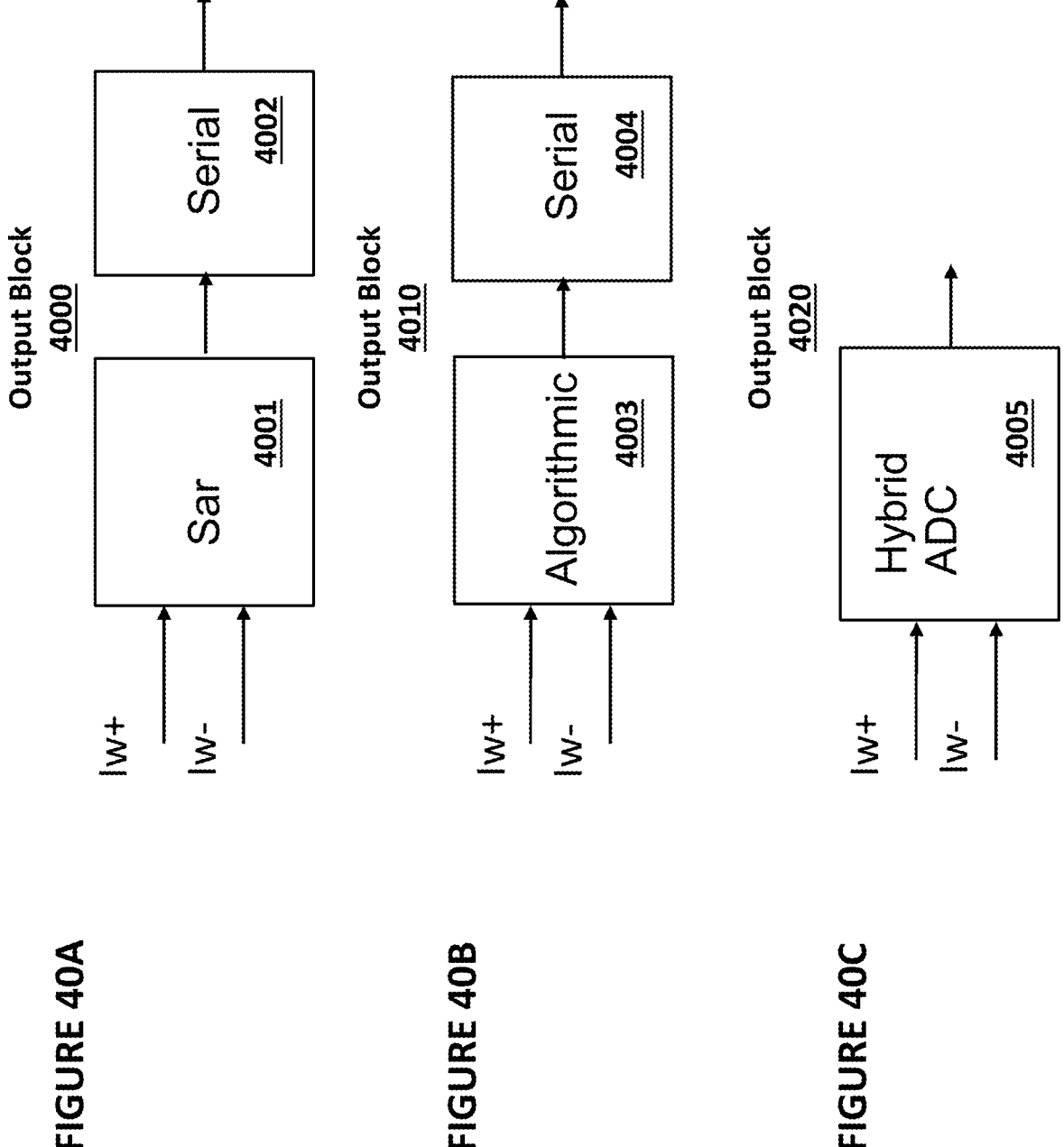
FIG. 40A depicts another embodiment of an output block.
FIG. 40B depicts another embodiment of an output block.
FIG. 40C depicts another embodiment of an output block.

FIG. 40A depicts output block 4000, which is a hybrid output conversion block. Output block 400 comprises multiple sub-architectures such as SAR and serial ADC sub-architectures as shown. Output block 4000 receives differential signals Iw+ and Iw−. Successive approximation register analog-to-digital converter SAR 4001 converts differential signals Iw+ and Iw− into higher order digital bits, and serial block ADC 4002 then converts the signal that remans after the higher bit conversion into the lower order bits and outputs all the output digital bits together. That is, serial block ADC 4002 receives a portion of bits from DAR 4001 and arranges the portion of bits and the remainder of bits in a serial fashion. In one example, SAR ADC 4001 converts a portion of the received differential voltages into MSB bits B7-B4 and serial ADC 4002 converts a portion of the received differential voltages into the LSB bit B3-B0 for 8-bit ADC conversion.

FIG. 40B depicts output block 4010. Output block 4010 comprises multiple sub-architectures, such as algorithmic ADC and serial ADC sub-architectures as shown. Output block 4010 receives differential signals Iw+ and Iw−. Algorithmic analog-to-digital converter 4003 converts differential signals Iw+ and Iw− into high order digital bits, and serial ADC block 4004 then converts the signal that remains after the higher bit conversion into the lower order bits and outputs all the output digital bits together. That is, serial ADC block ADC 4004 receives a portion of bits from algorithmic ADC 4003 and arranges the portion of bits and the remainder of bits in a serial fashion. In one example, Algorithmic ADC 4003 converts a portion of received differential voltages into MSB bits B7-B4 and the serial ADC 4004 converts a portion of the received differential voltages into the LSB bit B3-B0 for 8-bit ADC conversion.

FIG. 40C depicts output block 4020. Output block 4020 receives differential signals Iw+ and Iw−. Output block 4020 comprises hybrid analog-to-digital converter, which converts differential signals Iw+ and Iw− into digital bits by combining different conversion schemes (such as those shown in FIGS. 40A and 40B) into one block.

Figure 41:
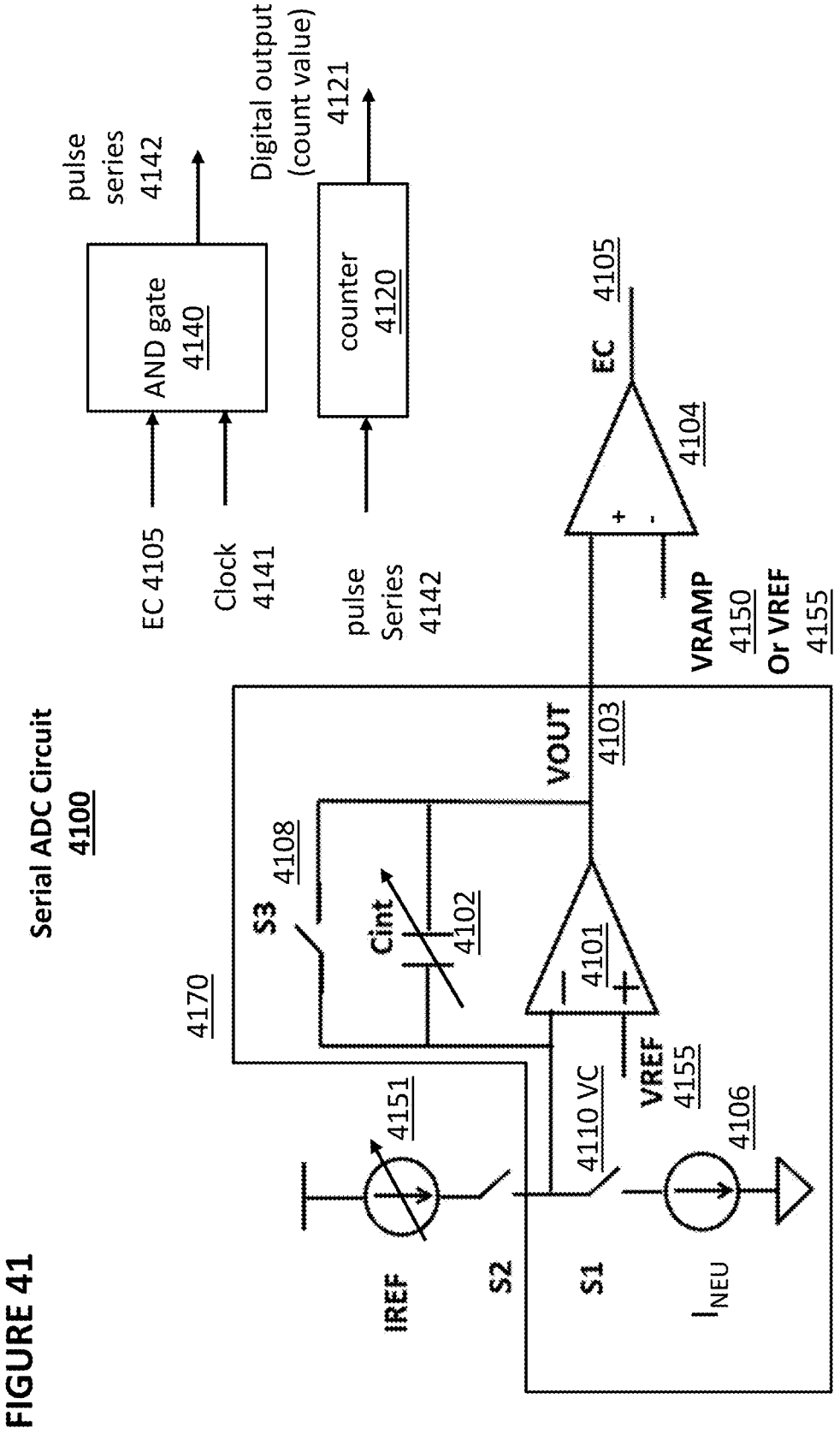
FIG. 41 depicts a serial analog-to-digital converter circuit.

FIG. 41 depicts configurable serial analog-to-digital converter 4100. It includes integrator 4170 which integrates the neuron output current $I_{NEU}$, shown as a variable current source, into the integrating capacitor 4102 (Cint). Integrator 4170 comprises a differential amplifier 4101, controlled switches 4108 and 4110, and a control circuit (not shown) which controls the opening and closing of switches 4108 and 4110 to provide an integration time.

In one embodiment, VRAMP 4150 is provided to the inverting input of comparator 4104. The digital output (count value) 4121 is produced by ramping VRAMP 4150 until the output of comparator 4104, shown as EC 4105, switches polarity, with counter 4120 counting clock pulses from the beginning of the ramp of VRAMP 4150 and stopping when the output of comparator 4104 switches polarity, responsive to AND gate 4140 preventing the passage of clock 4141 as pulse series 4142 from reaching counter 4120.

In another embodiment, VREF 4155 is provided to the inverting input of comparator 4104. VC 4110 is ramped down by ramp current 4151 (IREF) until VOUT 4103 reaches VREF 4155, at which point the output of comparator 4104, EC 4105, switches polarity which disables the count of counter 4120. Thus, counter 4120 is enabled with the closing of switch S2, (which is after the opening of S2, and disabled when output of comparator 4104, EC 4105, switches polarity). S3 is used to initialize (equalize) at the beginning of the operation. The (n-bit) ADC 4100 is configurable to have a lower precision (fewer than n bits) or a higher precision (more than n bits), depending on the target application. The configurability of precision is done by configuring the capacitance of capacitor 4102, the current 4151 (IREF), the ramping rate of VRAMP 4150, or the clocking frequency of clock 4141, without limitation.

In another embodiment, the ADC circuit of a VMM array is configured to have a precision lower than n bits and the ADC circuits of another VMM array is configured to have high a precision greater than bits.

In another embodiment, one instance of serial ADC circuit 4100 of one neuron (array output) circuit is configured to combine with another instance of serial ADC circuit 4100 for an adjacent neuron circuit to produce an ADC circuit with higher than n-bit precision, such as by combining the integrating capacitor 4102 of the two instances of serial ADC circuits 4100.

Figure 42:
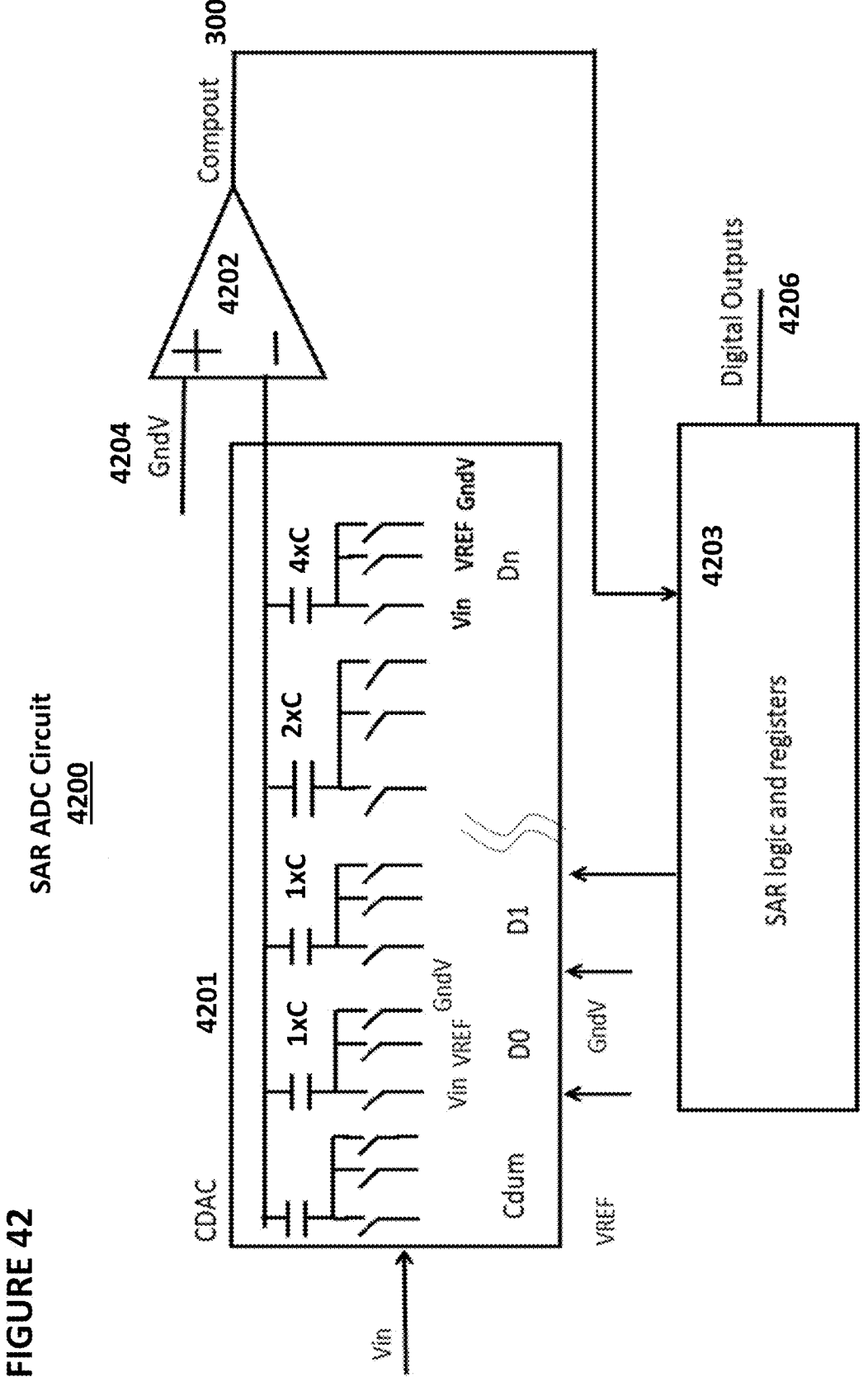
FIG. 42 depicts a successive approximation register analog-to-digital converter circuit.

FIG. 42 depicts a configurable SAR (successive approximation register) analog-to-digital converter 4200 used for neuron output circuit (array output circuit). This circuit is a successive approximation converter based on charge redistribution using binary capacitors. It includes a binary CDAC (capacitor Digital to Analog Converter) 4201, comparator 4202, and SAR logic and registers 4203. As shown GndV 4204 is a low voltage reference level, for example ground level. SAR logic and register 4203 provides digital outputs 4206. Other non-binary capacitor structures can be implemented with weighted reference voltages or correction with the outputs.

Figure 43:
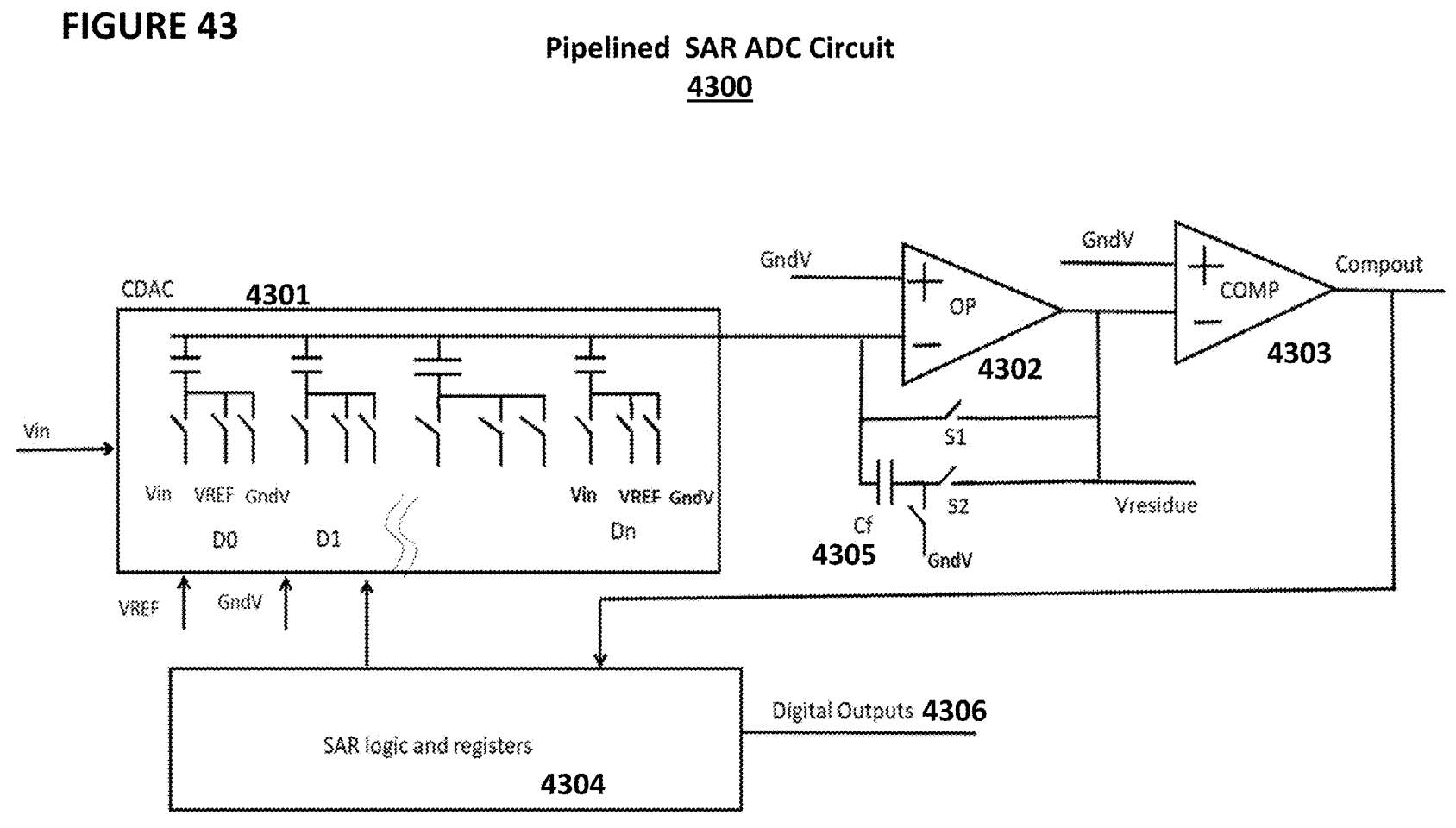

FIG. 43 depicts a pipelined SAR ADC circuit 4300 that can be used to combine with the next SAR ADC to increase the number of bits in a pipelined fashion. SAR ADC circuit 4300 comprises binary CDAC 4301, comparator 4302 (operates as a op amp or comparator), op-amp/comparator 4303, SAR logic and registers 4304. As shown GndV 3104 is a low voltage reference level, for example ground level. SAR logic and register 4304 provides digital outputs 4306. Vin is in the input voltage, VREF is a reference voltage, and GndV is a low voltage, such as a ground voltage. Vresidue is generated by capacitor 4305 and is provided as an input to the next stage of an SAR ADC conversion sequence.

Figure 44A:
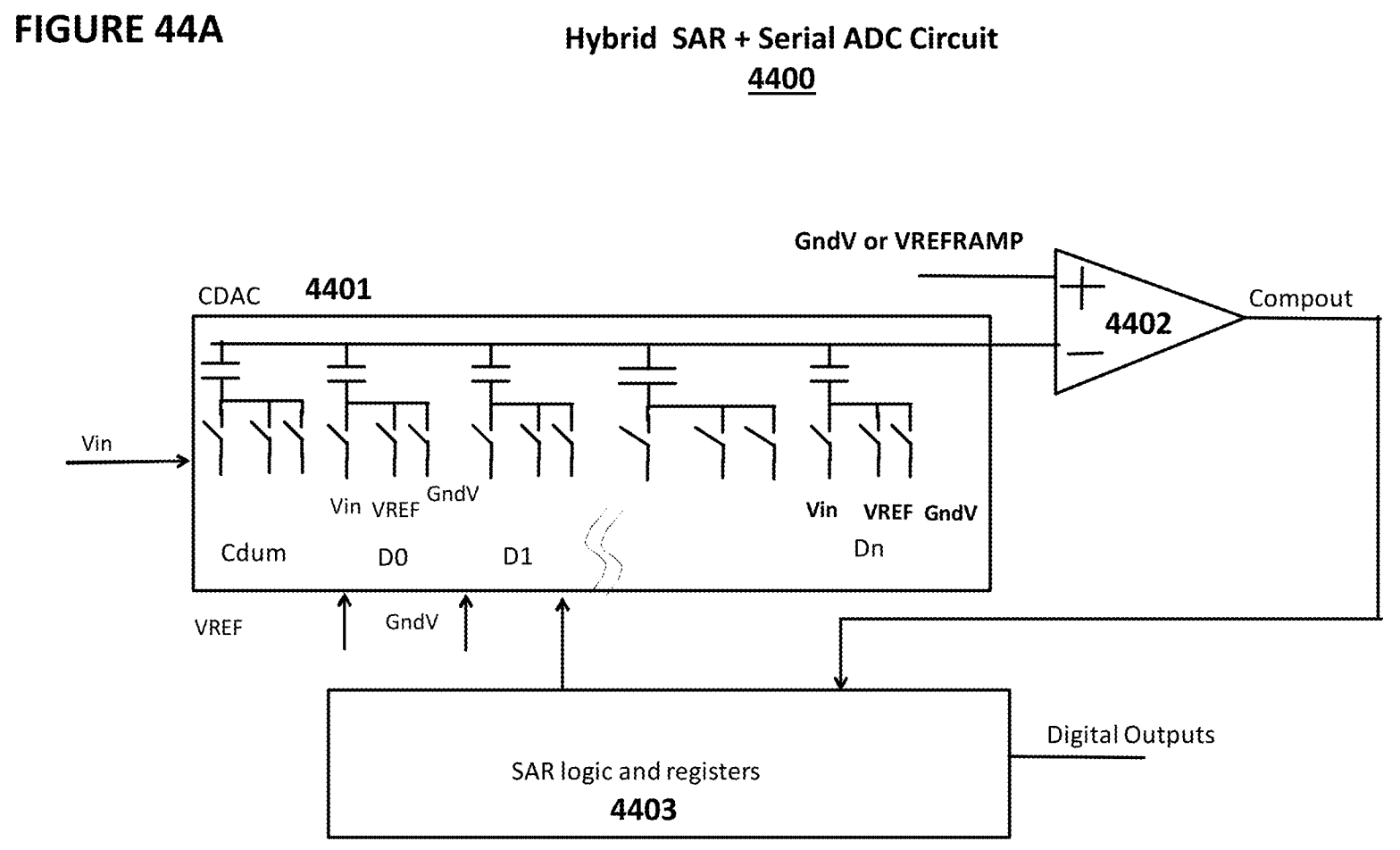

FIG. 44A depicts hybrid SAR+serial ADC circuit 4400 that can be used to increase the number of bits in a hybrid fashion. SAR ADC circuit 4400 comprises binary CDAC 4401, comparator 4402s, and SAR logic and registers 4403. As shown, GndV is a low voltage reference level, for example ground level during the SAR ADC operation. SAR logic and registers 4403 provides digital outputs. Vin is the input voltage. The VREFRAMP is used as a reference ramping voltage during the serial ADC operation with appropriate control circuit and signal muxing (not shown).

Other hybrid ADC architectures that can be used include SAR ADC plus sigma delta ADC, Flash ADC plus serial ADC, Pipelined ADC plus serial ADC, Serial ADC plus SAR ADC, and other architectures.

Figure 44B:
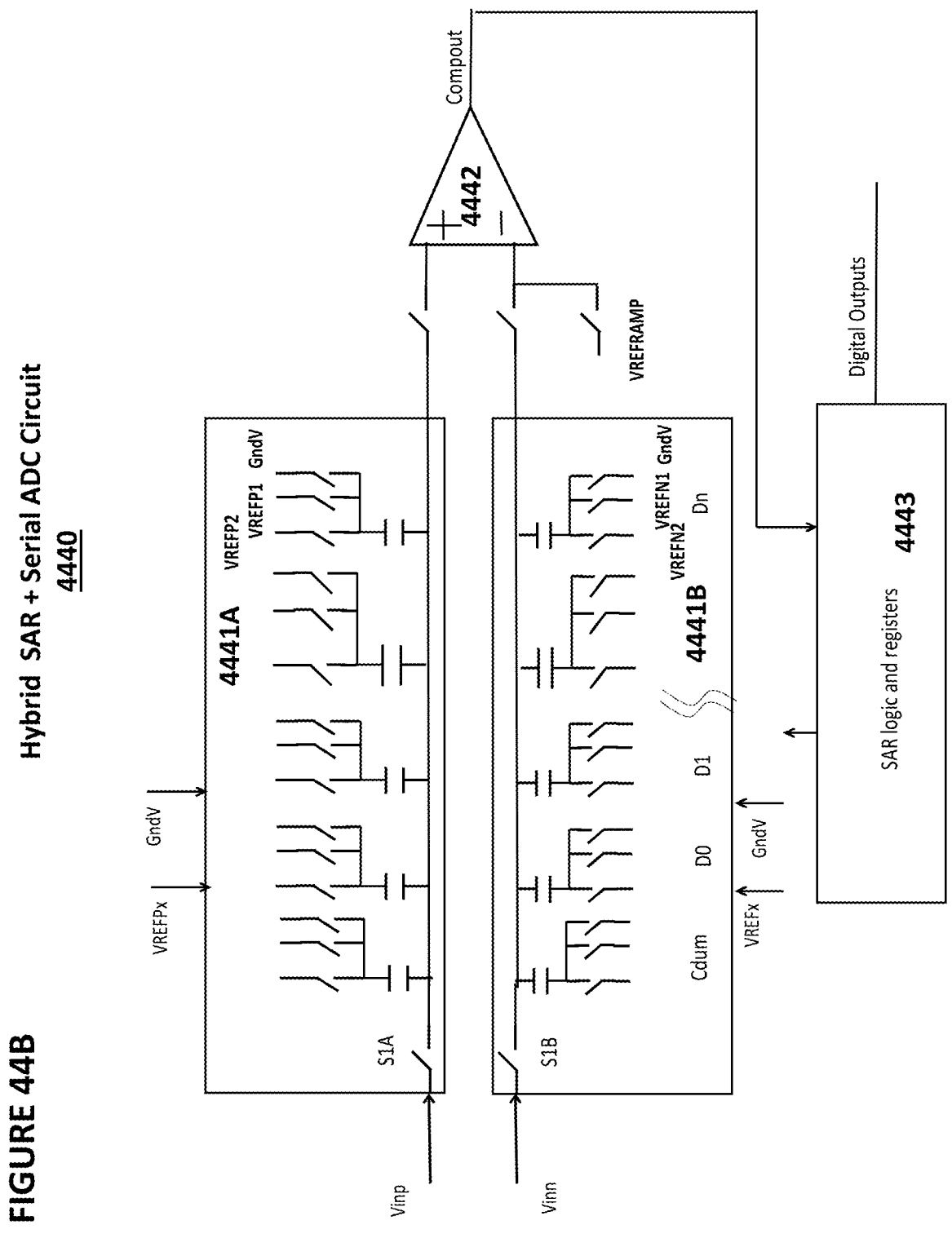

FIG. 44B depicts hybrid differential SAR+serial ADC circuit 4400 that can be used to increase the number of bits in a hybrid fashion.

Figure 45:
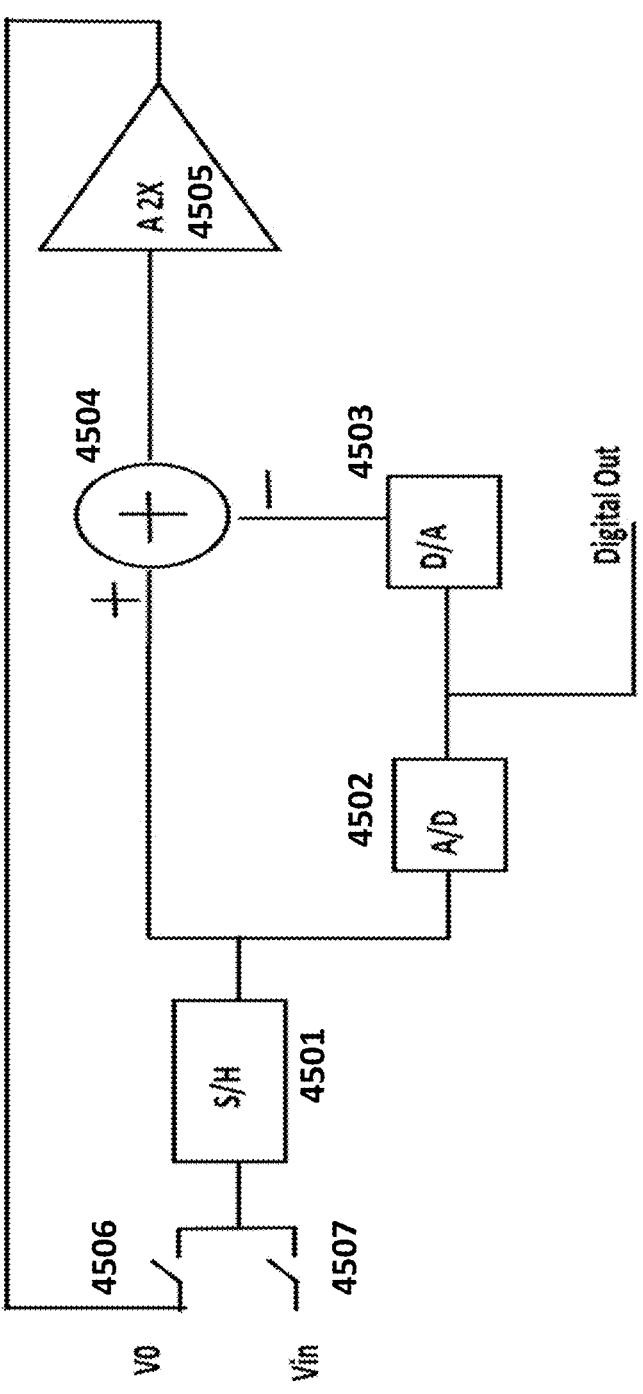
FIG. 45 depicts a algorithmic analog-to-digital converter block.

FIG. 45 depicts Algorithmic ADC output block 4500. Output block 4500 comprises sample-and-hold circuit 4501, 1-bitanalog-to-digital converter 4502, 1-bit digital-to-analog converter 4503, summer 4504, operational amplifier 4505, and controlled switches 4506 and 4507, configured as shown. Operational amplifier 4505 is shown configured to provide a gain of 2.

Figure 46:
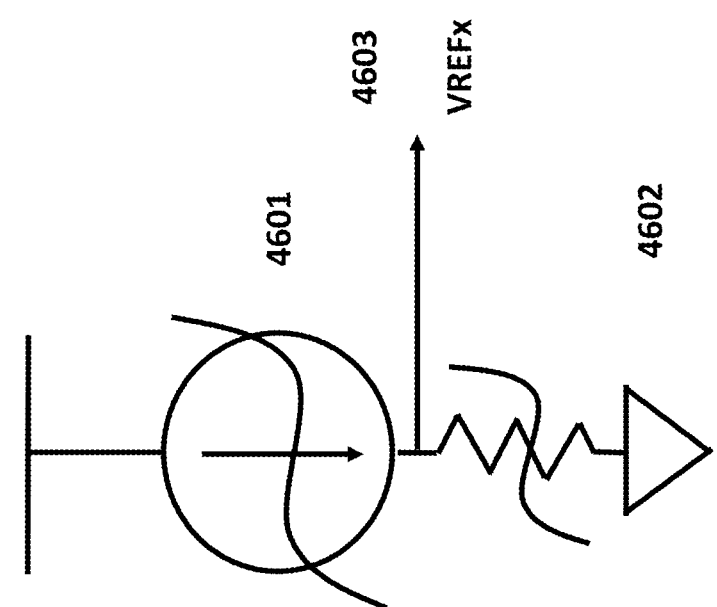
FIG. 46 depicts a tracking reference generator for used in the output blocks.

FIG. 46 depicts tracking voltage reference generator 4600 that is used to generate a reference voltage that can be used by output circuits described herein and components of such output circuits, such as in FIGS. 37A, 37B, 38A, 38B, 41, 42, 43, 44A, and 44B.

Tracking voltage reference generator 4600 comprises bias current 4601 and variable resistor 4602 and generates an output VREFx 4603=i*R, where i is the current from bias current 4601 and R is the resistance of variable resistor 4602.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. An output circuit for generating an output from one or more arrays of non-volatile memory cells, comprising:
   a plurality of current-to-voltage converters, each of the plurality of current-to-voltage converters to generate a first voltage based on a first current received from a respective bitline coupled to one or more non-volatile memory cells of the one or more arrays storing W+ values and to generate a second voltage based on a second current received from a respective bitline coupled to one or more non-volatile memory cells of the one or more arrays storing W− values, the first voltage and the second voltage forming a differential voltage pair;
   a multiplexor for receiving a plurality of differential voltage pairs comprising the differential voltage pair generated by each of the current-to-voltage converters in the plurality of current-to-voltage converters and outputting the plurality of differential voltage pairs in a time-multiplexed manner;
   a plurality of sample-and-hold circuits, each sample-and-hold circuit configured to receive a differential voltage pair from the multiplexor and to generate a pair of differential held voltage outputs based on the differential voltage pair;
   a channel multiplexor to receive a plurality of pairs of differential held voltage outputs from the plurality of sample-and-hold circuits and to generate as an output a differential pair of the held voltage outputs in response to a control signal; and
   an analog-to-digital converter to convert the output from the channel multiplexor into a digital output.

2. The output circuit of claim 1, wherein the bitline coupled to the one or more non-volatile memory cells storing W+ values and the bitline coupled to the one or more non-volatile memory cells storing W− values are located in the same array of the one or more arrays.

3. The output circuit of claim 1, wherein the bitline coupled to the one or more non-volatile memory cells storing W+ values and the bitline coupled to the one or more non-volatile memory cells storing W− values are located in different arrays.

4. The output circuit of claim 1, wherein each of the one or more arrays of non-volatile memory cells is a neural network memory array.

5. The output circuit of claim 1, wherein each non-volatile memory cell in the one or more arrays can store one of more than two possible values.

6. The output circuit of claim 1, wherein each of the non-volatile memory cells in the one or more arrays is a split-gate flash memory cell.

* * * * *